(12) United States Patent
Uematsu et al.

(10) Patent No.: US 7,772,585 B2
(45) Date of Patent: Aug. 10, 2010

(54) NITRIDE SEMICONDUCTOR SUBSTRATE AND METHOD OF PRODUCING SAME

(75) Inventors: Koji Uematsu, Hyogo (JP); Fumitaka Sato, Hyogo (JP); Ryu Hirota, Hyogo (JP); Seiji Nakahata, Hyogo (JP); Hideaki Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 724 days.

(21) Appl. No.: 11/446,955

(22) Filed: Jun. 6, 2006

(65) Prior Publication Data
US 2006/0272572 A1  Dec. 7, 2006

(30) Foreign Application Priority Data
Jun. 6, 2005  (JP) ............................. 2005-164915
Feb. 24, 2006  (JP) ............................. 2006-048100

(51) Int. Cl.
*H01L 31/00* (2006.01)
*C30B 25/00* (2006.01)
*H01L 21/00* (2006.01)

(52) U.S. Cl. .............................. 257/13; 257/22; 438/22; 438/24; 438/42; 117/87; 117/88; 117/89

(58) Field of Classification Search ................... 257/13, 257/22; 438/22, 24, 42; 117/87–89
See application file for complete search history.

(56) References Cited

U.S. PATENT DOCUMENTS

| | | | |
|---|---|---|---|
| 6,667,184 B2 * | 12/2003 | Motoki et al. | 438/22 |
| 6,812,496 B2 * | 11/2004 | Takatani et al. | 257/79 |
| 7,087,114 B2 * | 8/2006 | Motoki et al. | 117/86 |
| 7,091,056 B2 * | 8/2006 | Asatsuma et al. | 438/22 |
| 7,105,865 B2 * | 9/2006 | Nakahata et al. | 257/103 |
| 7,112,826 B2 * | 9/2006 | Motoki et al. | 257/103 |
| 7,176,499 B2 * | 2/2007 | Asatsuma et al. | 257/94 |
| 7,230,282 B2 * | 6/2007 | Shibata | 257/103 |
| 7,351,347 B2 * | 4/2008 | Akita et al. | 216/79 |
| 7,473,315 B2 * | 1/2009 | Nakahata et al. | 117/84 |

(Continued)

FOREIGN PATENT DOCUMENTS

JP    2001-102307 A    4/2001

(Continued)

*Primary Examiner*—G. Nagesh Rao
(74) *Attorney, Agent, or Firm*—McDermott Will & Emery LLP

(57) ABSTRACT

A nitride semiconductor crystal substrate is produced by forming a network mask repeating a closed loop unit shape upon an undersubstrate, growing a nitride semiconductor crystal in vapor phase, producing convex facet hills covered with facets on exposed parts Π, forming outlining concavities on mask-covered parts Υ, not burying the facets, maintaining the convex facet hills on Π and the network concavities on Υ, excluding dislocations in the facet hills down to the outlining concavities on Υ, forming a defect accumulating region H on Υ, decreasing dislocations in the facet hills and improving the facet hills to low defect density single crystal regions Z, producing a rugged nitride crystal, and slicing and polishing the nitride crystal into mirror nitride crystal wafers. After the fabrication of devices on the nitride wafer, dry-etching or wet etching of hot KOH or NaOH divides the device-carrying wafer into chips by corroding the network defect accumulating region H.

23 Claims, 27 Drawing Sheets

U.S. PATENT DOCUMENTS

| | | | |
|---|---|---|---|
| 2006/0272572 A1* | 12/2006 | Uematsu et al. | 117/84 |
| 2006/0273343 A1* | 12/2006 | Nakahata et al. | 257/103 |
| 2007/0141823 A1* | 6/2007 | Preble et al. | 438/604 |
| 2007/0280872 A1* | 12/2007 | Okahisa et al. | 423/409 |
| 2008/0006201 A1* | 1/2008 | Hirota et al. | 117/90 |

FOREIGN PATENT DOCUMENTS

| | | |
|---|---|---|
| JP | 2003-165799 A | 6/2003 |
| JP | 2003-183100 A | 7/2003 |

* cited by examiner regular hexagon

S=undersubstrate   M=mask
H=length   W=breadth   T=mask width
ϒ = covered part   Π=exposed part equilateral triangle S=undersubstrate　　W=breadth
M=mask　　　　　　H=length
　　　　　　　　　　T=mask width
Π=exposed part　　Υ=covered part rectangle S=undersubstrate    M=mask elongated hexagon S=undersubstrate    M=mask parallelogram S=undersubstrate    M=mask S=undersubstrate    M=mask ϒ=covered part   Π=exposed part
Φ= facet   Σ=facet hill ϒ=covered part   Π=exposed part
Φ=facet   Σ=facet hill K=grain boundary  Z=low defect density single crystal region
H= defect accumulating region   Σ=facet hill Π=exposed part    Υ=covered part
S=undersubstrate    M=mask Φ=facet    Σ=facet hill    D=dislocation Φ=facet    Σ=facet hill    D=dislocation
Π=exposed part    Υ=covered part H=defect accumulating region
Z=low defect density single crystal region C-plane growth region Y low defect density single crystal region Z defect accumulating region H Random Facet Growth Φ=facet
S=undersubstrate Dot Facet Growth Υ=covered part
Π=exposed part
M=mask
S=undersubstrate Dot Facet Growth Dot Facet Growth Stripe Facet Growth Stripe Facet Growth Stripe Facet Growth Embodiment 7

NITRIDE SEMICONDUCTOR SUBSTRATE AND METHOD OF PRODUCING SAME

RELATED APPLICATIONS

This application claims priority to Japanese Patent Application No. 2005-164915 filed Jun. 6, 2005 and Japanese Patent Application No. 2006-48100 filed Feb. 24, 2006.

BRIEF DESCRIPTION OF THE INVENTION

This invention relates to a nitride semiconductor substrate, which is composed of two-dimensional regularly repeating polygonal-shaped low defect density single crystal regions and a network of defect accumulating regions enclosing and joining the polygonal-shaped low defect density single crystal regions, and a method of producing such a nitride semiconductor substrate. A semiconductor substrate is a basic crystal plate on which semiconductor devices are fabricated. It is common sense that good substrates should have complete uniformity of components and structures as a whole. On the contrary, the present invention proposes a nitride substrate which has intentionally-introduced non-uniformity to components and structures. The nitride substrate proposed by the present invention is different from the conventional semiconductor substrates on this point.

Nitride semiconductors mean gallium nitride (GaN), aluminum gallium nitride (AlGaN), indium gallium nitride (InGaN), aluminum nitride (AlN) and indium nitride (InN). A group 3-5 nitride semiconductors is a synonym of the nitride semiconductors. A substrate is a crystal base board on which devices are produced. A substrate is also called a "wafer".

Light emitting devices making use of GaN and InGaN have been put into practice as blue light LEDs (light emitting diodes), blue light LDs (laser diodes), and so on. Sapphire ($Al_2O_3$) single crystal wafers have been employed as substrates for conventional blue light LEDs. Sapphire is physically and chemically stable. Production of single crystal sapphire is easy. Sapphire wafers are cheap and easy to get. Sapphire substrates enable us to make GaN, InGaN or AlGaN or other nitride films thereupon. Sapphire is congenial to the group 3-5 nitrides. Sapphire wafers have been pertinent substrates for blue ray LEDs. Vapor phase growth (for example, MOCVD) of GaN, InGaN or AlGaN films upon sapphire substrates makes light emitting diodes. Etch pit density (EPD), which is a measure of dislocations, is very high of the order of $10^{10}$ $cm^{-2}$ in the films grown on sapphire substrates. Blue ray LEDs on sapphire substrates do not degenerate in spite of the huge dislocation density (=EPD). On-sapphire LEDs have been on the market and in use on a large scale.

However, sapphire has drawbacks. Sapphire lacks natural cleavage. Sapphire is an insulator. Sapphire has large lattice misfitting to gallium nitride. Lack of cleavage prohibits device makers from dividing a processed wafer into individual device chips by natural cleavage. Sapphire wafer should be divided into chips by mechanical dicing, which invites a low yield and causes high costs. Laser diodes (LDs) made on sapphire substrates have an additional drawback of the impossibility of making resonator mirrors by natural cleavage.

Being an insulator prohibits on-sapphire LEDs from making an n-electrode on the sapphire substrate bottom and forces on-sapphire LEDs to extend an n-type GaN film to one side and to make an n-electrode upon the extended n-type GaN film. The n-electrode need to be connected to lead pins by wire bonding. The non-bottom n-electrode causes drawbacks of complicating the structure of an LED chip, increasing the steps of production and enlarging the size of an LED chip.

Use of GaN crystals for the substrates of GaN-type light emitting devices has been ardently desired. It has been difficult to produce gallium nitride (GaN) single crystal substrates of high quality with low dislocation density (EPD). No melt can be prepared by heating GaN, AlN or InN polycrystals. Conventional Czochralski method and Bridgman method are inapplicable to making GaN crystal.

An MOCVD (metallorganic chemical vapor deposition) method enables us to produce a thin gallium nitride film on a sapphire ($\alpha$-$Al_2O_3$) undersubstrate. The MOCVD method is inherently a technique of making thin films. The MOCVD produces a GaN thin film by supplying a heated sapphire undersubstrate with an organic metal gas of Ga, for example, TMG (trimethylgallium) or TEG (triethylgallium) and ammonia ($NH_3$) gas. Direct deposition of GaN film on the sapphire undersubstrate causes large dislocation density. An ELO method (epitaxial lateral overgrowth) is employed for decreasing dislocations on films grown on the undersubstrate. The ELO method forms a mask M having plenty of small isolated windows on an undersubstrate and grows GaN on the ELO-masked undersubstrate. A part covered with the mask M is a wide continual part in the ELO. The masked part of the undersubstrate is called a covered part T from now. Extra parts of the substrate which are not covered with the mask are called exposed parts Π for clearly discriminating from the covered part. The term of "covered" or "exposed" is defined only by the fact that the mask covers or uncovers. The name of exposed parts of the undersubstrate shall be maintained until the exposed parts have been concealed with growing GaN films. In this description the exposed parts Π and the covered parts T will be used for indicating unmasked and masked parts of an undersubstrate.

FIG. 20 demonstrates an ELO-mask M and an undersubstrate S covered with the ELO-mask M for ELO-growth. The ELO mask is prepared by depositing a $SiO_2$ film overall upon an undersubstrate and boring tiny windows by photolithography and etching. An exposed part Π is a tiny isolated window in the ELO mask. The covered part T area S1 is absolutely wider than the exposed part Π area S2 (S1>>S2). The mask has a function of impeding crystal growth. Crystal growth starts on the exposed parts Π. Crystal grains fill the exposed parts and enlarge upward. Dislocations also extend upward in parallel with the crystal growth. The crystal runs up onto the mask and extends in horizontal directions on the mask. Dislocations also extend in the horizontal directions on the mask. Crystals extending on the mask collide with each other. The crystals are unified and make a flat uniform C-plane. The horizontal collision reduces dislocations. The ELO grows a crystal film with maintaining the flat C-plane after the horizontal collision. FIG. 21 demonstrates the ELO growth keeping a flat C-plane top after the unification of crystals on the mask. In practice, it is difficult to maintain the flat C-plane top of the GaN film. The growing conditions shall be always controlled so as to prohibit hills or pits from occurring by watching the surface of the growing crystal.

The ELO is a technique for decreasing dislocations by horizontal collision at an early stage of growth. The ELO is effective in the growth of thin films with a thickness of 0.1 μm to 3 μm. 1 μm to 4 μm thick GaN or InGaN films ELO-grown on sapphire substrates have dislocation density of $10^9$ $cm^{-2}$ to $10^{11}$ $cm^{-2}$. Congeniality of sapphire to GaN or InGaN enables the ELO-grown LEDs to emit light without degeneration.

The ELO method, however, is scarcely effective in the crystal growth of thick crystals. Thick GaN crystal made by the ELO, which has high dislocation density of $10^9$ $cm^{-2}$ to $10^{11}$ cm$^{-2}$, will exfoliate from undersubstrates. Even if the thick GaN crystal would not come off undersubstrates, the dislocation density ranging from $10^9$ cm$^{-2}$ to $10^{11}$ cm$^{-2}$ is too high. New technique other than the ELO is required to make thick GaN substrate crystals.

BACKGROUND OF THE INVENTION

The Inventors have contrived a new method, which can be called a "facet growth method", for producing thick, low-dislocation GaN crystal substrates. A substrate is a basic board on which devices are fabricated. A substrate is sometimes called a "wafer". The facet growth method has a history of improvements which have been done by the Inventors of the present invention. There have been three preceding facet growth methods. All the three preceding facet growth methods are explained.

① Japanese Patent Laying Open No. 2001-102307 (Japanese patent application No. 11-273882) proposes a method of growing GaN crystals by making many facets and facet pits on a surface of the growing crystal on purpose, not burying the pits and maintaining the facets till the end of GaN crystal growth. FIG. 22 denotes an undersubstrate S for the facet growth. The undersubstrate has no mask. Vapor phase growth inherently produces facets Φ and facet pits. Conventional vapor phase growth methods had tried to eliminate the facets and to make a flat C-plane on the top by controlling conditions of growth. On the contrary, the facet growth method does not bury the facet pits but maintains the facets and facet pits. The facet growth method contradicts the conventional methods, which may be called a "C-plane growth" method. Facets Φ denote crystallographic planes having low Miller indices (khmn). Low Miller indices mean indices k, h, m and n are 0, ±1, ±2 or so. A set of facets form a pit of facets.

FIG. 23 shows a GaN film having facet pits on a surface which is made by the facet growth method. A facet pit is an assembly composed of six facets or twelve facets. Six or twelve facets make inverse hexagonal cones or inverse dodecagonal cones. Plenty of facet pits having a variety of shapes and sizes are randomly dispersed on the GaN surface. The GaN crystal grows upward in the direction of the c-axis as a whole. The average direction of growth is the c-axis direction. But in the facet pits, crystals grow in inner slanting directions normal to the facets. Dislocations on the facets extend in the inner slanting directions normal to the facets, and come up to and assemble to boundaries of the facets. The dislocations further come up to the bottom of the pits. Many dislocations converge to the bottom of the pits and form a linear defect hanging from the bottom of the facet pit. Dislocations are continual strings which are not easily vanished. Dislocations lying on the facets are pulled to the bottom of the facet pits. Then dislocations in other parts except the pit bottom are reduced. Low dislocation density regions are produced below the facets. The facet growth method intentionally produces random facets by controlling the conditions of growth. The facet pits attract, absorb and arrest dislocations at the pit bottoms. A variety of sizes of pits are dispersed at a variety of positions on the C-plane surface at random. The first method is called a "random facet growth" method.

The random facet growth method has drawbacks. The GaN crystal prepared by the method, which has defects (dislocations) dispersing on surfaces at random, is not preferable to make devices thereon. Plenty of dislocations, which are gathered but not arrested at the pit bottoms, are released again from the bottom with the progress of growth. Such drawbacks degrade the random facet growth method.

② Japanese Patent Laying Open No. 2003-165799 (Japanese Patent Application No. 2002-230925) proposed a GaN vapor phase growing method of spotting an undersubstrate with isolated round dot masks for predetermining the positions of facet pits with accuracy. FIG. 24 denotes an undersubstrate S provided with dispersed isolated small dot masks S. The area S1 of covered parts T is far narrower than the area S2 of exposed part Π (S1<S2). The relation is inverse to the ELO method. S1<S2 is always valid in facet growth methods. The facet growth method differs from the ELO in the relation. A mask pitch (~100 μm) of the facet growth method is far longer than the window pitch (~1 μm) of the ELO method. Crystals begin to grow on the exposed part Π. The crystals growing on the exposed parts Π couple together and form a flat C-plane as a top surface. The mask has a function of impeding and delaying crystal growth. A start of growing on the masks is retarded. Delay of the crystal growth on the masks M makes facet pits having bottoms coinciding with the isolated masked parts T. Facets are crystallographical planes slanting to the C-plane. The facet growth method does not bury facet pits and maintains the facet pits till the end of the growth.

The facets grow in directions of normals of the facets. Dislocations extend in parallel to the growing directions. Slanting growth of a facet sweeps dislocations D lying on the facet to boundaries of facets. The facet slanting growth lowers the dislocations along the boundaries and assembles the dislocations to the pit bottom. High density of dislocations are gathered at the parts just above the masks M. All dislocations are swept away from the facets, are lifted down and are gathered to the pit bottoms above the masks M by the facet growth. In reality dislocations do not lower or lift down but rise upward. Since the standpoint of observation is rising at the speed of the C-plane growth, the dislocations in the facet pits seem to go down. The parts above the masks M (covered parts T) become defect accumulating regions H. Since the defect accumulating regions H attract, absorb, arrest and accommodate plenty of dislocations, neighboring parts below the facets on the exposed parts become low dislocation density. The regions are called "low defect density single crystal regions Z".

A crystal out of the pits maintains a flat C-plane top surface and grows upward on the expose part Π. Since dislocations in the part are deprived of the facets, the crystals are also low dislocation density and single crystals. The part is called a "C-plane growth region Y". The facet-grown crystal has a concentric structure of "HZY". FIG. 25 demonstrates a facet-growing crystal on an undersubstrate S. Y has a continual plateau of the C-plane top. Z has facets Φ. H is a facet pit bottom concealed by Y in the Figure. Since the facets are maintained throughout the growth, the final crystal ingot made by the facet growth method has a rugged surface with many concavities. The GaN ingot is sliced in a plane parallel to the C-plane. As-cut GaN wafers are obtained. Both surfaces are polished. Mirror wafers are prepared. A GaN mirror wafer is transparent like a glass plate. FIG. 26 shows a plan view of a GaN mirror wafer which has the concentric "HZY" structure. Cathode luminescence observation discriminates Y, Z and H. Y, A and H are regions piercing from the top to the bottom of the wafer. The positions of H coincide with the positions of the masks Y. The regions Z coincide with the facets. The region Y coincides with the C-plane top in FIG. 25. Z and Y are formed on the exposed part Π. This is called a dot-type facet growth method, since isolated small dot masks are dispersed for making isolated facet pits.

The dot-type facet growth method produces conical facet pits above the dot masks. Dislocations are absorbed and arrested at the bottoms of the pits. An assembly of dislocations forms a defect accumulating region H at the pit bottom above the mask. Once arrested dislocations are not released from the defect accumulating regions H formed above the masks. An advantage is the occurrence of the low defect density single crystal regions Z below the facets on the exposed part.

The dot-type facet growth method disperses isolated dot masks on the undersubstrate and allows the dot masks to make concentric facet pits. A wide extra space, which corresponds to Y, is left untouched out of the facet pits. The function of the facets of reducing dislocations is insufficient in the C-plane growth region Y. The C-plane growth region (Y) has still many dislocations. The C-plane region Y has high electric resistance. The dot-facet growth is not favorable for making high conductive n-type GaN substrates.

Anther problem is that existence of the defect accumulating regions H prevents device makers from making a plurality of equivalent devices on the same conditions. The random-type facet growth method and the dot-type facet growth method had been invented by the same Inventors as the present invention.

③ Japanese Patent Laying Open No. 2003-183100 (Japanese Patent Applications No. 2002-269387) has proposed another facet growth method of covering an undersubstrate with a mask having a plurality of parallel straight covering stripes, growing gallium nitride on the stripe masked undersubstrate, forming parallel straight-extending facetted hills on parallel exposed parts Π, forming parallel straight-extending valleys on the covered stripe parts Τ, pulling dislocations on the facets of the hills to the valleys and attracting/accumulating/arresting the dislocations in regions H formed at the bottoms of the valleys above the stripe covered parts Τ. FIG. 27 demonstrates an undersubstrate S provided with parallel straight mask stripes M. The numbers of covered parts Τ and the exposed parts are same. But the area S1 of the covered parts Τ is far narrower than the area S2 of the exposed parts Π (S1<<S2). There are several tens of stripes Τ and several tens of exposed parts Π on an undersubstrate, although only two stripes are depicted. The masks have a function of prohibiting crystal growth. Vapor phase crystal growth starts on the wide exposed parts Π. Parallel crystal hills with side facets are formed on the exposed parts Π. After the formation of the facet hills on the exposed parts Π, crystal growth starts on the covered parts Τ. Differences of starting times and growing speeds make parallel facet hills on the exposed parts Π and V-grooves on the stripe covered parts Τ of GaN crystals.

Since masks are parallel stripes, an assembly of facets does not form polygonal pits but makes a parallel extending hill/valley structure. FIG. 28 demonstrates the hill/valley structure of a growing crystal. The bottoms of the V-valleys coincide with the covered (masked) parts Τ. Reciprocal slanting walls appear on the exposed parts Π. The two slanting walls are facets Φ. The hill or V-groove has only two facets. The hill/valley structure is different from the dot-type facet pit having six or twelve facets in the point.

The facet growth method does not bury the V-grooves but keeps the hill/valley structure. Since crystals grow in the directions normal to the facets, dislocations extend in slanting directions normal to the facets. Dislocations existing on the facets slide from the facets, fall in the valleys and converge at the bottoms of the valleys. Dislocations lying on the facets are attracted and arrested to the bottoms. The valley bottoms become defect accumulating regions H. Crystals growing below the facets become low dislocation density single crystals. The bottom defect accumulating region H is sandwiched by low dislocation single crystal regions Z and Z. The C-plane growth region Y lies aside of Zs. A parallel-extending periodic structure of . . . HZYZHZY . . . is produced in the facet-growing GaN crystal. This facet growth method has an advantage of making low dislocation density single crystal regions Z in a shape of linearly extending stripes. The linearly extending Z is favorable for making devices on the GaN substrate. FIG. 28 demonstrates a facet-growing GaN crystal having valley bottom defect accumulating regions H, low dislocation single crystal regions Z covered with inclining facets, and C-plane growth tops.

The stripe facet method can eliminate C-plane regions Y by narrowing a mask pitch p and composing V-hill/valleys only of facets. Narrow mask pitches p (p<800 μm) less than 800 μm have the possibility of extinguishing C-plane regions. Wider mask pitches p ranging from more than 800 μm to 2000 μm (800μ<p<2000 μm) still give facets the effect of decreasing dislocations. Farther wider mask pitches p than 2000 μm (p>2000 μm) foreclose facets from the function of dislocation reduction.

The stripe mask pitch described in ③ Japanese Patent Laying Open No. 2003-183100 should be less than 2 mm (p<2000 μm). Another drawback is a tendency of break and split of wafers because of the parallel stripes of Hs, Zs and Ys. This is named "stripe facet growth" method, since H, Z and Y are all parallel stripes.

Three preceding facet growth methods contrived by the present invention have been clarified. The random facet growth method proposed by ① Japanese Patent Laying Open No. 2001-102307 makes random distribution of pits without mask S (S1=0). The dot facet growth method proposed by ② Japanese Patent Laying Open No. 2003-165799 makes regularly distributing isolated dots of Hs and circular Zs concentrically around the isolated Hs by using dot masks (S1<S2). The stripe facet growth method proposed by (③) Japanese Patent Laying Open No. 2003-183100 makes a parallel structure of HZYZHZYZH . . . by using parallel stripe masks (S1<S2).

The stripe facet growth method proposed by ③ Japanese Patent Laying Open No. 2003-183100 is useful for making low dislocation density GaN substrate crystals. However, there are still some problems to be solved.

Problem (1): The stripe facet growth method arranges parallel, linear defect accumulating regions H in a GaN crystal substrate. Facets Φ are parallel to the linear Hs. No facet is made in vertical sides to Hs, so that the dislocation reduction is insufficient. Dislocations are bent to directions vertical to the growing plane. Dislocation decrement does not occur at the spots which are free from facets. The dot facet growth method proposed by ② Japanese Patent Laying Open No. 2003-165799 forms many conical facet pits which have a variety of kinds of facets Φ. Strong forces originating from the conical facets gather dislocations into facet pits. On the contrary, the stripe facet growth method proposed by ③ Japanese Patent Laying Open No. 2003-183100 gives two kinds facets a weak power of gathering dislocations to the valley bottoms, so that the dislocation reduction is unsatisfactory.

Problem (2): Chip-separation requires mechanical dicing. Mechanical dicing sometimes gives damage to device chips by introducing defects, e.g., fine granules of diamond or SiC, to sections and causing multiplications of defects. The damage degrades the device.

Problem (3): When light emanates from a three-dimensional emission box, wider superficial area per unit volume strengthens light emission. Triangle chips are more advantageous than square chips in some cases. In other cases, hexagon chips are more effective than square chips. In the case of LEDs, the more the number of surfaces increases, the more the amount of light to emanate increases. It is possible to make non-square chip LEDs on GaN wafers. It is, however, difficult to mechanically cut the processed GaN wafer into non-square LED chips.

Problem (4): Mechanical dicing, which cuts an object with a sharp blade along a straight line, can easily prepare a plurality of square chips by cutting a processed wafer lengthwise and crosswise. To cut triangle chips or hexagonal chips are difficult for mechanical dicing, because the cutting locus must change for cutting triangles or hexagons. If triangles or hexagons were cut by mechanical dicing, plenty of segment wastes would accompany. If chip-separation were done by non-mechanical means, non-square device chips would be produced without wastes.

Problem (5): ③ Japanese Patent Laying Open No. 2003-183100 alleges that the sum of the widths of two low defect density single crystal regions Z and the width of a C-plane growth region Y should be less than 2 mm (10 µm to 2000 µm). The width of a good single crystal part is less than 2 mm. The stripe facet grown GaN substrate is inapplicable to a big device which requires a large low defect density zone wider than 2 mm. The stripe facet grown substrate with an under 2 mm good zones is incapable of making large-sized devices, for example, high luminosity LEDs or high power FETs.

OBJECTS AND SUMMARY OF THE PRESENT INVENTION

A purpose of the present invention is to solve the difficulties above-described. The present invention proposes another facet growth method which further lowers dislocation density of GaN substrates, raises emission efficiency of LEDs fabricated on the GaN substrates and divides an epitaxial GaN wafer into larger sized chips by natural cleavage instead of dicing.

The present invention proposes a network mask facet growth method for forming a set of closed loop masked parts Ƭ with definite widths on an undersubstrate S and growing nitride semiconductor crystals on the network masked undersubstrate. Nitride semiconductor crystals, which first grow on exposed parts Π and second grow on mask covered parts Ƭ. There is time lag between the two parts Π and Ƭ. As a result, the crystals grown on the covered parts Ƭ are lower than facet hills formed the exposed parts Π. Dislocations D located in slanting surfaces (facets Φ) of the convex-type facet hills slide from the slanting facet surfaces Φ and gather round the covered parts Ƭ with the growing of nitride semiconductor crystals. The dislocations D assemble in and form defect accumulating regions H just above the covered parts Ƭ. Since the facets Φ grow in normal directions, the dislocations D caused in the facet parts Φ just above the exposed parts Π slide off the facets Φ and are captured and held by the defect accumulating regions H.

The closed loop covered parts Ƭ produce closed defect accumulating regions H thereupon. The closed defect accumulating regions H act as dislocation attracting/assembling/arresting positions. Once arrested dislocations never escape from the closed defect accumulating regions H. Other parts growing within the exposed parts Π neighboring the closed defect accumulating regions H become low dislocation density single crystals. Thus the parts growing in the exposed parts Π under the facets are called low defect density single crystal regions Z. Every one of the facetted growing low defect single crystal regions Z is fully enclosed by closed looped defect accumulating regions H. Surrounding defect accumulating regions H pull out dislocations from the single crystal region Z in all directions. In the present invention, the reduction of dislocations is far more conspicuous than the former facet growth methods—random facet, dot facet and stripe facet methods. The former facet growth methods proposed by the present inventors failed in fully enclosing the low defect single crystal region with closed loop defect accumulating/arresting regions H.

Sometimes a flat region, which maintains a top C-plane surface, appears at the center of the low defect density single crystal region Z. Appearance or disappearance of the flat top regions depends upon the size of a closed loop or growth conditions. The flat top regions are called C-plane growth regions Y. The C-plane growth regions Y are also low defect density and single crystals having the same orientation as the surrounding facetted single crystal regions Z. The C-plane growth regions Y have electric conductivity higher than the surrounding facetted single crystal regions Z. Existence of the C-plane growth regions Y is sometimes an obstacle for making low resistance n-type GaN substrates. Controlling the size of a closed loop mask Y and the growth conditions enables the present invention to reduce or vanish the C-plane growth regions Y.

The present invention produces closed loop defect accumulating regions H which fully enclose the facetted single crystal regions Z and rid the faceted regions Z of dislocations via the whole boundaries. The closed loop defect accumulating regions H succeed in powerfully attracting dislocations out of the facetted single crystal regions Z and in permanently arresting the dislocations. Allover extraction of dislocations from the faceted single crystal regions Z further lowers dislocation density of the closed loop enclosed regions Z. This is a big advantage of the present invention.

In a favorable condition, the defect accumulating regions H, which are regions accommodating dislocations, become a single crystal having a c-axis fully inverse to the c-axis of the surrounding single crystal regions Z (and Y). This is called an "orientation-inversion single crystal" or "polarity-inversion single crystal". Grain boundaries K are made by the orientation inversion between the defect accumulating regions H and the facetted single crystal regions Z. The orientation inversion boundaries K powerfully arrest dislocations and never release the dislocations.

In another condition, the defect accumulating regions H become polycrystals. In the case of polycrystals, grain boundaries K are yielded between the defect accumulating regions H and the inner single crystal regions Z (and Y). The grain boundaries prevent once arrested dislocations from escaping into the faceted single crystal regions Z. The fact means that clear grain boundaries K are formed between the defect accumulating regions H and the neighboring single crystal regions Z. These are crystal grain boundaries. The dislocations once coming in the defect accumulating regions H are unable to go into the faceted single crystal regions Z.

One of the features of the present invention is that the defect accumulating region H has a definite width T' and grain boundaries K and K sandwich the defect accumulating region H. The interval between two parallel boundaries K and K is a width T' of the defect accumulating regions H. Endowment of a definite width T' to the defect accumulating region H is easily realized by providing the closed loop mask Ƭ with a definite width T at the first stage of making the mask pattern on the undersubstrate S. The defect accumulating region width T' is smaller than the masked width T (T'<T). The ratio of T'/T depends upon the thickness of the mask M. T' is nearly in proportion to T. T'/T is 0.8 to 0.9 in many cases. The width T of the closed loop mask ϒ determines the width T' of the defect accumulating region H which will be formed upon the mask.

The present invention insists on a closed looped mask, closed loop boundaries K and closed looped defect accumulating regions H. Such a mask pattern having repetitions of a basic unit shape in two dimensions should be convenient to device fabrication. Repetitions of a basic unit shape give a network to the mask. Repetitions of the same basic unit shape enable the device makers to produce plural identical devices with the basic unit shape. It is allowable for masks to have such a network pattern arranging many basic circles or ellipsoids aligning in nearly outer contact with neighboring ones. The circle or ellipsoid mask will make repetitions of circles or ellipsoids of defect accumulating regions H which can reduce dislocations in neighboring single crystal regions Z. Circles and ellipsoids are allowable for a basic unit shape of a network mask.

The circle or ellipsoid basic pattern, however, cannot maintain a constant width T' of the defect accumulating regions H. Circular or elliptical boundaries K and defect accumulating regions H are allowable for the present invention at the expense of fluctuating widths T'.

Polygonal unit shapes are required to allow repetitions of a basic shape to cover a two dimensional space without extra margin. Probable basic shapes are restricted to equilateral triangles, squares, rectangles, lozenges, parallelograms, trapezoids and so on for covering a two dimensional space with identical basic shapes. FIGS. 1 to 6 are examples of a basic unit shape of a closed loop network mask M. The covered parts are denoted by ϒ. The exposed parts are denoted by Π.

FIG. 1 shows a hexagonal network mask which is an assembly of repetitions of equivalent hexagons formed on an undersubstrate S. A unit closed loop shape of the mask M is a regular hexagon. The figure demonstrates definitions of a length H and a breadth W of a unit exposed part Π and of a width T of a mask M (or a masked part ϒ).

FIG. 2 shows a triangle network mask which is an assembly of repetitions of equivalent triangles formed on an undersubstrate S. Since a unit closed loop shape of the mask M is an equilateral triangle, each inner angle is 60 degrees, which is permissible to make the same shape repeat without openings. The figure demonstrates definitions of a length H and a breadth W of a unit exposed part Π and of a width T of a mask M (or a masked part ϒ).

FIG. 3 shows a rectangle network mask which is an assembly of repetitions of equivalent rectangles formed on an undersubstrate S. A unit closed loop shape of the mask M is a rectangle. The figure demonstrates definitions of a length H and a breadth W of a unit exposed part Π and of a width T of a mask M.

FIG. 4 shows an elongated hexagonal network mask which is an assembly of repetitions of equivalent elongated hexagons formed on an undersubstrate S. A unit closed loop shape of the mask M is an elongated hexagon. The figure demonstrates definitions of a length H and a breadth W of a unit exposed part Π and of a width T of a mask M (or a masked part ϒ).

FIG. 5 shows a parallelogram network mask pattern which is an assembly of repetitions of parallelograms formed on an undersubstrate S. A unit pattern of a network mask is a parallelogram. The figure demonstrates definitions of a length H and a breadth W of a unit exposed part Π and of a width T of a mask M. The parallelograms are available for the same shape repetitions in every inner angle.

FIG. 6 shows a trapezoid network mask which is an assembly of repetitions of equivalent trapezoids formed on an undersubstrate S. A unit closed loop shape of the mask M is a trapezoid. An equilateral trapezoid allows the mask to repeat a set of one pattern and another upside down pattern. An unequilateral trapezoid allows the mask to repeat a set of one pattern and another upside/down and reversed pattern. The figure demonstrates definitions of a length H, a breadth W of a unit exposed part Π and a width T of a mask M.

Gallium nitride and similar nitride semiconductor crystals take hexagonal system. A single crystal plate with a C-plane top has typical directions <10-10>, which include three equivalent directions meeting at 120 degrees, and directions <11-20>, which include three equivalent directions meeting at 120 degrees. Cleavage planes are indicated by {10-10}. {khmn} is a collective expression of planes. (khmn) is an individual expression of a plane. {khmn} includes all the individual planes which are obtained from (khmn) by the symmetry operations allowed by the crystal. <khmn> is a collective expression of directions. [khmn] is an individual expression of a direction. <khmn> includes all the individual directions which lead to [khmn] by symmetry operations allowed by the crystal. Since nitride semiconductor crystals have no inversion symmetry, {khmn} planes differ from {-k-h-m-n} planes. [khmn] denotes an outward normal standing on (khmn). The length of the normal [khmn] is given by a reciprocal of a plane spacing. <11-20> direction is parallel to {1-100} plane. The crystal is easily cleaved along <11-20> direction.

One of the sides of the polygons of a closed loop mask can be determined to be parallel with <11-20> direction or <10-10> direction of the undersubstrate for giving a definite orientation to facet hills. Otherwise, a side of the mask polygons can be inclined at a definite angle to <11-20> or <10-10> direction. If a side of the polygon mask coincides with the cleavage plane, facet hills grown within the mask polygon can be separated by cleaving along the side. However, the substrates made by the present invention have non-uniformity of the defect accumulating regions H made on the network. When the substrate is etched by hot KOH or hot NaOH, the defect accumulating regions H, which are peripheries of chips, are corroded away. The substrate is divided into chips by the hot KOH/NaOH etching. It is not indispensable for chip-separation to equalize the sides to the cleavage planes.

FIG. 7 (plan views) and FIG. 8 (vertical sectioned views) demonstrate an example of forming a regular hexagonal network mask and growing nitride crystals by the facet growth method advocated by the present invention. Since the present invention relies upon a network mask, the present invention is called a "network facet growth" method for discriminating from other preceding facet growth methods—random, dot, and stripe facet types which have been proposed by the same Inventors. The network facet growth method of the present invention is applicable to all the closed loop masks denoted by FIGS. 1 to 6. The facet growth method of the present invention will be explained by citing a regular hexagonal network mask shown by FIG. 1. FIG. 8(1) corresponds to a vertically-sectioned view of the process of forming the regular hexagonal network mask. The regular hexagonal network mask is formed on a undersubstrate S. An upper surface of the undersubstrate S is divided into exposed parts Π and covered parts ϒ.

Vapor phase growth of nitride semiconductors (GaN, InGaN, InN, AlN, AlGaN and so on) creates nitride nuclei selectively on the exposed parts Π of the undersubstrate and starts crystal growth on Π. At an early step, no nuclei appears on masked parts ϒ. Hexagonal crystal cones are produced on Π. The hexagonal cone protrusions seem hills. The flat tops of the protrusions are C-planes. The hexagonal cones have slanting facets Φ at edges being in contact with ϒ. The protrusions on Π are called facet hills Σ. FIG. 7(1) and FIG. 8(2) demonstrate the creation of facet hills on Π. Dislocations extend in a vertical direction in the facet hills from bottom to top, because dislocations are mainly yielded at an interface between the crystal and the undersubstrate.

As the growth proceeds, the heights of the facet hills Σ rise on Π. The facets Φ of the facet hills dilate. The top C-planes diminish. FIG. 7(2) shows facet hills Σ with narrow c-planes on tops. No crystal is born on the masked parts ϒ yet. Sometimes C-planes remain till the end. Other times C-planes perfectly vanish. Non-C-plane crystals are preferable. FIG. 8(3) demonstrates sharp facet hills Σ without C-planes. Pinnacled face hills Σ build an ideal crystal. The facet hill is composed of six facets Φ. The six facets aggregate at tops. The facet hill is a regular hexagon cone occupying Π. Dislocations D expand upward in the facet hills. Top ends of dislocations meet with facets Φ with slanting angles. Inclination angles of the facets are determined by plane indices from about 40 degrees to 60 degrees. The facet hills Σ fill Π in FIG. 8(3). The facet hills can dilate no more on Π.

The crystal growth further proceeds. The crystal hills override the masked parts ϒ. Crystal growth starts on the masks ϒ. Facet growth method tries not to bury the facets Φ and to maintain the facets Φ till the end. Growth of facets Φ can be no more vertical, because the slanting facets should be kept. Facets grow in the slanting directions vertical to the facets. Facets extend in normals standing on the facets in the facet-growth. Dislocations D accompany the facet growth in the normal directions. As shown in FIG. 7(3) and FIG. 8(4), dislocations D change progressing directions from the vertical to outward slants. Accompanying the facet growth, dislocations extend in outer slanting directions. A further facet growth excludes thread-like dislocations out of the facets to regions above ϒ. Excluded dislocations enter ϒ from both sides, aggregate with each other above ϒ and make a bundle of dislocations on the masked parts ϒ. The aggregated dislocations make defect accumulating regions H on the masked parts ϒ. Dislocations rarely extinguish and rarely arise in an ordinary growth. Dislocations are attracted, arrested in the defect accumulating regions H on ϒ. Dislocations in other regions below the facets on Π decrease. The other regions below the facets on Π become low defect density regions. Being low defect density and single crystal, the other regions below the facets on Π are named "low defect density single crystal regions" Z.

Dislocations are yielded by a variety of irregularities. Most of the dislocations are made at the beginning of crystal growth on the undersubstrate. The crystal is grown in c-axis direction as a whole. Many dislocations have group 3 atoms and nitrogen atoms in reverse positions. Such dislocations assemble to defect accumulating regions H on ϒ. In many cases, the defect accumulating regions H become single crystals having a downward direction c-axis. In the case, the defect accumulating regions H are single crystals having inverse orientation. The inverse-orientation single crystals are the optimum mode of the defect accumulating regions H. Grain boundaries K are surely born between the inverse defect accumulating regions H and the surrounding low defect single crystals Z and Y. When dislocations are once arrested and accumulated in the defect accumulating regions H, the boundaries K prevent the dislocations from releasing again. The boundaries K arrest the dislocations within the defect accumulating regions H.

If conditions are not the best, the defect accumulating regions H become polycrystals. In the case, grain boundaries K are produced between the polycrystalline defect accumulating regions H and the surrounding single crystal regions Z and Y. Boundaries K and K enclose the polycrystalline defect accumulating regions H. Once arrested dislocations are not easily released. The function of confinement of the boundaries K enclosing the polycrystalline H is weaker than that of the boundaries K enclosing the orientation-inverse H.

The facets shall be maintained throughout the crystal growth. When the crystal growth ends, the crystal has a rugged convex/concave surface with many facet hills Σ. FIG. 9 is a partially sectioned perspective view of a crystal produced by the facet growth method. The surface is occupied by plenty of polygon cone facet hills Σ with slanting walls of facets and polygon network bottoms. Sometimes flat parts remain at tops of the facet hills. The crystal contain low defect density single crystal regions Z following the facets Φ on Π, C-plane growth regions Y following the C-plane tops on Π and defect-accumulating regions H following the network bottoms on masked parts ϒ. Some samples lack C-plane growth regions Y.

As-cut GaN wafers are obtained by slicing such a rugged convex/concave GaN crystal ingot in parallel with the C-plane. GaN mirror wafers are made by polishing both surfaces of the as-cut wafer. FIG. 10 shows the structure of a GaN mirror wafer. The GaN mirror wafer is not homogeneous but inhomogeneous. GaN wafer has an inner structure. GaN is transparent like a glass plate.

Human eye sight cannot discriminate the inner structure. The cathode luminescence enables us to observe the inner structure composed of hexagonal low defect density single crystal regions Z extending from bottom to top, a network defect accumulating region H extending from bottom to top and boundaries K between Z and H. This sample lacks C-growth regions Y. Sometimes C-plane growth regions Y remain at the center of Z.

The width T of the closed loop masked parts ϒ causing the defect accumulating regions H is 0.05 mm to 0.3 mm. The width T' of the defect accumulating regions H formed on the closed loop mask is slightly narrower than T (T>T'). When the mask width is T=0.05 mm to 0.3 mm, the width T' of H grown on the mask is T'=0.03 mm to 0.2 mm. When T is smaller than 0.05 mm, faint defect accumulating regions H or no defect accumulating regions H are produced on too narrow mask. If the mask width T exceeds 0.3 mm, the width T' of defect accumulating regions exceeds 0.2 mm. The defect accumulating regions H are useless for making devices. Wide defect accumulating regions raise the cost of devices. Thus the upper limit of T is 0.3 mm.

More favorable mask width T is 0.05 mm to 0.2 mm. More favorable width of the defect accumulating region H formed on the mask is 0.03 mm to 0.1 mm. A narrow mask width reduces the area of defect accumulating regions H and decrease cost of making the substrates.

The defect accumulating regions H and the boundaries K should be closed loops. A low defect density single crystal region Z is enclosed by the closed loop. An allowable range of the closed loop shape should be defined. L2 is the longest distance from the closed loop to the center of gravity of the low defect density single crystal region Z. L1 is the shortest distance from the closed loop to the center of gravity of the low defect density single crystal region Z. The ratio L2/L1 should be less than 5 ($1 \leq L2/L1 < 5$). The restriction gives a clear distinction of the present network facet growth from the former-invented stripe facet growth. The stripe facet is a limit of indefinitely large of the ratio $L2/L1=\infty$.

When the defect accumulating regions H and boundaries K are rectangles, the ratio of a longer side to a shorter side should be less than five ($1 \leq L2/L1 < 5$).

When the defect accumulating regions H and boundaries K are lozenges having 60 degree and 120 degree corners, the ratio should uniquely be determined to be L2/L1=2. The ratio L2/L1=2 satisfies the requirement of $1 \leq L2/L1 < 5$.

When the defect accumulating regions H and boundaries K are parallelograms having 60 degree and 120 degree corners, the ratio of longer/shorter sides should be less than 4.68.

When the defect accumulating regions H and boundaries K are equilateral triangles, the ratio should uniquely be determined to be L2/L1=2. The ratio L2/L1=2 satisfies the requirement of $1 \leq L2/L1 < 5$.

When the defect accumulating regions H and boundaries K are squares, the ratio should uniquely be determined to be L2/L1=1.4. The ratio L2/L1=1.4 satisfies the requirement of $1 \leq L2/L1 < 5$.

When the defect accumulating regions H and boundaries K are regular hexagons, the ratio should uniquely be determined to be L2/L1=1.16. The ratio L2/L1=1.16 satisfies the requirement of $1 \leq L2/L1 < 5$.

The maximum diameter of the closed loop boundaries K for making defect accumulating regions H shall be 0.1 mm to 20 mm. The maximum diameter is defined as the maximum of the distances between two points on the boundaries K. Since a boundary is two dimensional closed loops, the maximum value of distances between two points does exist. The value shall be defined as the maximum diameter. The value means the maximum of the diameters of the low defect density single crystal regions Z. Boundaries less than a 0.1 mm diameter are capable of reducing dislocations. Since the defect accumulating region closed loops have widths T' of 0.03 mm to 0.2 mm, economical loss accompanies small boundaries K less than 0.1 mm diameter. When the maximum diameter exceeds 20 mm, the area enclosed by a closed loop defect accumulating region H is too wide for defect accumulating regions to attract/arrest dislocations existing in the area within the closed loop, even if the minimum side of the closed loop is short. A wide diameter of the mask loop beyond 20 mm will be plagued with the same difficulties as the aforementioned stripe face-growth method.

When the defect accumulating regions H and the boundaries K are regular polygons, the maximum diameter of the closed loop boundaries K shall be 0.1 mm to 5.0 mm.

The aforedescribed random-type facet growth (Japanese Patent Laying Open NO. 2001-102307) and dot-type facet growth (Japanese Patent Laying Open NO. 2003-165799) produce cavities, holes or pits composed of facets. The pits dispersed on a flat C-plane are assembles of facets. Inclinations of the facets take dislocations in and arrest dislocations at the pit bottoms.

On the contrary, the relation of convexes and concaves of the present invention is reverse to two preceding facet-growth methods. Unlike the two precedents in which flat C-planes are born at the beginning, what exists at the beginning are closed loop defect accumulating regions H in the present invention. The defect accumulating regions H give a standard of height. What facets construct is convex facet hills Σ embossed on exposed parts Π. The facet hills protrude upward from the defect accumulating regions H. A facet hill Σ grows in a closed loop of the defect accumulating region H. The maximum height of the facet hill Σ depends upon the breadth of the closed loop boundary K. An increment of the closed loop of the defect accumulating region H can increase the maximum height of the facet hills Σ. As long as the facets are maintained, the facets keep the function of conveying dislocations from higher parts to lower parts till the closed loop defect accumulating regions H.

As the crystal growth proceeds, the closed loop defect accumulating regions H attract dislocations from the facet hills. Dislocations within the outlines are decreased by making them pulled radially from all the directions of the closed looped H. The present invention differs in the points from other facet pit methods of ① Japanese Patent Laying Open No. 2001-102307 and ② Japanese Patent Laying Open No. 2003-165799. Convex facet hills Σ highly protrude on Π. Tall, high facets sweep dislocations out of the facet hills Σ to Υ. The dislocation reduction effect pervades innermost parts of the low defect density single crystal regions Z on Π.

③ Japanese Patent Laying Open No. 2003-183100 has an intermediate character between the concave facet pits of ① Japanese Patent Laying Open No. 2001-102307 or ② Japanese Patent Laying Open No. 2003-165799 and convex facet hills of the present invention. Stripe parallel facets of ③ Japanese Patent Laying Open No. 2003-183100 are composed of parallel V-grooves and Λ-roofs. The parallel groove/roof structure is neither convex nor concave. The stripe mask method making parallel grooves and roofs has an intermediate. In the stripe facets type, a V-groove is accompanied by two facets on both sides. Dislocations included in the facets slide down and penetrate into the bottoms of the V-grooves. However the facets have no H at the ends of the parallel grooves. Dislocations are pulled only in two directions vertical to the extension of the parallel V-grooves and Λ-roofs. Dislocation pulling force and dislocation arresting force are still weak and insufficient in the stripe facet method ③.

The present invention, which is an improvement of the facet growth methods, makes convex facet hills Σ, excludes dislocations on Σ outward along steep facets in all directions, gathers dislocations into the network closed loop defect accumulating region H enclosing Σ and arrests dislocations in the network closed loop H. The closed loop H enables the present invention to reduce EPD in facet growth parts to less than $1 \times 10^6 \, \text{cm}^{-2}$.

The present invention has an excellent strong point of chip-separation by corroding and eliminating the network defect accumulating region H by wet etching or dry-etching in addition to the advantage of reduction of dislocations in the low defect density single crystal regions Z. The chip-separation from processed wafers can dispense with cutlery in the present invention. It is very difficult for mechanical cutlery to cut a processed wafer to triangle chips, hexagon chips or other non-rectangle chips. Etching of the network H enables the present invention to divide a processed wafer into arbitrary shapes of chips. This is a conspicuous merit of the present invention.

Nitride semiconductor crystals are grown on an undersubstrate having a masked part Υ and exposed parts Π by making a network closed loop mask. Facet hills with dislocations Σ are grown on the exposed part Π. A defect accumulating region H is produced on the network closed loop Υ. The defect accumulating region H encloses facet hills Σ growing on Π. Any spot of the facet hills has a close point in the defect accumulating region H, since H encloses Σ as a closed loop. Dislocations in the fact hills Σ are bent outward, are attracted from Σ by H and are absorbed by H. H accommodates dislocations. Dislocation density is reduced on the facet hills Σ, which become low defect density single crystal regions Z. Since the network H entirely encloses Zs, H reveals stronger dislocation decrement power than the stripe facet method.

The defect accumulating region H is mechanically, chemically and physically weaker than other regions Z and Y. The weakness of H results from being inversion-single crystal or polycrystal. In any case, N-surfaces are revealed on the top in the defect accumulating region H. In GaN or other nitrides, a Ga-surface, InGa-surface and Al-surface are strong. But an N-surface is physically weak and chemically corrosive. The low defect density regions Z and the C-plane growth regions Y have a strong, corrosion-resistant Ga-surface or InGa-surface. On the contrary, the defect accumulating region H has a weak, corrosive N-surface. The top of the GaN crystal has repetitions of strong Ga-surfaces (Z and Y) and weak N-surfaces (H). The crystal of the present invention has such inhomogeneity. The inhomogeneity is a strong point at the same time.

Such inhomogeneity seems to be a weak point for a substrate for semiconductor devices. The inhomogeneity enables device makers to divide a processed wafer into device chips along the network weak defect accumulating region H.

The defect accumulating region H on Υ is either an orientation-inversion single crystal having an allover N-surface or polycrystal having a partial N-surface. The defect accumulating region H is chemically fragile and is fully eliminated away by wet-etching. The network defect accumulating region H enables wet-etching to solve only H and to divide a processed wafer into polygonal chips. Chip-separation is done by wet-etching. This is one of the advantages of the present invention.

Instead of mechanical dicing, polygon chips are produced by dipping a processed GaN wafer into a pertinent etchant, for example, heated KOH, corroding the weak network defect accumulating region H and separating the polygon chips built on Z (and Y). Chemical chip-separation has no precedent. Conventional chip separation is relied upon mechanical dicing. Mechanical cutting relied upon cutlery, which can cut only square or rectangle chips by straightforward scribing, is inapt at chip-separation of zigzag-outlined chips. Mechanical chip-separation has restricted shapes of all the conventional chips within squares or rectangles. Wet-etching allows the present invention to selectively corrode and eliminate the closed loop network defect accumulating region H. The network defect accumulating region H enables the present invention to produce triangle, hexagon or other arbitrary zigzag outlined chips with non-90-degree corner angles.

The conventional chip separation by mechanical dicing has drawbacks of low yield and long time-consumption. Sometimes whetting granules cause scars on chips. The damage becomes an origin of multiplication of defects, which is another defect of the mechanical cutting. The present invention can employ the chip-separation of dipping a processed wafer into an etchant instead of mechanical dicing. Neither cutting dust nor degradation-inducing scar appears. The new effective chip-separation is another advantage of the present invention.

In the case of LEDs, emittable light power sometimes increases with increasing end surface areas. Triangle LEDs are sometimes superior to square LEDs in emitting efficiency. Sometimes hexagon LEDs are preferable to square LEDs. The present invention allows wet-etching or dry-etching to corrode the defect accumulating region H and to separate chips. Triangle, hexagonal or other zigzag outlined chips can be produced without cutting dust or margin loss. The present invention succeeds in making high luminosity and high efficiency LEDs. This is a useful invention.

Stripe facets prevent the stripe facet method ③ from widening the pitch of the HZY structure beyond 2 mm (2000 μm). Each V-groove has two facets on the sides. Each facet is in contact with one V-groove having a defect accumulating region H. Pulling force of facets into the V-groove is weak in ③. The present invention allots crystals a closed loop network H. Facet hills are enclosed by a farther H, a closer H and a side H. Enclosure of H reinforces the force of pulling dislocations from the facet hills. The dislocation reduction effect of H is fully maintained in wide outlined polygons having the maximum diameter of 3 mm to 5 mm. Even a large hexagon unit of the maximum diameter of 20 mm has the dislocation reduction effect caused by H. The nitride crystal wafer prepared by the present invention is useful for making large-sized light emitting devices and large-sized power devices thereupon.

The stripe facet growth method ③ has another drawback of a high aptitude for break along the weak, straight-extending defect accumulating regions H and difficulty of handling in the wafer-processing. The GaN or nitride crystal substrates of the present invention have a strong point of sturdiness. The weak defect accumulating region H forms a closed loop network which contains a variety of directions and sizes of H. The nitride crystal wafers of the present invention are resistant to strain and immune from accidental break.

[Method of Producing Nitride Semiconductor Crystal Substrate]

An undersubstrate is prepared. A GaAs(111)A-plane wafer, SiC single crystal wafer, spinel single crystal wafer, silicon single crystal wafer or sapphire single crystal wafer can be available for an undersubstrate.

A network closed loop mask with a width T is formed on the undersubstrate. Since the mask is a network, the continual mask makes a network continual covered part Υ. Other parts are exposed parts Π enclosed by the mask and Υ. The area S1 of the covered part Υ is smaller than the area S2 of the exposed parts Π. S1<S2. The relation is always valid in the facet growth methods. The ELO method takes a reverse relation of S1>S2.

Materials of the mask are $SiO_2$, SiN, Pt, W, or Ti. The best mask material is $SiO_2$. If the mask is made of $SiO_2$, the defect accumulating region H on the $SiO_2$ mask becomes an inverse-orientation single crystal (inverse to Z or Y) with high probability. Metallic masks produced with Pt (platinum) or W (tungsten) form a defect accumulating region H, which is a polycrystal in many cases.

The order of preference for mask is $SiO_2$>W>Pt>SiN. The network mask is produced by piling a mask material film on an undersubstrate by sputtering or evaporation and patterning a desired closed loop network by photolithography and etching.

A suitable thickness of the mask is 20 nm to 500 nm. A preferable mask thickness is 50 nm to 100 nm. The thickness of the mask has little influence upon the properties of crystals.

The covered part Υ should form closed loops. Repetitions of same closed loops form a network Υ. For making a regular network, the unit closed loop pattern is restricted to an equilateral triangle, a square, a rectangle, a regular hexagon or 120 degree equiangle (elongated) hexagon. A favorable width T of the masked part Υ (mask width) is 0.03 mm to 0.2 mm. A preferable width T is 0.05 mm to 0.2 mm.

The growth of nitride semiconductor crystal includes two steps, the formation of a low temperature buffer layer and the formation of a high temperature thick epitaxial layer. A thin buffer layer is made upon an undersubstrate at a lower temperature in vapor phase for alleviating lattice misfit. The buffer layer is a thin film of a thickness of 50 nm to 150 nm. Then a thick epitaxial layer of a thickness of 1 mm to 5 mm is grown on the buffer layer in vapor phase.

Vapor phase methods available for growing nitride semiconductor crystals are an HVPE method, an MOCVD method, an MOC method and a sublimation method. The methods are explained by taking the case of GaN growth as an example. InGaN or AlGaN crystals can be grown in a similar manner with slightly different materials.

[HVPE Method (Hydride Vapor Phase Growth)]

The material of gallium is metal Ga. The material of nitrogen is ammonia $NH_3$ gas. A tall hot-wall type furnace has circular heaters, a susceptor at a lower position and a Ga-boat with metal Ga at an upper position. An undersubstrate is set upon the susceptor. The gallium metal in the Ga-boat is heated into a Ga-melt. $H_2$+HCl gas is supplied via an upper inlet into the furnace. HCl reacts with heated Ga metal. Gallium chloride (GaCl) is synthesized. GaCl vapor flows down with $H_2$ gas near the heated susceptor. $H_2$+$NH_3$ gas is supplied to the heated susceptor. GaCl reacts with $NH_3$ and synthesizes GaN. GaN molecules are piled upon the undersubstrate. A GaN film is grown on the undersubstrate. The HVPE has a strong point of high speed growth which is suitable to growth of thick films. Anther advantage is immunity from carbon contamination.

[MOCVD Method (Metallorganic Chemical Vapor Deposition)]

This is the most prevalent method of making GaN thin films. A cold-wall type furnace has a susceptor with a heater and gas inlets. A metallorganic Ga-containing gas, e.g., TMG (trimethylgallium) or TEG (triethylgallium), diluted with $H_2$ gas is supplied to a heated undersubstrate on the susceptor as a Ga material. Ammonia gas diluted with $H_2$ gas is supplied to the heated undersubstrate as a N material. Direct reaction of $NH_3$ with e.g., TMG synthesizes GaN. Synthesized GaN is piled upon the undersubstrate. The MOCVD, whose growth speed is slow, has an advantage of exact controlling of thickness. The MOCVD is suitable for thin film growth. TMI (trimethylindium) or TMA (trimethylaluminum) gas is employed as a material gas for making In-containing or Al-containing nitride semiconductor crystals.

[MOC Method (Metallorganic Chloride Method)]

The MOC employs a metallorganic Ga-containing gas as a Ga material. Ammonia gas is supplied as a N material. Ga-, N-materials are similar to the MOCVD method. The MOC prevents $NH_3$ directly from reacting with the Ga-material. In a hot wall-type furnace, TMG reacts with HCl. GaCl is produced in an upper space. GaCl vapor falls. Then GaCl reacts with ammonia near the susceptor. GaN is synthesized. The undersubstrate is coated with synthesized GaN. Production of the intermediate GaCl prevents carbon from contaminating MOC-grown GaN.

[Sublimation Method]

Polycrystalline GaN is a material. In an furnace, a material polycrystalline GaN and an undersubstrate are laid at different points. The GaN polycrystal is heated. A gradient of temperature is formed between the undersubstrate and the GaN polycrystal. The heated GaN is sublimed into GaN vapor. The GaN vapor is transferred to the undersubstrate, is cooled and is piled on the undersubstrate. A GaN crystal is made upon the undersubstrate.

The present invention is applicable to any method above-described. A vapor phase growth first induces plenty of GaN crystal nuclei to occur on exposed parts Π and brings GaN crystal nuclei to couple and unify to a crystal film on the expose parts Π. Many dislocations are yielded in the films. Dislocations, which do no vanish easily by themselves, extend like threads as the crystal grows. Extension of dislocations is nearly parallel to the directions of crystal growth. The facet growth takes a longer time to cover exposed parts with crystal films than the ELO growth, since the exposed parts of the facet growth are wider than that of the ELO growth. Crystal growth on the covered parts Τ does not start unless the exposed parts Π are completely concealed with crystals. Beginning of the crystal growth on the covered parts Τ is long delayed.

Sides of the crystal hills on Π are facets of low Miller indices. Thus the crystal hill is named a facet hill Σ. When the undersubstrate is a single crystal plate having three-fold rotation symmetry, gallium nitride (GaN) starts crystal growth in a c-axis direction in parallel to a normal standing on the undersubstrate. If top surfaces were even, the surfaces would become C-planes. In the present facet-growth, the top surface includes C-planes and many facets beside C-planes.

Prevailing facets appearing in the c-axis growth are {10-11}, {10-12}, {11-22}, {11-21} and so on. At an early stage, facet hills Σ are polygon protuberances enclosed by the closed loop mask. As the crystal grows thicker, the facet hills Σ transform into polygonal cones covered with higher facets. The regions growing just below the facets are single crystals whose dislocation density decreases while the crystal grows. Thus the regions just below the facets on Π are called "low defect single crystal regions Z".

Favorably the facet hills Σ should become polygon cones, but facet hills do not necessarily grow to polygon cones. Some facet hills grow with maintaining flat plateaus. The flat plateaus are C-planes. The regions just below the C-planes are called "C-plane growth regions Y". When the facet hills grow to a sufficient height, crystal growth begins on the covered parts Τ which outline the facet hills Σ. The crystals on Τ are sometimes orientation-inverse single crystals, whose c-axis is inverse to the c-axis of the surrounding crystals Z on Π, sometimes single crystals whose c-axis inclines to the surroundings Z or at other times polycrystals. The properties of the crystal grown on the mask-covered parts Τ depend upon the undersubstrates, mask materials and growing conditions.

After the commencement of covering Τ with films, crystal growth continues on both Π and Τ. The facet hills Σ on Π are taller than the network crystal on Τ. The on-Π plateaus Σ and the on-Τ network grow upward at a similar speed. The low-leveled network on Τ is not buried. The facet hills Σ keep the same conical shapes during the growth. The crystal surface rises till the end of the growth, maintaining the same rugged surface. The unit length of the a-axis is denoted by "a". The unit length of the c-axis is denoted by "c". An inclination angle of {11-22} facet to a horizontal plane (C-plane) is $\cot^{-1}(a/c)$. Another inclination angle of {1-101} facet to a horizontal plane (C-plane) is $\cot^{-1}(3^{1/2}a/2c)$. Facet inclination angles are large enough, for example, 50 degrees to 60 degrees. The facets of the facet hills Σ are steep.

Threading dislocations hardly perish and extend in the directions parallel to the direction growth. A local direction of growth is a normal to the local surface. The present invention makes convex facet hills Σ on Π. Growth on the facets directs in normals of the facets. Dislocations accompany the growth. Dislocations stretch in the slanting direction normal to the facet. The facets grow slanting-outward. The dislocations extend slanting-outward.

As the growth proceeds, dislocations are swept out of the facets. Since the facets are maintained on Π, slanting growing speed is far lower than vertical growing speed. The vertical component of the slanting growing speed is less than the vertical growing (C-plane) speed. Dislocations on the facet hills Σ slide on the facets and fall out to the bottoms. Fallen dislocations are absorbed and arrested into the network defect accumulating regions H outlining the facet hills Σ. The defect accumulating region H has grain boundaries K on both sides. The grain boundaries prevent once-arrested dislocations from releasing again. The grain boundaries nearly coincide with the boundaries of Π. Then "K" is used for denoting both the shape of n and grain boundaries.

Why do dislocations go into the defect accumulating regions H? Such a question may arise. There are a variety of dislocations. Many dislocations are such ones in which atomic arrangement is inverse to the surrounding crystal. When the arrangement inversion dislocations reach the defect accumulating regions H, the arrangement inversion dislocations are unified to the defect accumulating regions H being originally inverse without discrepancy.

The function of the facet for sweeping dislocations down to the peripheral network begins at the same time as the faceted polygonal crystals are formed on the exposed parts Π. The degrees of decrement of dislocations on the exposed parts Π are not common. The dislocation reduction depends upon the positions in Π. At the center of Π, dislocations is neither newly produced nor supplied. The EPD (etch pit density), which is a synonym of the dislocation density, at the center of Π always has a tendency of decrease. At intermediate or peripheral parts of Π, dislocations are reduced by the sweeping function of neighboring facets but are increased by new dislocations escaping from the center. Although the periphery of Π is close to the defect accumulating regions H as a dislocation sink, recruits from the center retard the reduction of dislocations at the periphery. Thus the EPD, dislocation density, is lower at the center of Π and higher at the periphery of Π.

The dislocation density changes as the crystal thickness increases. The quality of the defect accumulating regions H varies during the crystal growth. Defect accumulating regions H sometimes change from orientation-inversion parts to polycrystalline parts when the crystal growth proceeds. The possibility of the change depends upon the width and material of the mask. Sometimes defect accumulating regions H vanish. When the defect accumulating regions H forming network outlines vanish, the crystal loses the function of attracting and arresting dislocations. When defect accumulating regions H vanish, the parts on T will rise and facets on the parts will vanish. Then the dislocations existing on the exposure parts will not decrease but will increase.

The crystal which has been grown in the manner has many convexes of facet hills Σ lying in the network. FIG. 16 shows a perspective view of a rugged surface of the grown crystal. Parts below the facet of the hills are low defect single crystal regions Z. Parts below the top flat of the hill are C-plane growth regions Y, which are low-dislocation single crystals. Net grounds being out of the hills are defect accumulating regions H.

An as-grown GaN crystal has a rugged surface with plenty of convexes. Rough-surfaced crystals are unsuitable for substrates, on which semiconductor devices are fabricated. The as-grown crystal is sliced into as-cut wafers of a pertinent thickness. Then the as-cut wafers are polished into mirror wafers. A mirror wafer is transparent like glass. The network structure can not bee seen by eye-sight observation. However a cathode luminescence (CL) method enables us to observe the network structure of H on the transparent wafer. FIG. 17 shows a perspective CL view of a part of a GaN mirror wafer. Outlines of equilateral hexagons are a network composed of the defect accumulating regions H. Inner parts enclosed by the network are low defect density single crystal regions Z. C-plane growth regions are seen at the centers of the low defect density single crystal regions Z. In some hexagons, there is no C-plane growth regions Y.

The dislocation density (EPD) is measured by heating a mixture of phosphoric acid ($H_3PO_4$) and sulfuric acid ($H_2SO_4$) at a temperature of 240° C. to 280° C., dipping a GaN wafer, disclosing etch pits (EP) at the points of the dislocations on the surface of the GaN wafer, observing the GaN wafer by a Nomarski interference microscope, counting the number of etch pits emerging in a definite sampling area and calculating an etch pit density (EPD) in a unit area.

[Chip-Separation]

AlGaInN-type LEDs (light emitting diodes) are fabricated on the processed GaN wafer by an MOCVD method. LED chips are separated by dipping the GaN wafer into a sodium hydroxide (NaOH: higher than one normality; >1N), corroding only the defect accumulating regions H which form a network consisting of connected closed loops, and separating the LEDs which consist of a low defect density single crystal region Z and a C-plane growth region Y from each other. Inhomogeneity allows the etching to corrode only the network defect accumulating regions H and divide a wafer into device chips. A cathode luminescence estimation confirms that defects do not impinge upon the active layers made by the MOCVD method.

It is confirmed that a potassium hydroxide (KOH: higher than one normality; >1N) solution is applicable to the chip-separation. Heating the KOH solution above 50° C. accelerates the selective etching.

It is confirmed that dry-etching is also applicable to the chip-separation of the processed GaN wafer in addition to wet-etching. There is a condition favorable for selective etching by putting a processed GaN wafer in the HVPE furnace, heating the GaN wafer, supplying the heated GaN wafer with hydrogen chloride (HCl) gas, corroding only the defect accumulating regions H and separating unit chips from each other. The optimum temperature for dry-etching turns out to be 700° C. to 900° C. The dry-etching temperature is lower than an optimum epitaxial growth temperature of 1050° C. It is a favorable fact.

Conventional dry-etching requires preliminary mask-coating on an object for protecting necessary parts before etching. But this dry-etching requires no mask coating, since the substrate itself has etching-selectivity. The regions Y and Z are not dry-etched. The defect accumulating regions H are easily dry-etched. Since the network defect accumulating regions H are selectively etched away, the wafer is cut along the closed loop dry-etched regions H into chips which contain only Z and Y. In spite of complex polygon shape, wet- or dry-etching can easily separate chips.

The present invention differs from ③ Japanese Patent Laying Open No. 2003-183100 in the shape of the defect accumulating regions H. The present invention endows the defect accumulating regions H with two dimensional polygon shape for forming a network of H. The polygon network H reduces C-plane growth regions Y. The polygon-repeating network defect accumulating region H enables the present invention to reduce dislocation density far lower than the parallel defect accumulating regions H in the stripe facet method ③. The reason is described.

A C-plane growth region Y is a region which has grown with maintaining a C-plane surface without facets. Even when facets are maintained in the neighboring Zs, the C-plane growth regions are immune from the function of facets of bending dislocations. The stripe facet method of ③ can reduce C-plane growth regions Y by controlling growing conditions but cannot fully remove C-plane regions Y.

The reason is that stripe hills covered only with double facets would make highly sharp ridges and would induce energetic instability. Even if the growth condition was controlled in the stripe facet method, C-plane growth regions Y having a (0001) plane would appear on the tops of facets for reducing free energy. Dislocations inherent in C-plane growth regions Y are transferred to neighboring low dislocation density single crystal regions Z. Linear C-plane growth regions Y accompany the stripe mask pattern growth method making linear parallel one-dimensional defect accumulating regions H and being proposed by ③ Japanese Patent Laying Open No. 2003-183100. The C-plane growth regions Y restrict the decrement of dislocations in the low dislocation density single crystal regions Z. EPD does not decrease below $1\times10^6$ cm$^{-2}$ by the strip mask facet growth method.

The present invention arranges defect accumulating regions H to form a closed loop, preferably to form polygons, in two dimensions. The area of the C-plane growth regions is reduced in comparison with parallel stripe defect accumulating regions. The closed loop defect accumulating regions H can reduce the dislocation density of single crystal regions Z to a tenth (1/10) of the dislocation density of single crystal regions sandwiched by linear parallel Hs. The present invention enables the single crystal regions Z to reduce the dislocation density (EPD) to $1\times10^5$ cm$^{-2}$. A more favorable condition allows single crystal regions Z to decrease EPD to $1\times10^4$ cm$^{-2}$.

The unit shape of the closed loop for a network mask shall be a circle, an ellipse or a polygon. A polygon unit shape is preferable to a circle or an ellipse. Polygon masks allow growing nitride crystals to make symmetry facets, which have a function of eliminating dislocations, in accordance with the symmetry of undersubstrates. A polygonal mask allows a hexagonal (0001) undersubstrate to make distinct facet hills of regular triangles, lozenges, trapezoids or hexagons. The facets reveal a strong dislocation reduction effect.

[Why Large-Sized Substrates Are Made?]

Vapor phase growth is suppressed on the regions to which material gases cannot attain. The facets appearing in vapor phase growth have inclination angles of 40 degrees to 60 degrees. In the prior stripe-type facet growth proposed by ③ Japanese patent Laying Open No. 2003-18300, the depth of grooves is determined by the pitch of the stripe mask pattern. For example, when the mask takes the maximum 2 mm pitch, the peak-valley depth is about 1 mm for a 45 degree inclination angle. Hills and valleys align in parallel to one direction. Material gases can be neither uniformly spread nor uniformly removed at the center of the wafer. Non-uniform gas supply/removal induced by deep parallel grooves gives bad conditions to the stripe facet growth method.

On the contrary, the present invention arranges closed loop masks, in particular, polygon masks with high symmetry. The maximum height of facets may be as high as the stripe facet growth method. High symmetry ensures radial-extending gas supply/removal. Despite the large peak-valley height, symmetric facets maintain uniform gas distribution in wide area. Thus the present invention can make uniform large-sized wafers which are wider than 20 cm$^2$. Occurrence of uniform growth on the whole surface is confirmed on a sample with facets of a 5 mm width and about 2.5 mm height.

[Applications]

The large-sized (wider than 20 cm$^2$) nitride semiconductor wafer of low defect density (minimum EPD<$1\times10^4$ cm$^{-2}$) produced by the present invention has a wide scope of applications of making the following devices with high quality.

Light emitting devices (LEDs and LDs), electronic devices (rectifier, bipolar transistor, field effect transistor (FET), high electron mobility transistor (HEMT), and so on), semiconductor sensors (thermometer, pressure sensor, radiation sensor, visible-ultraviolet light detector, and so on), surface acoustic wave devices (SAW), acceleration sensor, MEMS parts, piezoelectric oscillator, resonator, piezoelectric actuator, and so on.

Applications to the substrates for light emitting devices are promising. It is confirmed that the laser diodes (LDs) fabricated on the nitride substrates prepared by the present invention have a lifetime tens to hundreds of times as long as the lifetime of conventional on-sapphire LDs with $1\times10^7$ cm$^{-2}$ EPDs in the case of large current injection of $1\times10^3$ to $1\times10^5$ A/cm$^2$. Degeneration of nitride semiconductor light emitting devices is caused by;

(1) multiplication of dislocations in active layers
(2) impurity diffusion via defects The present invention succeeds in making long lifetime devices by providing makers with very low defect density nitride substrates, suppressing substrate-originating threading dislocations from spreading into active layers of devices and preventing impurities from diffusing via defects.

Long lifetime of electronic devices made on the substrates of the present invention is confirmed by examinations applying high voltage and supplying big current. Inherent dislocations become current leakpaths in the devices by an application of high voltage. The present invention enables the devices to heighten allowable voltages of the devices, because EPDs of the substrates made by the present invention are lower than $1\times10^7$ cm$^{-2}$ of conventional on-sapphire devices.

Existence of leakpaths, which causes noise, will be a serious drawback for sensors. The present invention, which can make substrates immune from leakpaths, enables makers to produce high sensitive sensors on low defect nitride substrates.

BRIEF DESCRIPTION OF THE DRAWINGS

FIG. 7(1) shows facet hills Σ enclosed by facets Φ and formed on the exposed parts Π and no-occurrence of growth on the covered (masked) parts Τ. FIG. 7(2) shows the facet hills Σ enclosed by the facets Φ rising higher as trapezoids having central plateaus. FIG. 7(3) shows a further rise of the facet hills, extinction of the central plateaus and a start of growth on the masked parts Τ.

FIG. 8(1) shows an undersubstrate S provided with a network mask M. Τ is covered parts. Π is exposed parts. FIG. 8(2) shows facet hills Σ enclosed by facets Φ and formed as trapezoids on the exposed parts Π and no-occurrence of growth on the covered (masked) parts Τ at an early stage. FIG. 8(3) shows the facet hills Σ enclosed by the facets Φ rising higher for making top pinnacles and non-occurrence of growth on the covered parts. FIG. 8(4) shows a further rise of the facet hills Σ as pinnacled cones, a start of growth on the masked parts Τ together with the crystal growth, delayed growth of defect accumulating regions H on the covered parts Τ and the condition of causing low-defect single crystal regions Z in the facet hills Σ. This example dispenses with flat C-plane growth regions Y. Sometimes C-plane growth regions Y appear on central tops.

DESCRIPTION OF PREFERRED EMBODIMENTS

Embodiment 1

Sapphire Template Undersubstrate; Patterns A-J; FIGS. 11-15

A sapphire wafer having a thin GaN film of a 2 to 5 μm thickness MOCVD-grown thereupon is prepared as an undersubstrate. This GaN/sapphire wafer is called a sapphire template. Sputtering makes a 100 nm thick $SiO_2$ film on the sapphire template. Conventional photolithography and etching make a $SiO_2$ mask pattern on the sapphire undersubstrate. The layer structure is $SiO_2$/GaN/Sapphire from top to bottom. FIGS. 11 to 15 demonstrate units of the mask patterns. Although these figures show only one unit pattern, the masks are composed of repetitions of a unit pattern of the same shape and the same size aligning crosswise and lengthwise.

Figure 1:
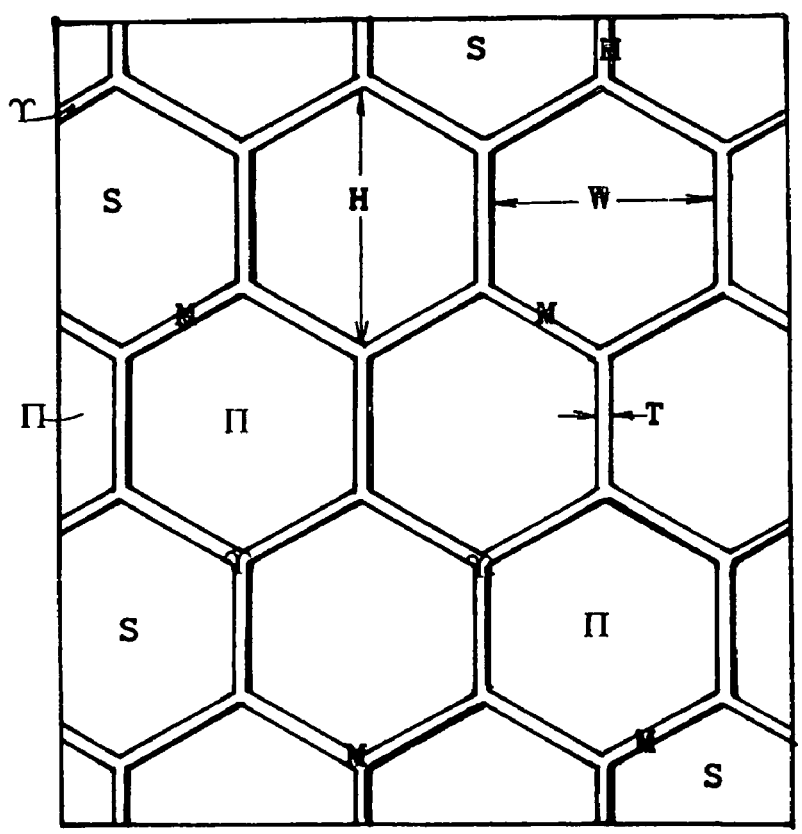
FIG. 1 is a plan view of a network masked undersubstrate having a mask composed of outlines of repetitions of regular hexagons for realizing the facet growth of nitride semiconductor of the present invention. S is an undersubstrate. M is a network mask. Π are exposed parts. Τ are covered parts. H is a length of a unit regular hexagon of the exposed part. W is a breadth of a unit hexagon of the exposed part. T is a width of the mask.
Figure 2:
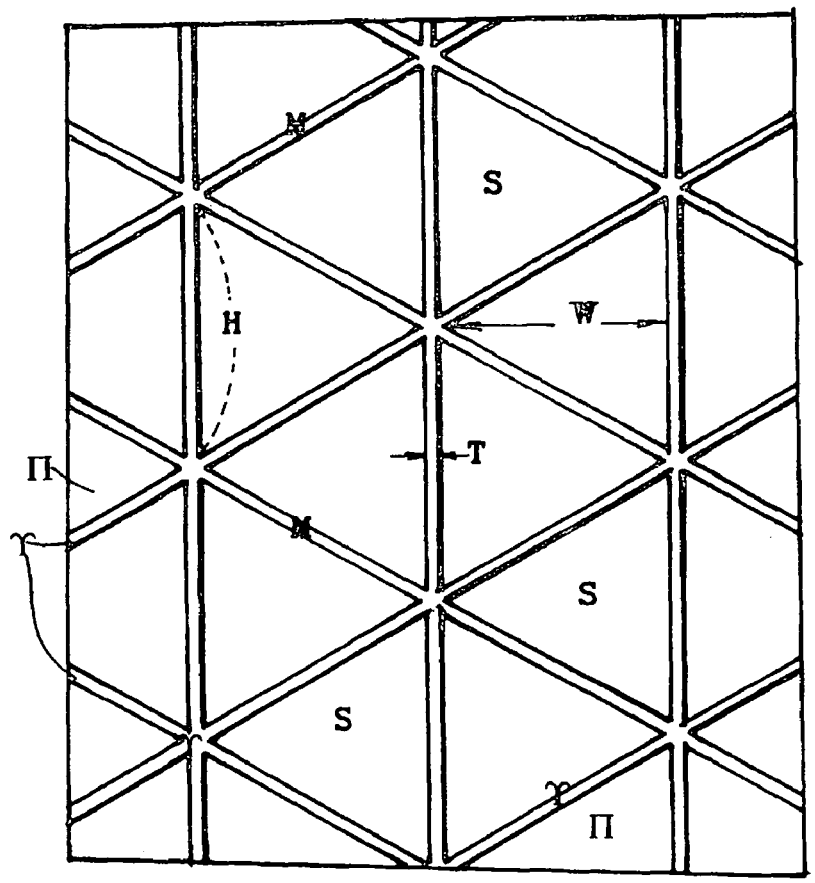
FIG. 2 is a plan view of a network masked undersubstrate having a mask composed of outlines of repetitions of equilateral triangles for realizing the facet growth of nitride semiconductor of the present invention. S is an undersubstrate. M is a network mask. Π are exposed parts. Τ are covered parts. H is a length of a side of a unit equilateral triangle of the exposed part. W is a breadth of a unit equilateral triangle of the exposed part. T is a width of the mask.
Figure 3:
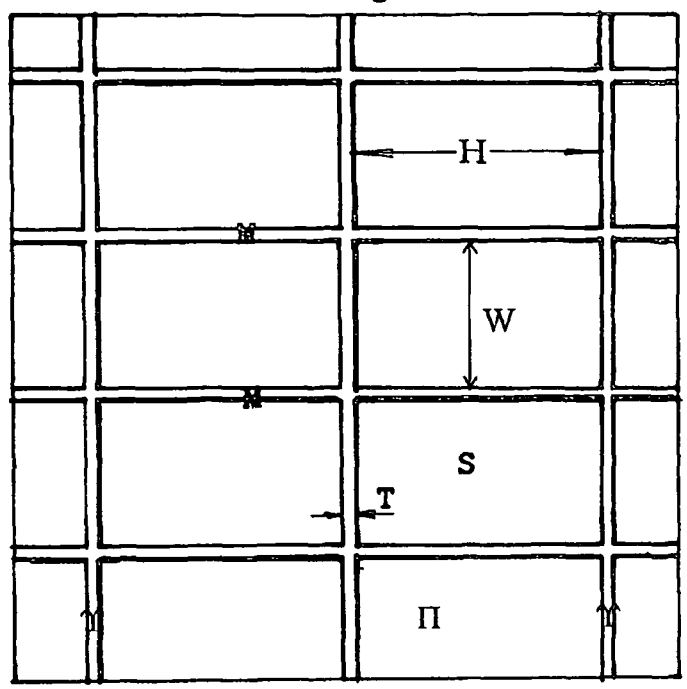
FIG. 3 is a plan view of a network masked undersubstrate having a mask composed of outlines of repetitions of rectangles for realizing the facet growth of nitride semiconductor of the present invention. S is an undersubstrate. M is a network mask. Π are exposed parts. Τ are covered parts. W is a breadth of a unit rectangle of the exposed part. T is a width of the mask.
Figure 4:
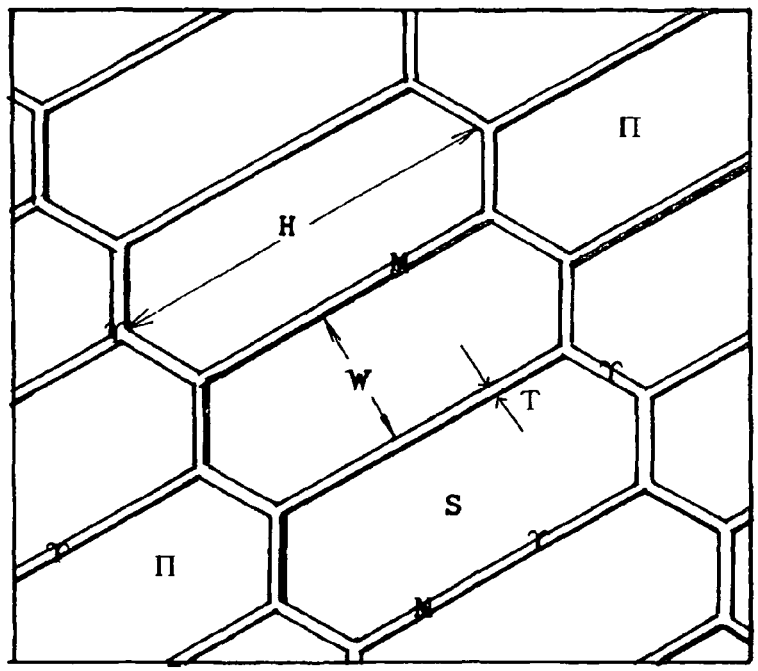
FIG. 4 is a plan view of a network masked undersubstrate having a mask composed of outlines of repetitions of elongated hexagons for realizing the facet growth of nitride semiconductor of the present invention. S is an undersubstrate. M is a network mask. Π are exposed parts. Τ are covered parts. H is a length of a unit elongated hexagon of the exposed part. W is a breadth of a unit elongated hexagon of the exposed part.
Figure 5:
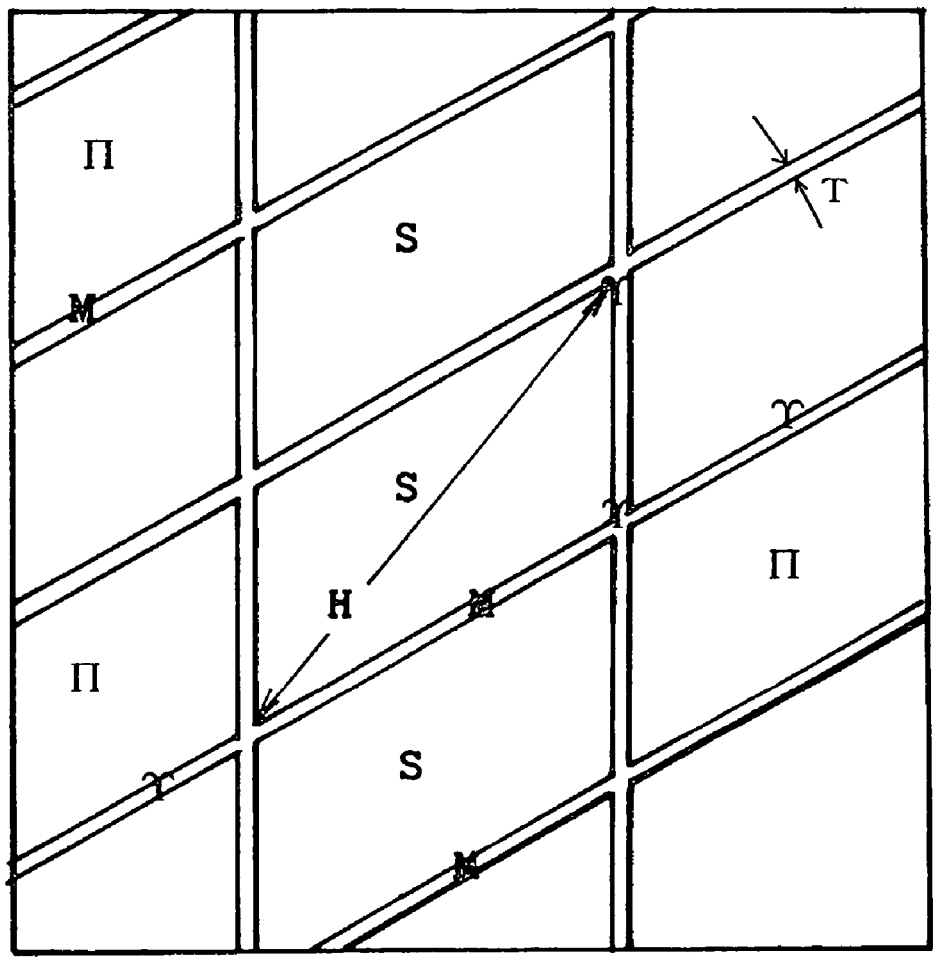
FIG. 5 is a plan view of a network masked undersubstrate having a mask composed of outlines of repetitions of parallelograms for realizing the facet growth of nitride semiconductor of the present invention. S is an undersubstrate. M is a network mask. Π are exposed parts. Τ are covered parts. H is a length of a unit parallelogram of the exposed part.
Figure 6:
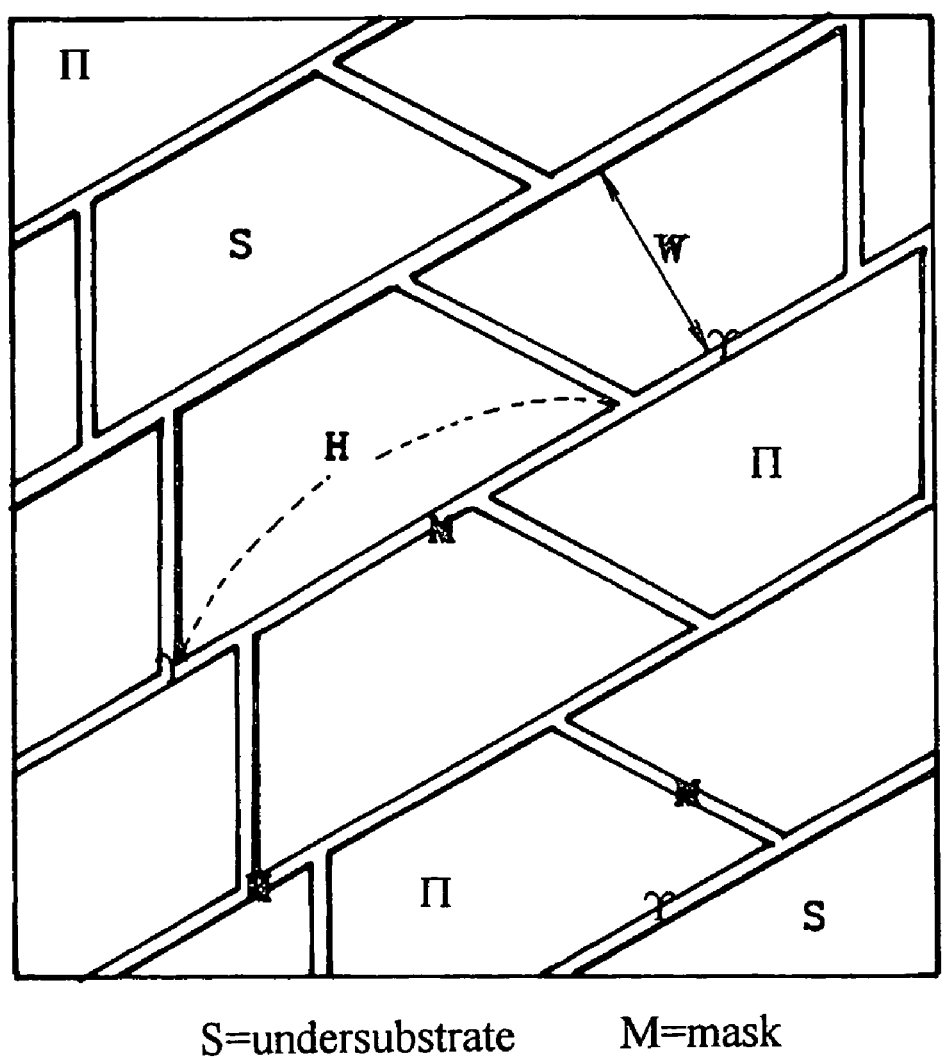
FIG. 6 is a plan view of a network masked undersubstrate having a mask composed of outlines of repetitions of trapezoids for realizing the facet growth of nitride semiconductor of the present invention. S is an undersubstrate. M is a network mask. Π are exposed parts. Τ are covered parts. H is a length of a unit trapezoid of the exposed part. W is a breadth of a unit trapezoid of the exposed part.
Figure 7:
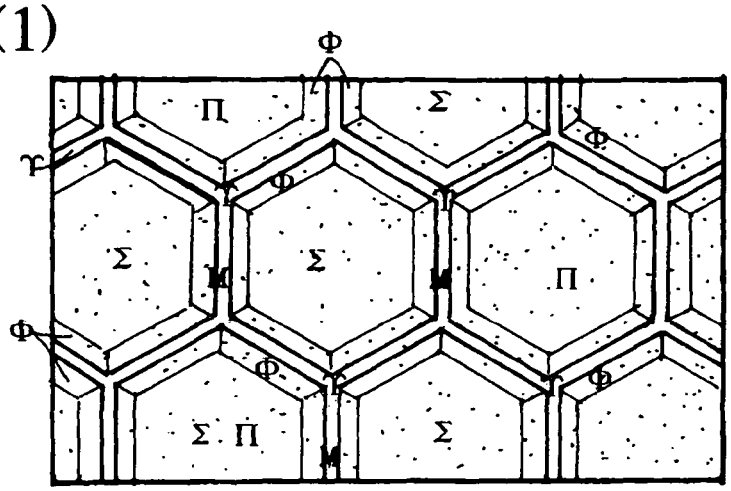
FIG. 7 is plan views demonstrating steps of the crystal growth in the case of forming a regular hexagon network mask on an undersubstrate and growing gallium nitride in vapor phase on the network masked undersubstrate.
Figure 7:
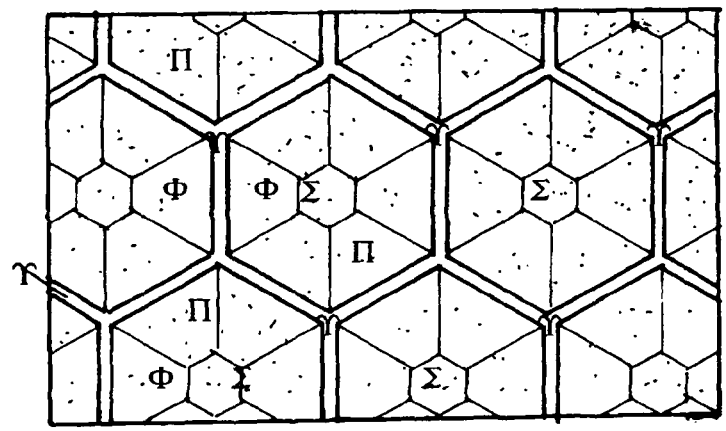
Figure 7:
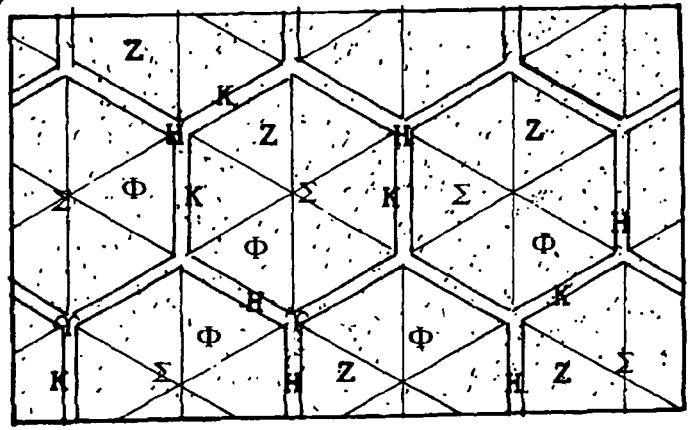
Figure 8:
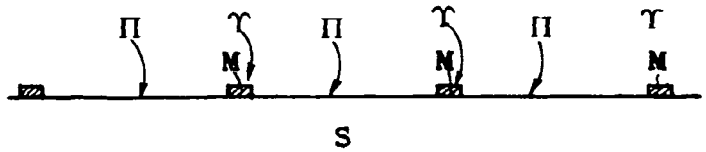
FIG. 8 is vertically-sectioned views for demonstrating steps of the crystal growth in the case of forming a network mask on an undersubstrate and growing gallium nitride in vapor phase on the network masked undersubstrate.
Figure 8:
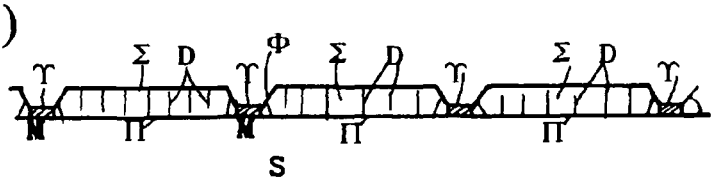
Figure 8:
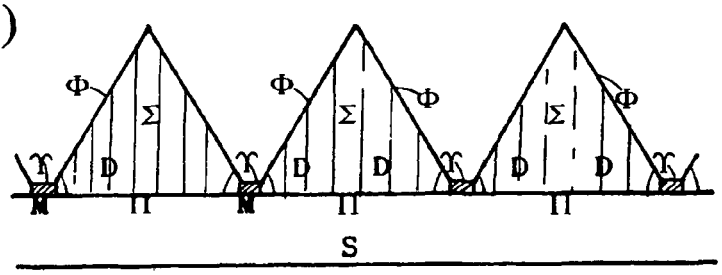
Figure 8:
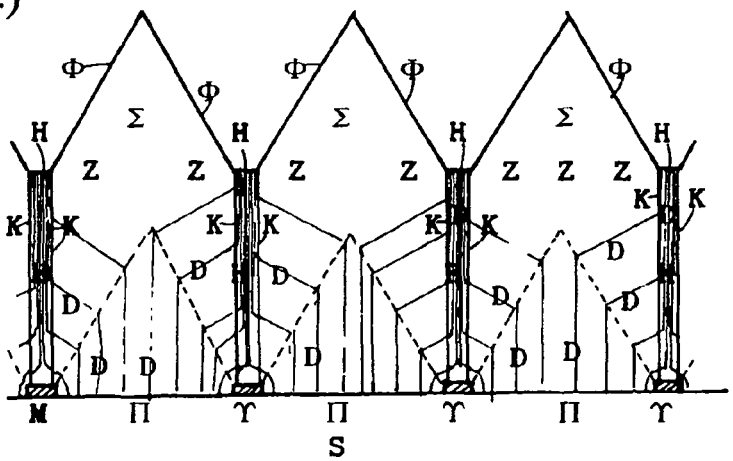
Figure 9:
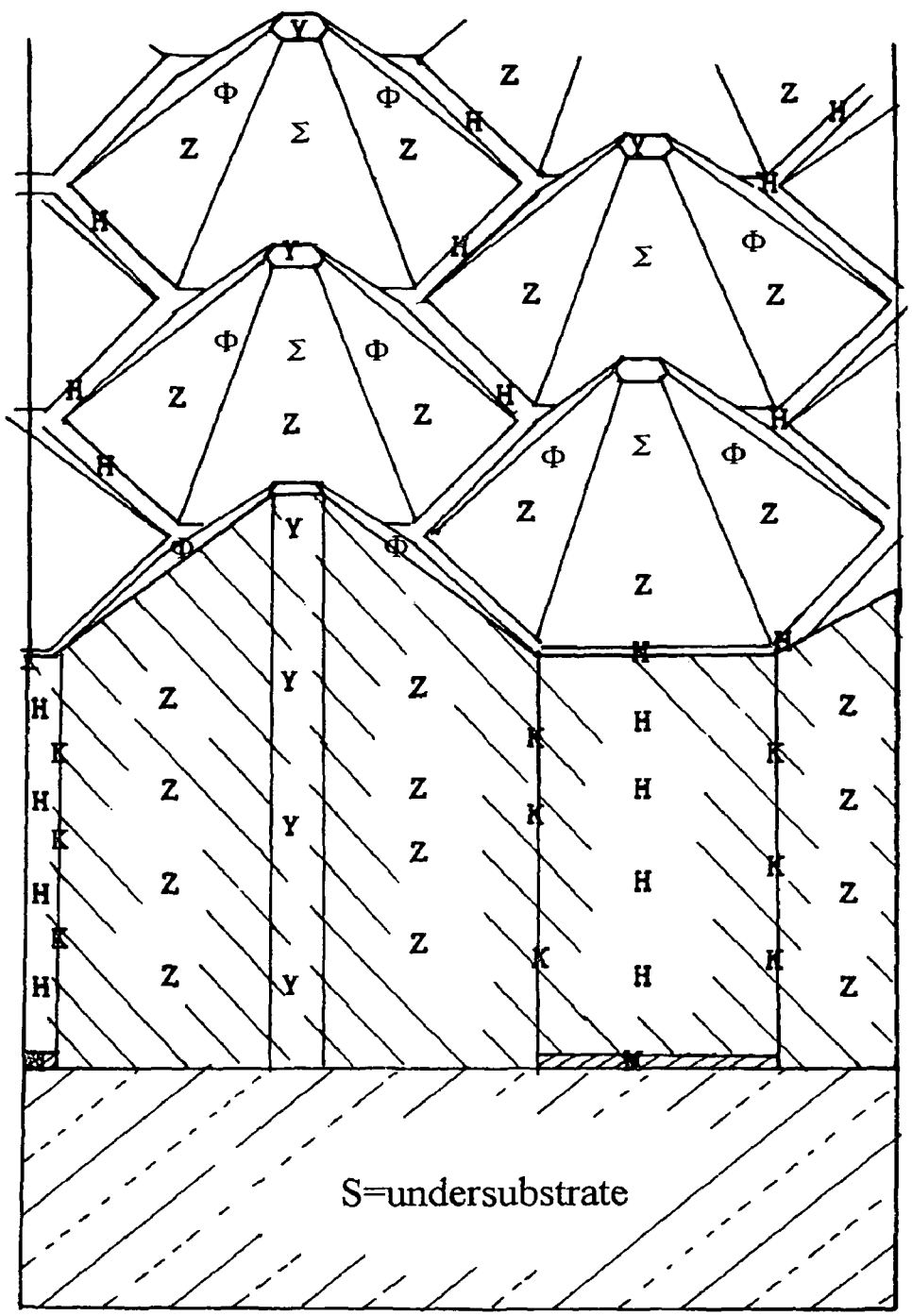
FIG. 9 is an oblique sectioned view showing a GaN crystal which has been produced by forming a regular hexagon network mask M on an undersubstrate S, growing GaN on the network masked undersubstrate and producing higher polygonally conical facet hills Σ being enclosed by the facets Φ and having low defect density single crystal regions Z on exposed parts Π and making a lower network defect accumulating regions H on the network mask M in accordance with the teaching of the present invention. Grain boundaries K are yielded between the low defect density single crystal regions Z and the defect accumulating regions H. In the example, flat C-plane growth regions Y appear at tops of the facet hills Σ. C-plane growth regions Y follow the top C-planes. Sometimes C-plane growth regions Y vanish.
Figure 10:
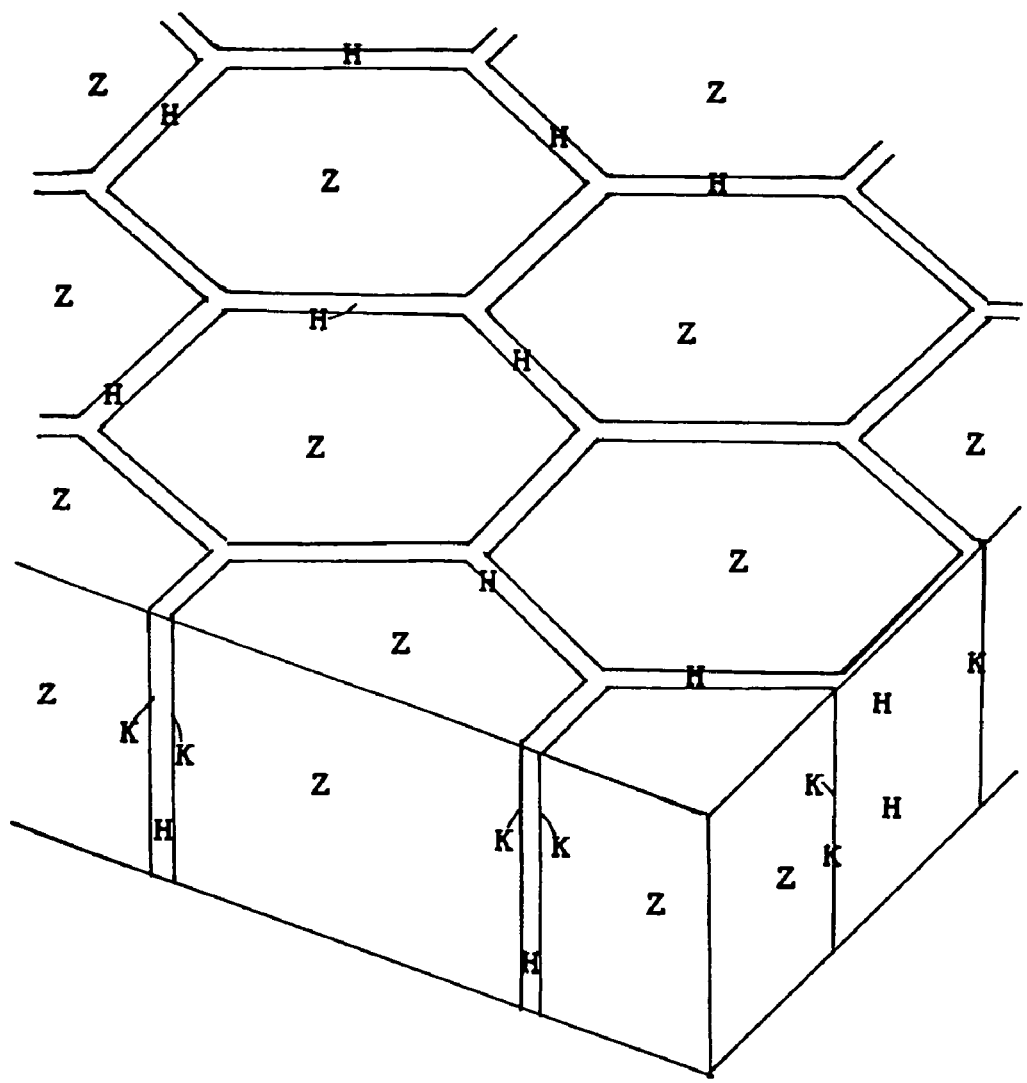
FIG. 10 is an oblique cathode luminescenced (CL) view showing a GaN crystal which has been produced by forming a regular hexagon network mask M on an undersubstrate S, growing a rugged GaN crystal on the network masked undersubstrate and producing low defect density single crystal regions Z on exposed parts Π, making a network defect accumulating region H on the network mask M, slicing the rugged GaN crystal into thin wafers and polishing both surfaces into mirrors in accordance with the teaching of the present invention.
Figure 11:
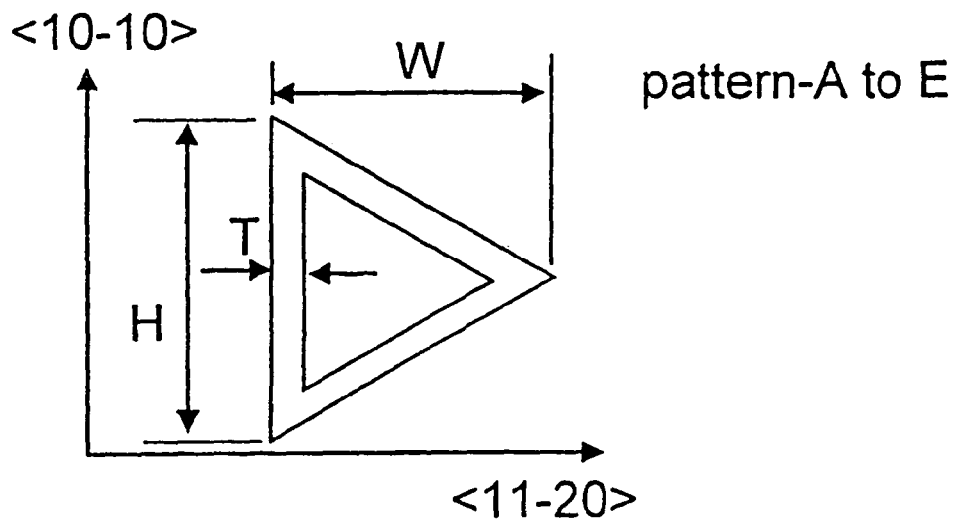
FIG. 11 is a plan view of a part of an equilateral triangle network mask (Patterns A-E) formed upon an undersubstrate for making GaN substrates of the present invention. Repetitions of plenty of equivalent triangles form a network mask, although only one triangle is depicted in the figure. The definitions of a length H and a breadth W of a unit pattern and a width T of the mask are given.

[1. Patterns A-E (Repetitions of Equilateral Triangle Unit Pattern; FIG. 11)]

FIG. 111 is a unit pattern of an equilateral triangle. The figure shows only a unit pattern. In fact, equivalent equilateral triangle patterns are repeated lengthwise and crosswise. One side of the unit pattern triangle is parallel to a <10-10> direction. GaN is a hexagonal system crystal. There are three equivalent directions meeting at 120 degrees. Thus all the sides of the triangle of the unit pattern are parallel to <10-10> directions. Square-bracketed [ . . . ] is an individual representation of directions. Key-bracketed < . . . > is a collective representation of directions. Collective direction <10-1-0> includes three different individual directions [10-10], [0-110], and [−1100]. All the collective representations <10-10>, <0-110> and <0-110> are equivalent and denote the same three directions above.

When GaN is grown on a sapphire C-plane undersubstrate, the GaN grows with a C-plane as a top. But GaN crystal axes twist by 90 degrees from the sapphire axes around the c-axis. GaN[10-10] direction is parallel to sapphire[11-20] direction. FIGS. 11-15 denote the directions of unit patterns in GaN-based directions.

The length of the equilateral triangle unit pattern is denoted by H. The breadth of the unit pattern is denoted by W. The width of the masked parts Υis denoted by T. The part of a width T above the $SiO_2$ mask is the marked parts Υ. Equilateral triangle parts enclosed by the mask are exposed parts Π on which the undersubstrate reveals. Unit patterns A-E are all equilateral triangles but five different unit patterns of different sizes are formed on the sapphire template undersubstrates. Patterns have the following values of W, H and T.

|  | W(breadth) | H(length) | T(mask width) |
|---|---|---|---|
| Pattern A | 0.35 mm | 0.4 mm | 0.002 mm |
| Pattern B | 0.35 mm | 0.4 mm | 0.05 mm |
| Pattern C | 0.9 mm | 1 mm | 0.1 mm |
| Pattern D | 4.4 mm | 5 mm | 0.1 mm |
| Pattern E | 4.4 mm | 5 mm | 0.3 mm |

GaN crystals are grown on the sapphire templates covered with the patterns A-E masks. On-mask grown GaN samples of Patterns A-E are called Samples A-E. The covered part Υinduces a defect accumulating region H thereupon. Low defect density single crystal regions Z are grown mainly on the exposed parts Π. Sometimes narrow C-plane growth regions appear at the centers of the exposed parts Π. It is examined whether the defect accumulating region H is orientation-inversion single crystal, polycrystal or unborn (extinguished). Etch pit density (EPD) is counted at the centers or at peripheries of Π for all samples. The EPDs and the properties of H are listed on Table 1-1. Individual explanation will follow the explanation of the crystal growth and EPD examination.

Figure 12:
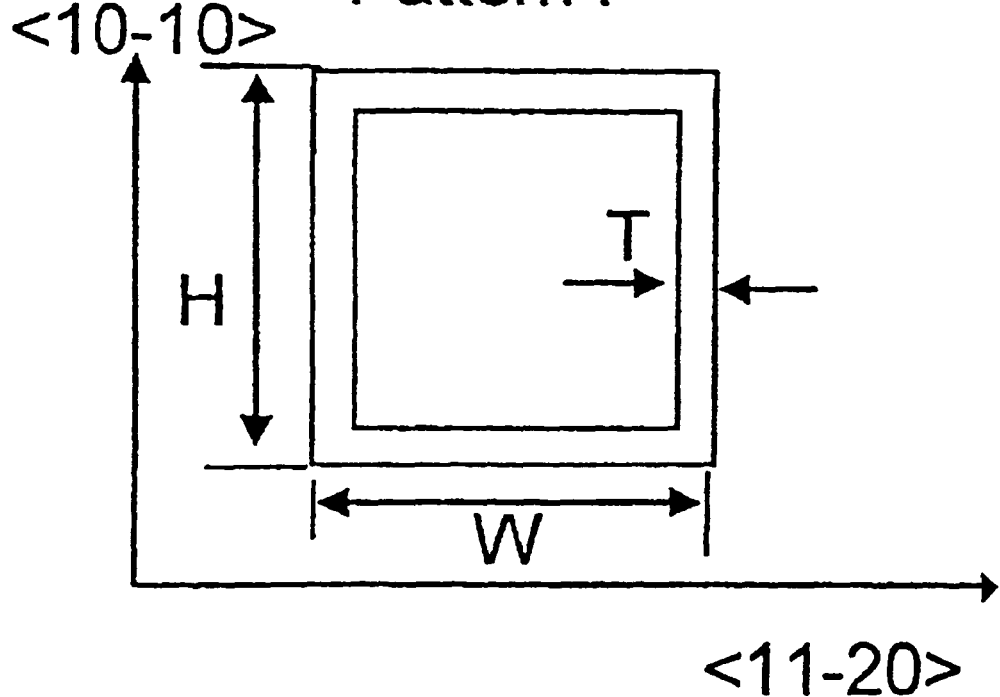
FIG. 12 is a plan view of a part of a square network mask (Pattern F) formed upon an undersubstrate for making GaN substrates of the present invention. Sides of the square are parallel with the directions <10-10> and <11-20> of the undersubstrate. Repetitions of plenty of squares form a network mask, although only one square is depicted in the figure. The definitions of a length H and a breadth W of a unit pattern and a width T of the mask are given.

[2. Pattern F (Repetitions of Square Unit Pattern; FIG. 12)]

Pattern F of mask is repetitions of a square unit pattern as shown in FIG. 12. H and W are a length and breadth of the unit pattern, which extend in directions <10-10>. A set of sides of the square is parallel to a <10-10> direction. Another set of sides is parallel to a <11-20> direction.

|  | W(breadth) | H(length) | T(mask width) |
|---|---|---|---|
| Pattern F | 1 mm | 1 mm | 0.05 mm |

These are the values of the mask Υ. A defect accumulating region H is produced on the mask of Υ. Squares of 0.9 mm×0.9 mm enclosed by the network mask are exposed parts Π. Low defect density single crystal regions Z are born on Π. Sometimes C-plane growth regions Y are produced at the centers of Π.

Figure 13:
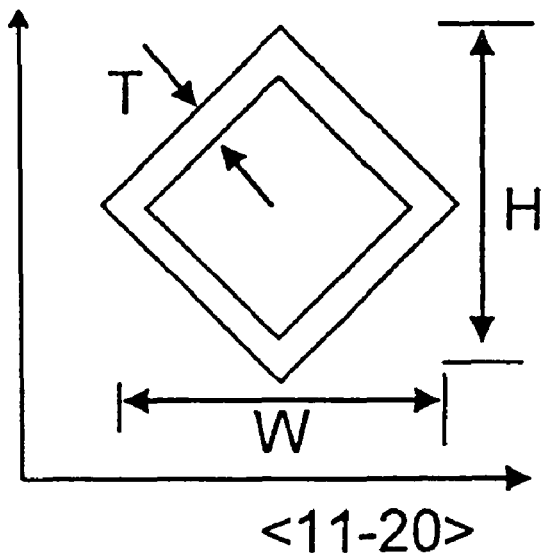
FIG. 13 is a plan view of a part of a square network mask (Pattern G) formed upon an undersubstrate for making GaN substrates of the present invention. Sides of the square incline at 45 degrees to the directions <10-10> and <11-20>. Repetitions of plenty of squares without extra space form a network mask, although only one square is depicted in the figure. The definitions of a length H and the breadth W of a unit pattern and a width T of the mask are denoted.

[3. Pattern G (Repetitions of Square Unit Pattern; FIG. 13)]

Pattern G of mask is repetitions of a square unit pattern as shown in FIG. 13. The unit pattern is a lozenge of a corner of 90 degrees, namely a square. Sides of the square are neither parallel to <10-10> nor <11-20>. A set of sides inclines at 45 degrees to <10-10> and <11-20>. Another set of sides is parallel to a <11-20> direction. Sizes of a unit pattern are

|  | W(breadth) | H(length) | T(mask width) |
|---|---|---|---|
| Pattern G | 1 mm | 1 mm | 0.05 mm |

These are the values of the mask Υ. A defect accumulating region H is produced on the mask of Υ. Outer square sizes of Y is 0.707 mm×0.707 mm. Inner square sizes of Tis 0.697 mm×0.697 mm. Squares of 0.697 mm×0.697 mm enclosed by the network mask are exposed parts Π. Low defect density single crystal regions Z are born on Π. Sometimes C-plane growth regions are produced at centers of Π.

Figure 14:
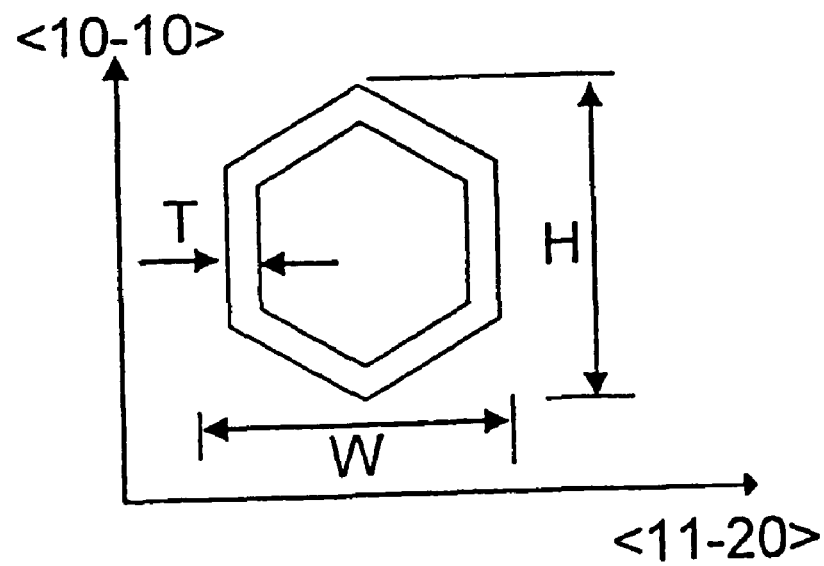
FIG. 14 is a plan view of a part of a regular hexagon network mask (Patterns H and I) formed upon an undersubstrate for making GaN substrates of the present invention. Sides of the hexagon are parallel to the directions <10-10> of the undersubstrate. Repetitions of plenty of regular hexagons without blank space form a network mask, although only one hexagon is depicted in the figure. The definitions of a length H and a breadth W of a unit pattern and a width T of the mask are denoted.

[4. Patterns H, I (Repetitions of Regular Hexagon Unit Pattern; FIG. 14)]

Patterns H and I of mask are repetitions of regular hexagon unit patterns as shown in FIG. 14. Since the unit pattern is a regular hexagon, the size can be represented by a length of a side. Sizes are otherwise defined. H is a diameter of the hexagon. W is a distance between parallel sides. T is a mask width. Sizes of a unit pattern are

|  | W(breadth) | H(length) | T(mask width) |
|---|---|---|---|
| Pattern H | 0.1 mm | 0.09 mm | 0.05 mm |
| Pattern I | 2 mm | 2.3 mm | 0.05 mm |

These are the values of the hexagon mask Υ. A defect accumulating region H of a hexagon network is produced on the mask of Υ. Regular hexagons enclosed by the network mask are exposed parts Π. Low defect density single crystal regions Z are yielded on Π. Sometimes C-plane growth regions Y are produced at the centers of Π. Both Patterns H and I are regular hexagons. Pattern I is about twenty times as large as Pattern H.

Figure 15:
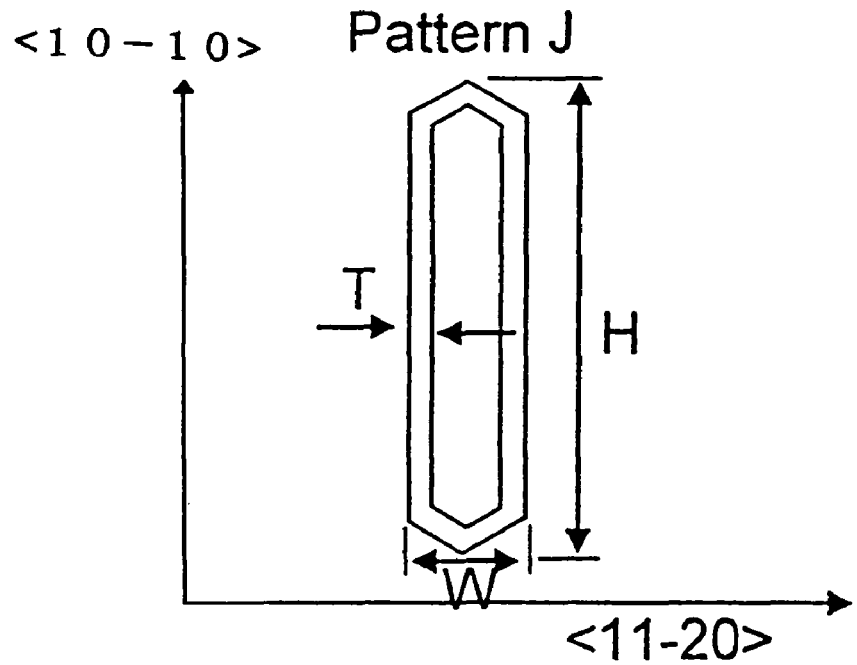
FIG. 15 is a plan view of a part of an elongated hexagon network mask (Pattern J) formed upon an undersubstrate for making GaN substrates of the present invention. Longer sides of the elongated hexagon are parallel to the directions <10-10> of the undersubstrate. Repetitions of plenty of elongated hexagons form a network mask, although only one elongated hexagon is depicted in the figure. The definitions of a length H and a breadth W of a unit pattern and a width T of the mask are denoted.

[5. Patterns J (Repetitions of Elongated Hexagon Unit Pattern; FIG. 15)]

Pattern J of mask is repetitions of an equiangle, elongated hexagon unit pattern as shown in FIG. 15. The unit pattern is an equiangle, elongate hexagon having corner angles of 120 degrees. Four sides are short. Two parallel sides are long. The longer sides are parallel to <10-10> directions. H is the longest diameter. W is the shortest diameter. Sizes of a unit pattern are

|  | W(breadth) | H(length) | T(mask width) |
|---|---|---|---|
| Pattern J | 0.4 mm | 20 mm | 0.05 mm |

These are the values of the elongated hexagon mask ϒ. A defect accumulating region H of a hexagon network is produced on the mask of ϒ. Elongated hexagons enclosed by the network mask are exposed parts Π. Low defect density single crystal regions Z are yielded on Π. Sometimes C-plane growth regions Y are produced at the centers of Π.

GaN crystals are grown on undersubstrates in vapor phase by an MOCVD method or HVPE method. Here GaN growth is mainly relied upon the HVPE method. An HVPE apparatus is composed of a tall hot-wall type furnace, a Ga-boat placed at an upper space and a resistor-heater susceptor placed at a lower space. A material gas of $H_2+HCl$ and another material gas of $H_2+NH_3$ are supplied to the furnace via top inlets. Mask-covering undersubstrates ($SiO_2$/GaN/sapphire) are placed upon the susceptor. The susceptor is heated up to a temperature higher than 1000° C. Metal gallium (Ga) in the Ga-boat is heated to a Ga melt at a temperature higher than 800° C. Supply with $H_2+HCl$ gas to the Ga-melt makes GaCl (gallium chloride) vapor. GaCl vapor flows downward and comes to contact with the heated undersubstrate. Supply with $H_2+NH_3$ gas to GaCl produces GaN. GaN falls on the undersubstrate. A GaN film is deposited on the undersubstrate.

Growth Condition of Pattern A

MOCVD Method undersubstrate temperature=1030° C.

$NH_3$/Ga ratio=2000

Growth time=30 hours

Growth Condition of Pattern B-J

HVPE Method

Ga-melt temperature=800° C.

undersubstrate temperature=1050° C.

$NH_3$ partial pressure=$2.5 \times 10^{-2}$ atm(2.5 kPa)

HCl partial pressure=0.02 atm(2 kPa)

GaN crystals are grown to about a 5 mm thickness of a GaN ingot. GaN wafers are made by slicing the GaN ingot. Here GaN wafers prepared by slicing GaN ingots grown on mask Patterns A to J are called Samples A to J. Names of samples coincide with the names of patterns. EPD (etch pit density) is identified to dislocation density. The EPD shall be obtained by counting the number of etch pits appearing on a crystal surface by observing via a microscope. Mirror-polished wafers have no etch pits. Etching is required for revealing etch pits.

A mixture of phosphoric acid ($H_3PO_4$) and sulfuric acid ($H_2SO_4$) is heated at 240° C. to 280° C. Samples of GaN/undersubstrate are dipped into the heated $H_3PO_4/H_2SO_4$. Etch pits are revealed at dislocations on the GaN surfaces. Etch pit density (EPD) is obtained by counting the number of etch pits appearing in a definite area and dividing the etch pit number by the area. Embodiments count etch pits in a square of 0.1 mm×0.1 mm by a Nomarski differential microscope. The lower limit of countable EPD by the method is 10000/$cm^2$ ($10^4$ $cm^{-2}$). The upper limit of countable EPD by the method is 100000000/$cm^2$ ($10^8$ $cm^{-2}$). Tables 1-1 and 1-2 denote sample symbols A-W, mask shapes, mask sizes, and EPDs at the centers and peripheries measured at discrete growth thicknesses (0.1 mm, 0.5 mm, 1 mm, 2 mm and 5 mm).

Table 1

[Sample A (W=0.35 mm, H=0.4 mm, T=0.002 mm: Pattern A; Equilateral Triangle Network Mask)]

TABLE 1-1

|  |  |  | A | B | C | D | E | F | G | H | I | J |
|---|---|---|---|---|---|---|---|---|---|---|---|---|
|  |  |  | <EMBODIMENT 1> 2 μm – GaN/Sapp $SiO_2$ | | | | | | | | | |
| Shape |  |  | equilateral triangle | | | | | square | | hexagon | | |
| Orientation |  |  | <10-10> | | | | | <10-10> <11-20> | | <10-10> | | |
| Size | W (breadth) |  | 0.35 | 0.35 | 0.9 | 4.4 | 4.4 | 1 | 1 | 0.1 | 2 | 0.4 |
|  | H (length) |  | 0.4 | 0.4 | 1 | 5 | 5 | 1 | 1 | 0.09 | 2.3 | 20 |
|  | T (width) |  | 0.002 | 0.05 | 0.1 | 0.1 | 0.3 | 0.05 | 0.05 | 0.05 | 0.05 | 0.05 |
| Thickness | 0.1 | cen | 1E+07 |  |  |  |  |  |  |  |  |  |
|  |  | per | 1E+06 |  |  |  |  |  |  |  |  |  |
|  |  |  | inv |  |  |  |  |  |  |  |  |  |
|  | 0.5 | cen | 5E+06 | 1E+05 | 1E+06 | 5E+06 | 5E+06 | 2E+06 | 2E+06 | 8E+04 | 5E+06 | 5E+06 |
|  |  | per | 3E+07 | 3E+07 | 3E+07 | 3E+07 | 3E+07 | 3E+07 | 4E+07 | 3E+07 | 4E+07 | 2E+07 |
|  |  |  | dis | inv | inv | inv | pol | inv | dis | inv | inv | inv |
|  | 1 | cen |  | 1E+04 | 1E+05 | 2E+06 | 2E+06 | 5E+05 | 1E+05 | 1E+04 | 2E+06 | 1E+06 |
|  |  | per |  | 1E+06 | 1E+07 | 6E+06 | 1E+07 | 2E+07 | 1E+07 | 5E+05 | 6E+06 | 5E+06 |
|  |  |  |  | inv | inv | inv | pol | inv | dis | inv | inv | inv |
|  | 2 | cen |  | 5E+05 | 1E+04 | 5E+05 | 5E+05 | 1E+06 | 5E+05 | 8E+04 | 1E+04 | 8E+05 |
|  |  | per |  | 1E+07 | 1E+06 | 1E+07 | 1E+07 | 2E+07 | 1E+07 | 1E+07 | 1E+07 | 3E+06 |
|  |  |  |  | dis | inv | inv | pol | dis | dis | dis | dis | inv |

TABLE 1-1-continued

|  | A | B | C | D | E | F | G | H | I | J |
|---|---|---|---|---|---|---|---|---|---|---|
| 5 cen | | 1E+06 | 5E+05 | 5E+04 | 1E+05 | 1E+06 | | 8E+05 | 1E+06 | 1E+06 | 7E+05 |
| per | | 3E+07 | 1E+07 | 5E+06 | 4E+07 | 8E+07 | | 1E+08 | 3E+07 | 1E+07 | 3E+08 |
|  | | dis | dis | inv-dis | inv-dis | pol | dis | dis | dis | dis | inv |
| Growing Condition | MOCVD temp 1030[° C.] NH3/Ga = 2000 G.T = 30 [hour] | HVPE, G.T. 30 [hour] | Ga-Temp: 800 [° C.], temp = 1050 [° C.], EPD is counted in 0.1 mm × 0.1 mm square. Upper limit is 1E8 [cm⁻²]. | | | | NH3 2.5E–2 [atm] | HCl = 0.02 [atm] Lower limit is 1E4 [cm⁻²]. | | | cen = center
inv = inversion layer
dis = disappear
per = periphery
pol = polycrystal
non = non-existence

TABLE 1-2

|  |  | K | L | M | N | O | P | Q | R | S | T | U | V | W |
|---|---|---|---|---|---|---|---|---|---|---|---|---|---|---|
|  |  | | <EMBODIMENT 2> | | | | <EMBODIMENT 3> | | | | ingot <EMBODIMENT 4> | | | |
|  |  | GaAs SiO2 | Si SiO2 | 6h-SiC Si3N4 | Sapp | GaAs | GaN | GaN Pt | GaN W | GaN | GaN | GaN | GaN SiO2 | GaN SiO2 |
| Shape | | | regular hexagon | | | | regular hexagon | | | | regular hexagon | | square | square |
| Orientation | | | | | | | | | | | | | <10-10> | <11-22> |
| Size | W (breadth) | 1 | 1 | 1 | 1 | 1 | 1 | 1 | 1 | 1 | 1 | 1 | 1 | 1 |
|  | H (length) | 1.2 | 1.2 | 1.2 | 1.2 | 1.2 | 1.2 | 1.2 | 1.2 | 1.2 | 1.2 | 1.2 | 1 | 1 |
|  | T (width) | 0.05 | 0.05 | 0.05 | 0.05 | 0.05 | 0.05 | 0.05 | 0.05 | 0.05 | 0.05 | 0.05 | 0.05 | 0.05 |
| Thickness | 0.1 cen per | | | | | | | | | | | | | |
|  | 0.5 cen | 2E+06 | 3E+06 | 2E+06 | 1E+06 | 2E+06 | 2E+06 | 5E+06 | 3E+06 | 1E+06 | 1E+06 | 1E+05 | 2E+07 | 2E+07 |
|  | per | 3E+07 | 4E+07 | 4E+07 | 2E+07 | 3E+07 | 2E+07 | 5E+07 | 3E+07 | 1E+07 | 1E+07 | 1E+07 | 2E+07 | 2E+07 |
|  |  | inv | dis | inv | inv | inv | dis | pol | pol | inv | inv | inv | non | pol |
|  | 1 cen | 1E+05 | 3E+05 | 2E+06 | 1E+05 | 1E+05 | 1E+06 | 5E+05 | 3E+05 | 1E+05 | 1E+05 | 5E+05 | 1E+07 | 1E+06 |
|  | per | 1E+06 | 3E+06 | 2E+06 | 1E+06 | 1E+06 | 2E+06 | 5E+06 | 3E+06 | 1E+06 | 1E+07 | 3E+07 | 1E+07 | 1E+07 |
|  |  | inv | dis | inv | inv | inv | dis | pol | pol | inv | dis | inv | non | pol |
|  | 2 cen | 1E+04 | 3E+04 | 2E+04 | 2E+04 | 1E+04 | 6E+05 | 2E+05 | 2E+05 | 1E+04 | 5E+05 | 2E+05 | 8E+06 | 5E+05 |
|  | per | 1E+07 | 2E+07 | 1E+07 | 1E+07 | 1E+07 | 1E+07 | 2E+06 | 2E+06 | 1E+07 | 2E+07 | 3E+07 | 8E+06 | 1E+07 |
|  |  | dis | dis | dis | dis | dis | dis | pol | pol | dis | dis | dis | non | pol |
|  | 5 cen per | | | | | | | | | | | | | |
| Growing Condition | | Buffer Layer HVPE temp = 490[° C.] HCl = 2.0E–3[atm] t = 50[nm] Epi-layer HVPE temp = 1010[° C.] HCl = 2.5E–2[atm] | Ga-temp = 800[° C.] NH3 = 0.2[atm] G.T. = 15[min] Ga-temp = 800[° C.] NH3 = 0.2[atm] G.T. = 11[hour] | | | | Buffer Layer HVPE temp = 490[° C.] HCl = 2.0E–3[atm] t = 50[nm] Epi-layer HVPE temp = 1010[° C.] HCl = 2.5E–2[atm] | GA-temp = 800[° C.] NH3 = 0.2[atm] GA-temp = 800[° C.] NH3 = 0.2[atm] G.T. = 11 [hour] | | | Epi-layer HVPE temp = 1050 [° C.] Al-contain | In-contain | GA-temp = 800 [° C.] NH3 = 0.2[atm] different orientation | different orientation | cen = center
inv = inversion layer
dis = disappear
per = perhiphery
pol = polycrystal
non = non-existence An undersubstrate is a sapphire plate templated with a 2 μm thick GaN film. GaN-templated sapphire undersubstrate is commonly used for Samples A-J. Pattern A mask (SiO₂) of an equilateral triangle network is formed on a 2 μm (0.002 mm) GaN-templated sapphire undersubstrate (FIG. 11). GaN is grown on a Pattern A formed on the GaN/sapphire undersubstrate by the HVPE method. No occurrence of defect accumulation regions on T is confirmed. The reason why defect accumulating regions are not formed is that the mask width T=0.002 mm is too narrow. The HVPE method features high speed growth. Crystals grow so fast that the growing GaN crystals cover and bury the narrow network mask. A 2 μm wide mask is unable to make defect accumulating regions in the case of the high speed HVPE method. This fact means that the crystal growing speed should be moderately low for making defect accumulating regions H on the covered parts T with narrow widths T. Therefore GaN crystal is grown on the Pattern A by a MOCVD method enjoying a lower growing speed for examining the probability of making defect accumulating regions H. As listed up in Table 1-1, column of Sample A, the slow growth MOCVD enables the narrow masked (T=0.002 mm) Pattern A to produce defect accumulating regions H on the covered parts T.

When the thickness of a GaN film is 0.1 mm, the defect accumulating regions H are orientation-inversion layers (orientation is inverse to other regions Z and Y). EPDs are $1\times10^7$ cm$^{-2}$ at the center and $1\times10^6$ cm$^{-2}$ at the periphery of the exposed part Π (Z+Y). The dislocation reduction effect on Π is caused by the defect accumulating regions H on T.

When the thickness of a GaN film is 0.5 mm, the defect accumulating regions H disappear. EPDs decrease to $5\times10^6$ cm$^{-2}$ at the center and $3\times10^7$ cm$^{-2}$ at the periphery of the exposed part Π. The dislocations are more increased at the periphery of the exposed part Π. The dislocations which have once been assembled are released and dispersed. The increment of dislocations is caused by the extinction of the defect accumulating regions H. Too narrow H prepared by too narrow (T=2 μm) masked parts T are buried by the growing GaN crystals.

[Sample B (W=0.35 mm, H=0.4 mm, T=0.05 mm: Pattern B; Equilateral Triangle Network Mask)]

Pattern B mask (SiO$_2$) of an equilateral triangle network is formed on a 2 μm GaN-templated sapphire undersubstrate (FIG. 11). GaN is grown on a Pattern B formed on the GaN-templated sapphire undersubstrate by the HVPE method. Defect accumulation regions H appear on T. A mask (T=0.05 mm) wider than Pattern A in width enables Pattern B to make sturdy defect accumulating regions H. EPD is not counted at a 0.1 mm thickness, because the HVPE grows GaN too fast.

When the thickness of a GaN film is 0.5 mm, the defect accumulating regions H are orientation-inversion layers. EPDs are $1\times10^5$ cm$^{-2}$ at the center and $3\times10^7$ cm$^{-2}$ at the periphery of the exposed part Π (Z+Y). The dislocation reduction effect by the defect accumulating regions H is effective, in particular, at the centers on Π.

When the thickness of a GaN film is 1 mm, the defect accumulating regions H are still orientation-inversion layers. EPDs decrease to $1\times10^4$ cm$^{-2}$ at the center and $1\times10^6$ cm$^{-2}$ at the periphery of Π. Dislocations are still more decreased. EPD=$1\times10^4$ cm$^{-2}$ at the center of Π shows an excellent effect of the defect accumulating regions H. Such a low dislocation density has never been realized except the present invention.

When the thickness of a GaN film is 2 mm, the defect accumulating regions disappear. EPDs increase to $5\times10^5$ cm$^{-2}$ at the center and $1\times10^7$ cm$^{-2}$ at the periphery of Π. Extinction of the defect accumulating regions H increases dislocations.

When the thickness of a GaN film is 5 mm, there is no defect accumulating region H. EPDs increase to $1\times10^6$ cm$^{-2}$ at the center and $3\times10^7$ cm$^{-2}$ at the periphery of Π. Extinction of the defect accumulating regions H further increases dislocations.

[Sample C (W=0.9 mm, H=1 mm, T=0.1 mm: Pattern C; Equilateral Triangle Network Mask)]

Pattern C mask (SiO$_2$) of an equilateral triangle network is formed on a GaN-templated sapphire undersubstrate (FIG. 11). GaN is grown on a Pattern C formed on the GaN-templated sapphire undersubstrate by the HVPE method. Defect accumulation regions H appear on T. The dislocation reduction effect of the defect accumulating regions H survives till the GaN crystal grows to a 2 mm thickness. This is because Sample C mask (T=0.1 mm) is wider than Sample B mask (T=0.05 mm).

When the thickness of a GaN film is 0.5 mm, the defect accumulating regions H are orientation-inversion layers. EPDs are $1\times10^6$ cm$^{-2}$ at the center and $3\times10^7$ cm$^{-2}$ at the periphery of the exposed part Π (Z+Y). The dislocation reduction effect by the defect accumulating regions H is effective, in particular, at the centers on Π.

When the thickness of a GaN film is 1 mm, the defect accumulating regions H are still orientation-inversion layers. EPDs decrease to $1\times10^5$ cm$^{-2}$ at the center and $1\times10^7$ cm$^{-2}$ at the periphery of Π. Dislocations on Π are further decreased. The defect accumulating regions H being orientation-inversion layers are effective in reducing dislocations.

When the thickness of the GaN film is 2 mm, the defect accumulating regions H survive and are still orientation-inversion layers. EPDs further decrease to $1\times10^4$ cm$^{-2}$ at the center and $1\times10^6$ cm$^{-2}$ at the periphery of Π. Polarity-inversion defect accumulating regions H powerfully decreases dislocations on Π. $1\times10^4$ cm$^{-2}$ of EPD, which has been unattainable low dislocation density, has been first realized by the present invention.

When the thickness of a GaN film is 5 mm, defect accumulating regions H partially die away and partially survive. EPDs increase to $5\times10^5$ cm$^{-2}$ at the center and $1\times10^7$ cm$^{-2}$ at the periphery of Π. Half-extinction of the defect accumulating regions H increases dislocations on Π.

[Sample D (W=4.4 mm, H=5 mm, T=0.1 mm: Pattern D; Equilateral Triangle Network Mask)]

Pattern D mask (SiO$_2$) of an equilateral triangle network is formed on a GaN-templated sapphire undersubstrate (FIG. 11). GaN is grown on a Pattern D formed on the GaN-templated sapphire undersubstrate by the HVPE method. Defect accumulation regions H appear on T. The dislocation reduction effect of the defect accumulating regions H survives till the GaN crystal grows to a 5 mm thickness. This is because the exposed parts Π of Sample D mask (H=5 mm, W=4.4 mm) are wider than Π of Sample B and C masks.

When the thickness of a GaN film is 0.5 mm, the defect accumulating regions H are orientation-inversion layers. EPDs are $5\times10^6$ cm$^{-2}$ at the center and $3\times10^7$ cm$^{-2}$ at the periphery of the exposed part Π.

When the thickness of the GaN film is 1 mm, the defect accumulating regions H are still orientation-inversion layers. EPDs decrease to $2\times10^6$ cm$^{-2}$ at the center and $6\times10^6$ cm$^{-2}$ at the periphery of Π. Dislocations on Π are further decreased owing to the orientation-inversion defect accumulating regions H.

When the thickness of a GaN film is 2 mm, the defect accumulating regions H survive and are still orientation-inversion layers. EPDs further decrease to $5\times10^5$ cm$^{-2}$ at the center and $1\times10^7$ cm$^{-2}$ at the periphery of Π. The surviving defect accumulating regions H powerfully decrease dislocations on Π.

When the thickness of a GaN film is 5 mm, defect accumulating regions H partially die away and partially survive. EPDs increase to $5\times10^4$ cm$^{-2}$ at the center and $5\times10^6$ cm$^{-2}$ at the periphery of Π. The defect accumulating regions H still decrease dislocations on Π.

Comparison of Sample C with Sample D teaches us that a larger network pattern delays occurrence of the dislocation reduction effect later but prolongs the dislocation reduction effect against an increasing thickness. A wider network mask retards growth of facets from sweeping dislocations out of the exposed parts Π to the mask T. However, large-size of the unit patterns endows defect accumulating regions H with a sufficient width and prolongs the life of the defect accumulating regions H against the increment of GaN film. Enlargement of the network patterns is effective for making thick, low dislocation density GaN crystals.

[Sample E (W=4.4 mm, H=5 mm, T=0.3 mm: Pattern E; Equilateral Triangle Network Mask)]

Pattern E mask ($SiO_2$) of an equilateral triangle network is formed on a GaN-templated sapphire undersubstrate (FIG. 11). GaN is grown on a Pattern E formed on the GaN-templated sapphire undersubstrate by the HVPE method. Defect accumulation regions H appear on Υ. The dislocation reduction effect of the defect accumulating regions H survives till the GaN crystal grows to a 5 mm thickness. The defect accumulating regions H are not orientation-inversion layers but polycrystals. It is supposed that this is because Sample E mask (T=0.3 mm) is wider than Samples B, C and D.

When the thickness of a GaN film is 0.5 mm, the defect accumulating regions H are polycrystalline layers. EPDs are $5\times10^6$ cm$^{-2}$ at the center and $3\times10^7$ cm$^{-2}$ at the periphery of the exposed part Π (Z+Y). With regard to the dislocation reduction effect by the defect accumulating regions H, polycrystalline Hs are as effective as orientation-inversion Hs.

When the thickness of a GaN film is 1 mm, the defect accumulating regions H are polycrystalline layers. EPDs decrease to $2\times10^6$ cm$^{-2}$ at the center and $1\times10^7$ cm$^{-2}$ at the periphery of Π. Dislocations on Π are further decreased.

When the thickness of a GaN film is 2 mm, the defect accumulating regions H are still polycrystals. EPDs are $5\times10^5$ cm$^{-2}$ at the center and $1\times10^7$ cm$^{-2}$ at the periphery of Π. Polycrystalline defect accumulating regions H decrease dislocations on Π.

When the thickness of a GaN film is 5 mm, defect accumulating regions H survive and are polycrystals. EPDs decrease to $1\times10^5$ cm$^{-2}$ at the center and $4\times10^7$ cm$^{-2}$ at the periphery of Π. The defect accumulating regions H keep the dislocation decrement effect. In Samples C, D and E, on-Π dislocations, EPDs are less than $10^6$ cm$^{-2}$. EPDs at the centers of Π decrease to $10^6$ cm$^{-2}$ to $10^6$ cm$^{-2}$.

[Sample F (W=1 mm, H=1 mm, T=0.05 mm: Pattern F; Square Network Mask)]

Pattern F mask ($SiO_2$) of a square network is formed on a GaN-templated sapphire undersubstrate (FIG. 12). Sides of the basic square are parallel to <10-10> direction and <11-20> direction as shown in FIG. 12. A GaN film is grown on the network masked undersubstrate by the HVPE method. The defect accumulating regions H are partially polarity-inversion crystals and partially vanished till a 1 mm film thickness. When the film thickness exceeds 2 mm, the defect accumulating regions H disappear. The defect decreasing effect is also extinguished. Then the dislocations increase with an increment of the film thickness.

When the thickness of a GaN film is 0.5 mm, the defect accumulating regions H parallel to <10-10> become orientation-inversion layers and the defect accumulating regions H parallel to <11-20> disappear. EPDs are $2\times10^6$ cm$^{-2}$ at the center and $3\times10^7$ cm$^{-2}$ at the periphery of the exposed part Π. The dislocation reduction effect is caused by the defect accumulating regions H partially existing.

When the thickness of a GaN film is 1 mm, the defect accumulating regions H parallel to <10-10> survive as orientation-inversion layers and the defect accumulating regions H parallel to <11-20> do not appear.

EPDs decrease to $5\times10^5$ cm$^{-2}$ at the center and $2\times10^7$ cm$^{-2}$ at the periphery of the exposed part Π. The dislocations are more reduced than the former. This is dislocation reduction effect of the surviving orientation-inversion defect accumulating regions H.

When the thickness of a GaN film is 2 mm, the defect accumulating regions H extinguish. EPDs rise to $1\times10^6$ cm$^{-2}$ at the center and $2\times10^7$ cm$^{-2}$ at the periphery of the exposed part Π. The dislocations are rather increased. This is an effect of the extinction of the defect accumulating regions H.

When the thickness of a GaN film is 5 mm, there is no defect accumulating region H. EPDs further rise to $1\times10^6$ cm$^{-2}$ at the center and $8\times10^7$ m$^{-2}$ at the periphery of the exposed part Π. The dislocations are increased, because the defect accumulating regions H vanish away.

Comparison of Samples C, D, E and F implies that equilateral triangles are more suitable for a basic shape of exposed parts Π than squares. Even the square network is enough to reduce the EPD to less than $10^6$ cm$^{-2}$ at centers of Π.

[Sample G (W=1 mm, H=1 mm, T=0.05 mm: Pattern F; Square Network Mask)]

Pattern F mask ($SiO_2$) of a square network is formed on a GaN-templated sapphire undersubstrate. Sides of the basic square incline at 45 degrees to <10-10> direction and <11-20> direction as shown in FIG. 13. A GaN film is grown on the network masked undersubstrate by the HVPE method. The defect accumulating regions H are polarity-inversion crystals which are effective in reducing dislocations till a 1 mm film thickness. When the film thickness exceeds 2 mm, the defect accumulating regions H vanish. The defect decreasing effect is also extinguished. Then the dislocations increase with an increment of the film thickness.

When the thickness of a GaN film is 0.5 mm, the defect accumulating regions H inclining at 45 degrees to <10-10> and <11-20> become orientation-inversion layers. EPDs are $2\times10^6$ cm$^{-2}$ at the center and $4\times10^7$ cm$^{-2}$ at the periphery of the exposed part Π.

When the thickness of a GaN film is 1 mm, the defect accumulating regions H inclining at 45 degrees to <10-10> and <11-20> are orientation-inversion layers. EPDs decrease to $1\times10^5$ cm$^{-2}$ at the center and $1\times10^7$ cm$^{-2}$ at the periphery of the exposed part Π. The dislocations are reduced. This is dislocation reduction effect of the orientation-inversion defect accumulating regions H.

When the thickness of a GaN film is 2 mm, the defect accumulating regions H extinguish. EPDs rise to $5\times10^5$ cm$^{-2}$ at the center and $1\times10^7$ cm$^{-2}$ at the periphery of the exposed part Π. The dislocations are slightly increased. This is an effect of the extinction of the defect accumulating regions H.

When the thickness of a GaN film is 5 mm, there is no defect accumulating region H. EPDs further rise to $8\times10^5$ cm$^{-2}$ at the center and $1\times10^8$ cm$^{-2}$ at the periphery of the exposed part Π. The dislocations are more increased than the former, because the defect accumulating regions H vanish away.

Comparison of Samples F and G teaches us that the square mask with sides not parallel to <10-10> and <11-20> is preferable to the square mask with sides parallel with <10-10> and <11-20> for decreasing dislocations and prolonging the life of defect accumulating regions H. <11-20> direction extending defect accumulating regions, in particular, have a stronger tendency to disappear. The reason is not clear now.

[Sample H (W=0.1, H=0.09 mm, T=0.05 mm: Pattern H; Regular hexagon Network Mask)]

Pattern H mask ($SiO_2$) of a hexagon network is formed on a GaN-templated sapphire undersubstrate (FIG. 14). A GaN film is grown on the network masked undersubstrate by the HVPE method. The defect accumulating regions H are polarity-inversion crystals which are effective in reducing dislocations till a 1 mm film thickness. When the film thickness exceeds 2 mm, the defect accumulating regions H vanish. Then the dislocations increase with an increment of the film thickness.

When the thickness of a GaN film is 0.5 mm, the defect accumulating regions H are orientation-inversion layers. EPDs are $8\times10^4$ cm$^{-2}$ at the center, which is rarely low density for 0.5 mm thick films, and $3\times10^7$ cm$^{-2}$ at the periphery of the exposed part Π.

When the thickness of a GaN film is 1 mm, the defect accumulating regions H are orientation-inversion layers. EPDs decrease to $1\times10^4$ cm$^{-2}$ at the center, which is distinguished low density and $5\times10^5$ cm$^{-2}$ at the periphery of the exposed part Π. The dislocations are moreover reduced. This is dislocation reduction effect of the orientation-inversion defect accumulating regions H.

When the thickness of a GaN film is 2 mm, the defect accumulating regions H disappear. EPDs rise to $8\times10^4$ cm$^{-2}$ at the center and $1\times10^7$ cm$^{-2}$ at the periphery of the exposed part Π. The dislocations are increased to a level similar to the 0.5 mm thickness. This is an effect of the extinction of the defect accumulating regions H.

When the thickness of a GaN film is 5 mm, there is no defect accumulating region H. EPDs further rise to $1\times10^6$ cm$^{-2}$ at the center and $3\times10^7$ cm$^{-2}$ at the periphery of the exposed part Π. Disappearance of the defect accumulating regions H increases dislocations.

Results of Samples C, D, E, F, G and H imply that equilateral triangles are preferable to squares, and regular hexagons are preferable to equilateral triangles as polygons building a network of masks. The hexagon network mask enables the HVPE grown GaN crystal to reduce dislocations down to $1\times10^4$ cm$^{-2}$.

[Sample I (W=2 mm, H=2.3 mm, T=0.05 mm: Pattern I; Regular hexagon Network Mask)]

Pattern I mask (SiO$_2$) of a hexagon network is formed on a GaN-templated sapphire undersubstrate (FIG. 14). A GaN film is grown on the network masked undersubstrate by the HVPE method. The defect accumulating regions H are polarity-inversion crystals which are effective in reducing dislocations till a 1 mm film thickness. When the film thickness exceeds 2 mm, the defect accumulating regions disappear. Then the dislocations increase with an increment of the film thickness.

When the thickness of a GaN film is 0.5 mm, the defect accumulating regions H are orientation-inversion layers. EPDs are $5\times10^6$ cm$^{-2}$ at the center and $4\times10^7$ cm$^{-2}$ at the periphery of the exposed part Π.

When the thickness of a GaN film is 1 mm, the defect accumulating regions H are orientation-inversion layers. EPDs decrease to $2\times10^6$ cm$^{-2}$ at the center and $6\times10^6$ cm$^{-2}$ at the periphery of the exposed part Π. The dislocations are reduced. This is dislocation reduction effect of the orientation-inversion defect accumulating regions H.

When the thickness of a GaN film is 2 mm, the defect accumulating regions H disappear. EPDs rise to $1\times10^4$ cm$^{-2}$ at the center and $1\times10^7$ cm$^{-2}$ at the periphery of the exposed part Π. Dislocations decrease after the extinction of the defect accumulating regions H.

When the thickness of a GaN film is 5 mm, there is no defect accumulating region H. EPDs further rise to $1\times10^6$ cm$^{-2}$ at the center and $1\times10^7$ cm$^{-2}$ at the periphery of the exposed part Π. Disappearance of the defect accumulating regions H increases dislocations.

[Sample J (W=0.4 mm, H=20 mm, T=0.05 mm: Pattern J; Elongated hexagon Network Mask)]

Pattern J mask (SiO$_2$) of an elongated hexagon network is formed on a GaN-templated sapphire undersubstrate (FIG. 15). A GaN film is grown on the network masked undersubstrate by the HVPE method. The longer/shorter ratio is L2/L1=50. The defect accumulating regions H are polarity-inversion crystals which are effective in reducing dislocations till a 5 mm film thickness.

When the thickness of a GaN film is 0.5 mm, the defect accumulating regions H are orientation-inversion layers. EPDs are $5\times10^6$ cm$^{-2}$ at the center and $2\times10^7$ cm$^{-2}$ at the periphery of Π.

When the thickness of a GaN film is 1 mm, the defect accumulating regions H are orientation-inversion layers. EPDs decrease to $1\times10^6$ cm$^{-2}$ at the center and $5\times10^6$ cm$^{-2}$ at the periphery of Π. The dislocations are reduced. This is dislocation reduction effect of the orientation-inversion defect accumulating regions H.

When the thickness of a GaN film is 2 mm, the defect accumulating regions H are orientation-inversion. EPDs rise to $8\times10^5$ cm$^{-2}$ at the center and $3\times10^6$ cm$^{-2}$ at the periphery of the exposed part Π. Dislocations decrease due to the defect accumulating regions H.

When the thickness of a GaN film is 5 mm, the defect accumulating regions H are orientation-inversion. EPDs decrease to $7\times10^5$ cm$^{-2}$ at the center and $3\times10^6$ cm$^{-2}$ at the periphery of the exposed part Π. Defect accumulating regions H decrease dislocations.

Comparison of Samples H, I and J indicates that a larger mask pattern size allows defect accumulating regions H to survive till the GaN film grows thicker and to maintain the defect decrement effect longer.

A narrower mask width T makes a narrower defect accumulating region H. The progress of GaN growth slenderizes defect accumulating regions H. A further GaN growth extinguishes defect accumulating regions H.

"Disappear" or "dis" on Tables 1-1 and 1-2 means that the defect accumulating regions H as planar defects vanish. When the defect accumulating regions H are extinguished, facets still attract and accommodate dislocations in the regions above the mask T. However, without the planar defects, once attracted dislocations are released again. Formation and maintenance of the defect accumulating regions H as planar defects are essential to permanent decrement of dislocations.

Alignment of the mask T in parallel to a <10-10> direction is proper for generating defect accumulating regions H as planar defects. Samples F and G based upon Square network patterns F and G in FIG. 12 and FIG. 13 confirm that <10-10>-extending defect accumulating regions H become planar defects.

Fluctuation from a <10-10> direction within ±15 degrees allows masks to form defect accumulating regions H as planar defects.

In the case of hexagonal network masks, regular hexagon masks are subject to fluctuation of the widths of defect accumulating regions H contingent upon GaN growth thickness. Elongated hexagon mask pattern (FIG. 15) with a high L2/L1 ratio obtains an immunity from the fluctuation of the widths of defect accumulating regions H induced by the GaN growth.

Embodiment 2

GaAs, Si, Sapphire, SiC Undersubstrates; Samples K-N

Instead of the GaN-templated sapphire undersubstrates employed in Embodiment 1, Embodiment 2 makes use of undersubstrates made of GaAs(111)A (Sample K), Si (Sample L), SiC (Sample M) and sapphire (Sample N). Network masks are made on a variety of undersubstrates. GaN films are grown on the network masked undersubstrates. Properties of the defect accumulating regions H yielded on the masked undersubstrates are examined.

Here, there are four kinds of $SiO_2$ mask patterns, K, L, M, and N. Every $SiO_2$ mask pattern is produced by piling a $SiO_2$ layer with a thickness of 100 nm on an undersubstrate, and making a pattern by ordinary photolithography and etching. All of the mask patterns are the same regular hexagon.

|  | W(mm) | H(mm) | T(mm) |
|---|---|---|---|
| Pattern K (GaAs undersubstrate) | 1 | 1.2 | 0.05 |
| Pattern L (Si undersubstrate) | 1 | 1.2 | 0.05 |
| Pattern M (6h-SiC undersubstrate) | 1 | 1.2 | 0.05 |
| Pattern N (sapphire undersubstrate) | 1 | 1.2 | 0.05 |

A GaN film is grown on each undersubstrate by the HVPE method. The GaN film is composed of two layers, one is a layer piled at a low temperature (buffer layer) and the other is a layer piled at a high temperature (epitaxial layer).

(A. Formation of a GaN Low Temperature Deposition Layer)

Low Temperature HVPE Method (for Buffer Layer)

| | |
|---|---|
| Ga-melt temperature: | 800° C. |
| undersubstrate temperature: | 490° C. |
| $NH_3$ partial pressure: | 0.2 atm (20 kPa) |
| HCl partial pressure: | $2.0 \times 10^{-3}$ atm (200 Pa) |
| Growth time: | 15 minutes |
| Growth thickness: | 50 nm |

(B. Formation of a GaN High Temperature Deposition Layer)

High Temperature HVPE Method (for Epitaxial Growth)

| | |
|---|---|
| Ga-melt temperature: | 800° C. |
| undersubstrate temperature: | 1010° C. |
| $NH_3$ partial pressure: | 0.2 atm (20 kPa) |
| HCl partial pressure: | $2.5 \times 10^{-2}$ atm (2.5 kPa) |
| Growth time: | 11 hours |

All the undersubstrates (GaAs, sapphire, SiC and Si) can make defect accumulating regions H. It is confirmed that GaAs(111)A, sapphire and SiC undersubstrates enable the masks to make the defect accumulating regions H having planar defects on the mask covered parts T.

The Si mask fails to make the defect accumulating regions H having planar defects. Si reacts with Ga in GaAs. The reaction impedes the Si mask from making clear growth boundaries.

Figure 16:
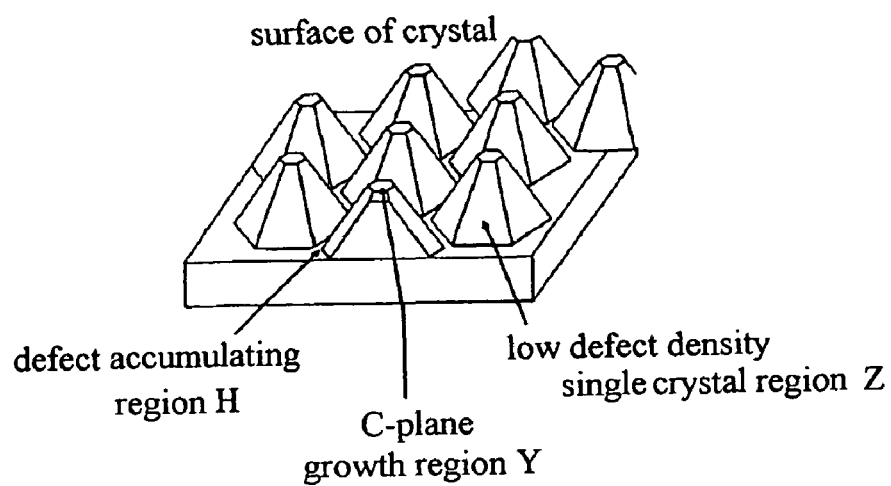
FIG. 16 is an perspective view of a multifaceted GaN crystal produced by making a regular hexagon network mask on an undersubstrate, growing GaN in vapor phase on the masked undersubstrate and forming convex facet hills composed of facets Φ on exposed parts Π. Low defect density single crystal regions Z are produced below the facets Φ on the exposed parts Π. C-plane growth regions Y, which are also low defect single crystals, appear on the top of the facet hills. Defect accumulating regions H are yielded at hexagonal network valleys on the masked parts Τ.

FIG. 16 demonstrates a gallium nitride crystal grown on the GaAs(111)A mask. Defect accumulating regions H are made on the hexagon network mask T. Hexagon cone GaN crystals are grown on Π enclosed by the defect accumulating regions H. Small horizontal flats remain on the tops of the hexagon cones. Inclination walls of the hexagon cones are facets. The parts covered with the facets are low defect density single crystal regions Z. The flat tops are C-plane growth regions Y. In reality, a very rugged convex/concave surfaced crystal is obtained by the network facet growth method. The inclination angles are predetermined. Hexagon cones occupying the exposed parts Π have high peaks. High peak protrusions are out of use for semiconductor wafers. The rugged crystal shall be sliced at heights below the surface of the defect accumulating regions H. As-cut wafers are obtained by slicing the rugged crystal in the horizontal direction below the surface of the network defect accumulating regions H. Smooth-surfaced mirror wafers are also made by polishing both surfaces.

Figure 17:
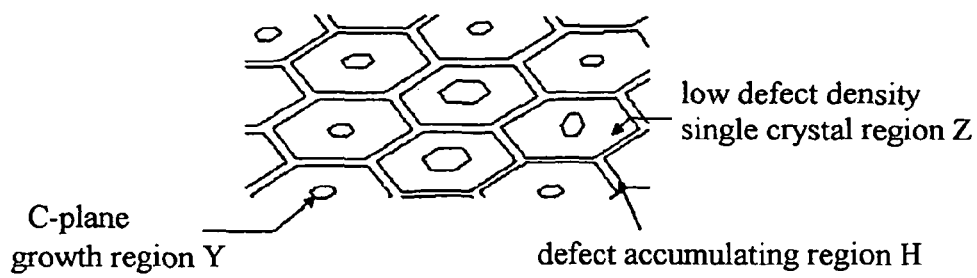
FIG. 17 is an oblique cathode luminescenced view of a mirror-polished GaN crystal produced by making a regular hexagonal mask on an undersubstrate, growing GaN in vapor phase on the masked undersubstrate, making hexagonal low defect density single crystal regions Z on exposed parts Π, producing defect accumulating regions H on the masked network, forming a multifaceted crystal, slicing the rugged crystal into as-cut wafers and polishing the surfaces into mirror flats.

FIG. 17 is a slanting view of a mirror polished wafer. A plurality of regular hexagonal low defect density single crystal regions Z align lengthwise and crosswise. Zs are single crystals with low dislocation density and high quality. A network defect accumulating region H fills the gap of the low dislocation density single crystal regions Z. C-plane growth regions Y exist at the centers of Zs. The C-plane regions take a variety of shapes and sizes. Human eyesight cannot observe such an inner structure. Cathode luminescence (CL) clarified the inner structure.

[Sample K (GaAs; W=1 mm, H=1.2 mm, T=0.05 mm: Pattern K; Regular hexagon Network Mask)]

Samples K-N employ the same regular hexagon pattern of W=1 mm, H=1.2 mm and T=0.5 mm, as indicated in FIG. 14. Samples K, L, M and N employ different undersubstrates of GaAs, Si, 6h-SiC and sapphire respectively. Pattern K mask ($SiO_2$) of a regular hexagon network is formed on a GaAs (111)A-plane undersubstrate (FIG. 14). A-plane denotes a Ga-plane, on which Ga atoms appear overall. A GaN film is grown on the network masked undersubstrate by the HVPE method. The defect accumulating regions H are polarity-inversion crystals which are effective in reducing dislocations till a 1 mm film thickness. As the film thickness exceeds 1 mm, the defect accumulating regions H vanish. After the extinction, the effect of reducing dislocations is maintained at the centers of Π.

When the thickness of a GaN film is 0.5 mm, the defect accumulating regions H are orientation-inversion layers. EPDs are $2 \times 10^6$ cm$^{-2}$ at the center and $3 \times 10^7$ cm$^{-2}$ at the periphery of Π. Dislocation reduction is caused by the orientation-inversion defect accumulating regions H.

When the thickness of a GaN film is 1 mm, the defect accumulating regions H are orientation-inversion layers. EPDs decrease to $1 \times 10^5$ cm$^{-2}$ at the center and $1 \times 10^6$ cm$^{-2}$ at the periphery of Π. The dislocations are further reduced by the defect accumulating regions H.

When the thickness of a GaN film is 2 mm, the defect accumulating regions H vanish. EPDs are $1 \times 10^4$ cm$^{-2}$ at the center and $1 \times 10^7$ cm$^{-2}$ at the periphery of Π.

The GaN growth is ended at a GaN thickness of 2 mm, because the defect accumulating regions H vanish. Comparison of Sample K with Sample I suggests that GaAs undersubstrates are more effective than GaN/sapphire undersubstrates in reducing dislocations (EPDs).

[Sample L (Si; W=1 mm, H=1.2 mm, T=0.05 mm: Pattern L; Regular hexagon Network Mask)]

Samples L employs a Si undersubstrate. Sample L forms a network Pattern L of a regular hexagon unit pattern of W=1 mm, H=1.2 mm and T=0.05 mm on the Si undersubstrate, as indicated in FIG. 14. A GaN film is grown on the network masked undersubstrate by the HVPE method. No defect accumulating region H appears on the covered parts T from the beginning. Sample L has an weak effect of reducing dislocations due to facets. Si is unfavorable to undersubstrates, because Si undersubstrates cannot generate defect accumulating regions from the beginning.

When the thickness of a GaN film is 0.5 mm, no defect accumulating region H appears. There are neither polycrystals nor orientation-inversion single crystal on the masked parts T. Crystal on T is a single crystal having the same orientation as the surrounding crystals (Z or Y). There are facets on Π. The facets have a function of sweeping dislocations out. EPDs are $3 \times 10^6$ cm$^{-2}$ at the center and $4 \times 10^7$ cm$^{-2}$ at the periphery of Π. Dislocation reduction is caused by the facets instead of the defect accumulating regions H.

When the thickness of a GaN film is 1 mm, no defect accumulating region H exists. EPDs are $3 \times 10^5$ cm$^{-2}$ at the center and $3 \times 10^6$ cm$^{-2}$ at the periphery of Π.

When the thickness of a GaN film is 2 mm, no defect accumulating region H exists. EPDs are $3 \times 10^4$ cm$^{-2}$ at the center and $2 \times 10^7$ cm$^{-2}$ at the periphery of Π.

[Sample M (6h-SiC; W=1 mm, H=1.2 mm, T=0.05 mm: Pattern L; Regular Hexagon Network Mask)]

Samples M employs a 6h-SiC undersubstrate. Sample M forms a network mask (SiO$_2$) of a regular hexagon unit pattern of W=1 mm, H=1.2 mm and T=0.05 mm on the 6h-SiC undersubstrate, as indicated in FIG. 14. "6h-" means hexagonal system. A GaN film is grown on the network masked undersubstrate by the HVPE method. Defect accumulating regions H of orientation-inversion appear on the covered parts T from the beginning and survive till a 1 mm thickness but disappear at a 2 mm thickness. Dislocations at centers on exposed parts Π keep reducing till a 2 mm thickness due to the delayed effect of the defect accumulating regions H. It is confirmed that 6h-SiC undersubstrate enables the mask to produce the defect accumulating regions H. SiC has an intermediate undersubstrate-preference less than GaAs but more than Si.

When the thickness of a GaN film is 0.5 mm, defect accumulating regions H are orientation-inversion layers yielded on the mask part T. EPDs are $2 \times 10^6$ cm$^{-2}$ at the center and $4 \times 10^7$ cm$^{-2}$ at the periphery of Π. Dislocation reduction is caused by the orientation-inversion defect accumulating regions H.

When the thickness of a GaN film is 1 mm, defect accumulating regions H are still orientation-inversion. EPDs are $2 \times 10^5$ cm$^{-2}$ at the center and $2 \times 10^6$ cm$^{-2}$ at the periphery of Π.

When the thickness of a GaN film is 2 mm, no defect accumulating region H exists. EPDs are $2 \times 10^4$ cm$^{-2}$ at the center and $1 \times 10^7$ cm$^{-2}$ at the periphery of Π.

[Sample N (Sapphire; W=1 mm, H=1.2 mm, T=0.5 mm: Pattern L; Regular Hexagon Network Mask)]

Samples N employs a sapphire (α-Al$_2$O$_3$) undersubstrate. Samples A to J employ GaN templated sapphire (GaN/sapphire) as undersubstrates. Sample N adopts a pure sapphire (0001) undersubstrate. Sample N forms a network mask (SiO$_2$) of a regular hexagon unit pattern of W=1 mm, H=1.2 mm and T=0.5 mm on the sapphire undersubstrate, as indicated in FIG. 14. A GaN film is grown on the network masked undersubstrate by the HVPE method. Defect accumulating regions H appear on the covered parts T from the beginning and survive till a 1 mm thickness but disappear at a 2 mm thickness. Dislocations at the centers on exposed parts Π keep reducing till a 2 mm thickness due to the delayed effect of the defect accumulating regions H. It is confirmed that sapphire undersubstrate enables the mask to produce the defect accumulating regions H. Sapphire seems to have an undersubstrate-preference better than GaAs, SiC and Si.

When the thickness of a GaN film is 0.5 mm, defect accumulating regions H are orientation-inversion layers yielded on the mask part T. EPDs are $1 \times 10^6$ cm$^{-2}$ at the center and $2 \times 10^7$ cm$^{-2}$ at the periphery of Π. Dislocation reduction is caused by the orientation-inversion defect accumulating regions H.

When the thickness of a GaN film is 1 mm, defect accumulating regions H are still orientation-inversion. EPDs are $1 \times 10^5$ cm$^{-2}$ at the center and $1 \times 10^6$ cm$^{-2}$ at the periphery of Π.

When the thickness of a GaN film is 2 mm, no defect accumulating region H exists. EPDs are $2 \times 10^4$ cm$^{-2}$ at the center and $1 \times 10^7$ cm$^{-2}$ at the periphery of Π.

Comparison of Samples K to N indicates that the degree of undersubstrate-preference should be an order of sapphire, GaAs, SiC and Si.

Crystallographic properties of Sample K wafer are examined by the X-ray diffraction method. Cu—Kα1 (λ=0.154056 nm) is the X-ray source. Spectrics X' pert-MRD is an X-ray diffraction apparatus. An effective area of X-rays irradiated on the sample is determined to be less than 0.25 mm$^2$ by adjusting a slit aperture. X-ray diffraction power at (004) planes is measured.

Figure 18:
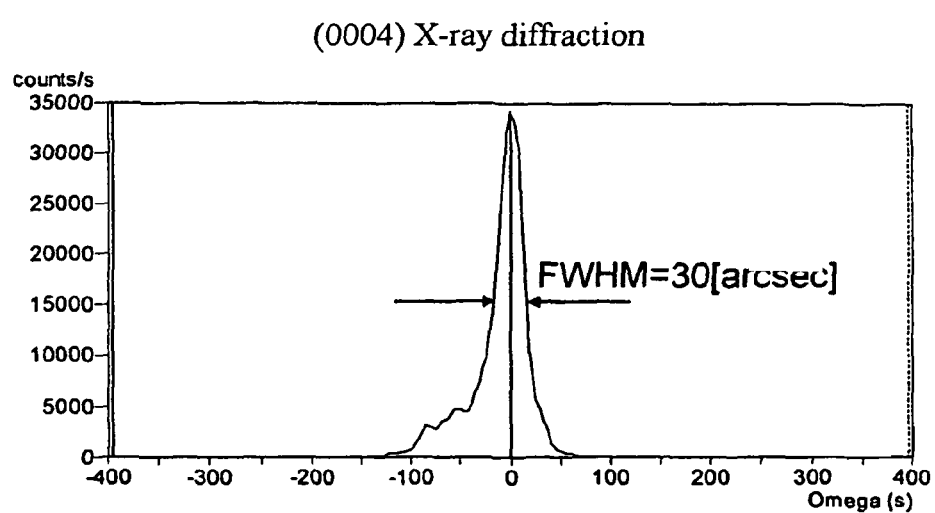
FIG. 18 is a graph showing (0004) plane X-ray diffraction intensity of the low defect density single crystal regions Z of the GaN crystal made by the facet growth method of the present invention. The abscissa is an angle (arcsec) of the diffraction. The ordinate is counts of X-rays diffracted by (0004) planes per second. The FWHM (full width at half maximum) is less than 30 arcseconds. 60 arcseconds=1 arcminute. 60 arcminutes=1 degree.

(004) is a three index expression. An equivalent four index expression is (0004). FIG. 18 exhibits the angular distribution of the X-ray diffraction. The abscissa is arcsecond (60 arcseconds=1 arcminute, 60 arcminites=1 degree). The ordinate is diffracted ray counts (counts/second). The FWHM (full width at half maximum) is less than 30 arcseconds. The narrow FWHM means a good crystal lattice structure. Sample K is a GaN on GaAs undersubstrate. It is confirmed that other samples grown on SiC or sapphire have a similar good lattice structure by the X-ray diffraction.

The wafer of Sample K is input into an MOCVD apparatus. LEDs are produced on the sample K wafer by supplying organic materials and ammonia to the wafer.

Figure 19:
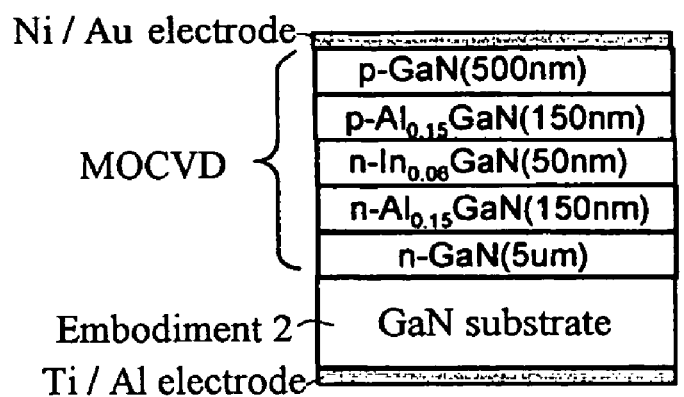
FIG. 19 is a sectional view of an LED which has been produced by epitaxially growing an n-GaN layer, an n-$Al_{0.15}Ga_{0.85}N$ layer, an n-$In_{0.06}Ga_{0.94}N$, a p-$Al_{0.15}Ga_{0.85}N$ and a p-GaN layer on an n-type GaN substrate made by the facet growth method of the present invention, depositing a Ni/Au p-electrode on the p-GaN layer and depositing a Ti/Al n-electrode on the bottom of the n-GaN substrate.
Figure 20:
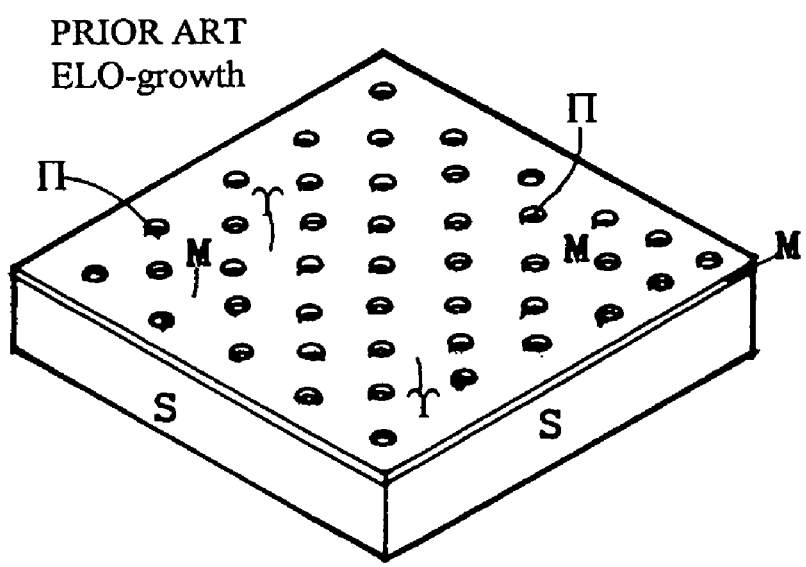
FIG. 20 is a perspective view of an ELO-masked undersubstrate of the epitaxial lateral overgrowth method which has been employed for growing GaN thin films. The ELO masked undersubstrate has a continual wide covered part T and plenty of small, isolated exposed parts Π. The area of the covered parts T is far wider than the area of the exposed parts Π.
Figure 21:
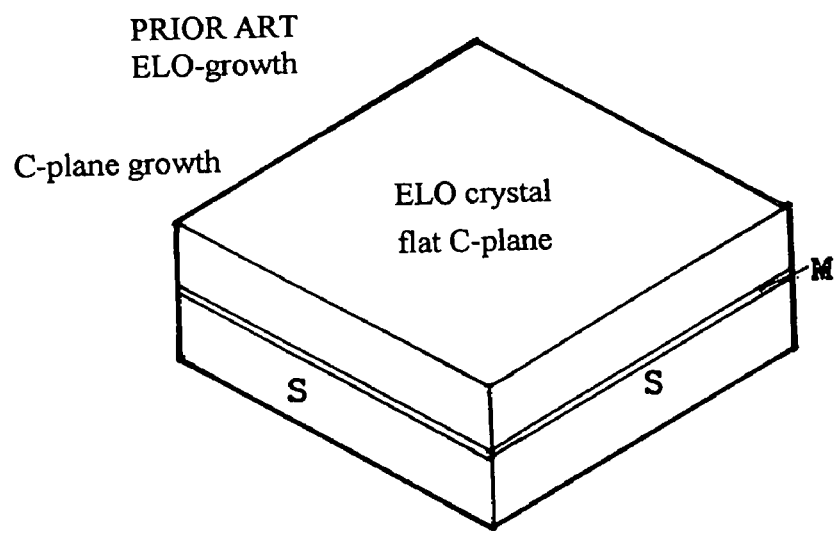
FIG. 21 is a perspective view of an ELO-growing flat crystal which has been made by forming an ELO mask M on an undersubstrate S, growing GaN on the ELO-masked undersubstrate, making GaN crystals on exposed parts Π, allowing the GaN crystals to step on and creep on the masked parts T for making a flat C-plane and growing a flat GaN film upward in the whole. The top of the ELO-growing crystal is a flat C-plane.
Figure 22:
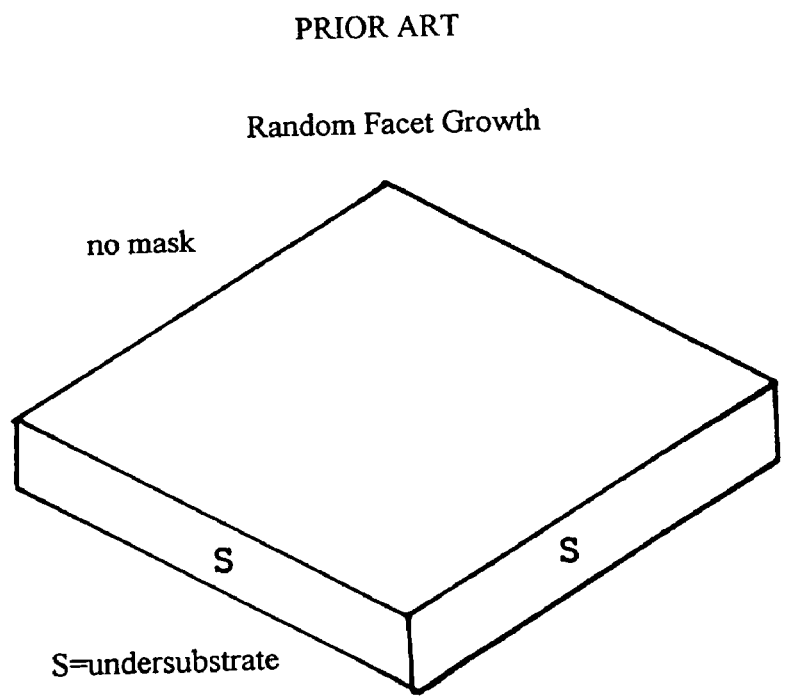
FIG. 22 is a perspective view of a maskless undersubstrate S for the random-type facet growth method which has first been contrived by the same inventors as the present invention.
Figure 23:
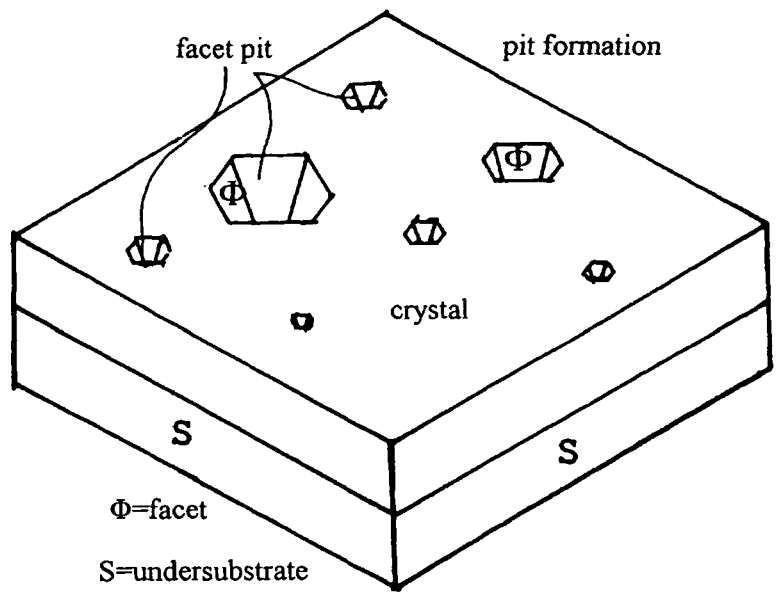
FIG. 23 is a perspective view of a nitride semiconductor crystal grown by the random-type facet growth method for demonstrating plenty of facets pits with random sizes appearing at random spots on the crystal.
Figure 24:
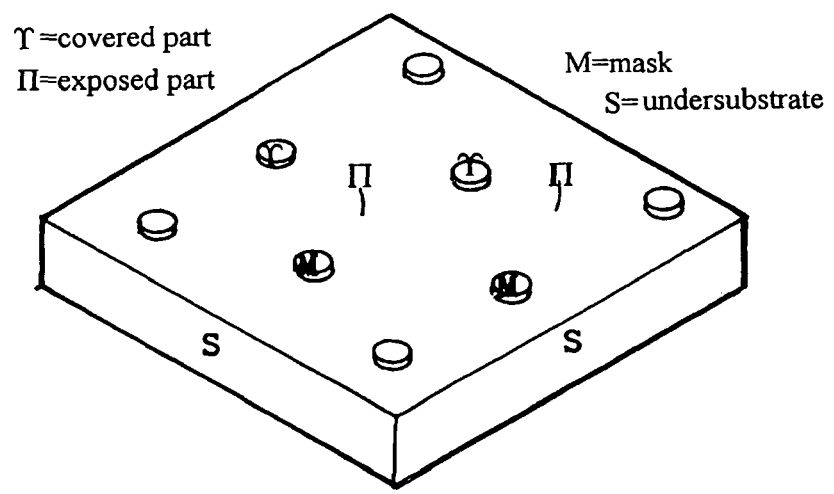
FIG. 24 is a perspective view of a part of a dot-masked undersubstrate S having many isolated small masks M for the dot-type facet growth method which has second been contrived by the same inventors as the present invention. The area of the covered parts T is smaller than the area of the exposed part Π.
Figure 25:
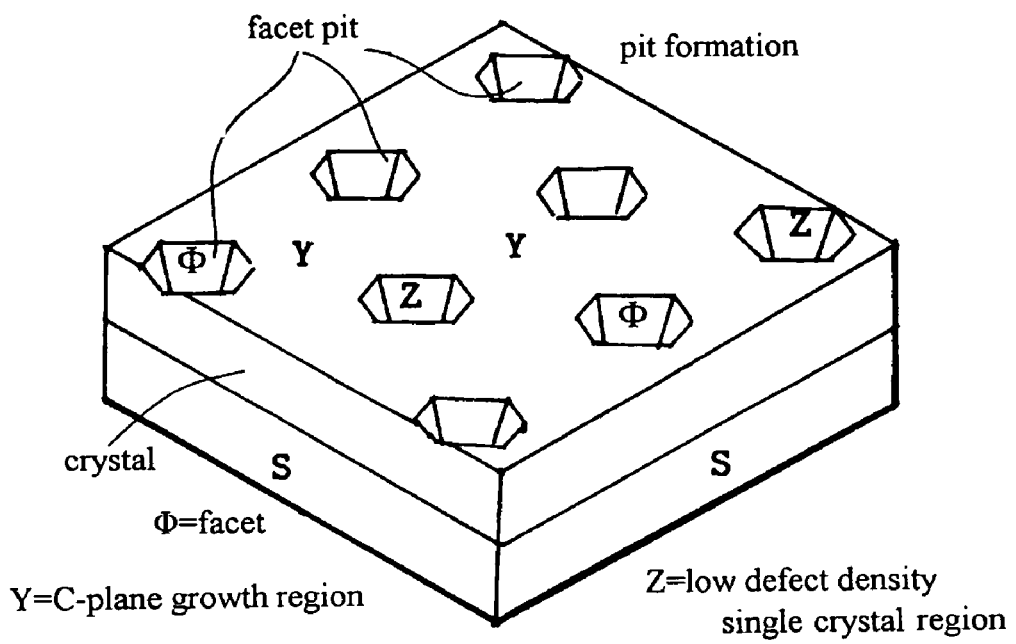
FIG. 25 is a perspective view of a nitride semiconductor crystal grown on a dot-masked undersubstrate S having many isolated masks M by the dot-type facet growth method which has second been contrived by the same inventors for demonstrating plenty of polygonal facets pits with similar sizes and shapes appearing above the dot masks M, low defect density regions Z made below the facet Φ and another part of flat C-plane growth regions Y.
Figure 26:
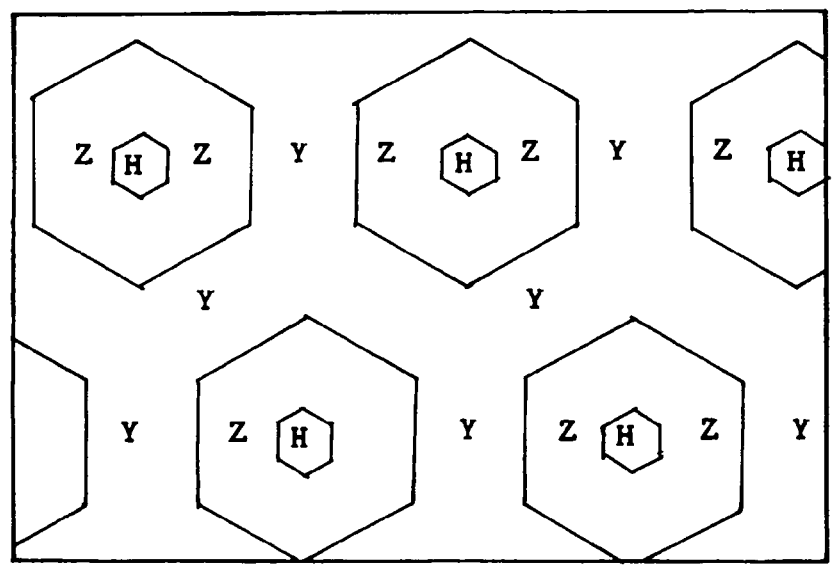
FIG. 26 is a cathode luminescenced top view of a nitride semiconductor crystal grown by the dot-type facet growth method which has second been contrived by the same inventors, slicing the crystal into an as-cut wafer and polishing the as-cut wafer into a mirror wafer for demonstrating a plurality of small hexagonal defect accumulating regions H, concentric hexagonal low defect density single crystal regions Z and a continual low defect single crystal C-plane growth region Y which occupies extra space out of the hexagonal low defect single crystal regions Z.
Figure 27:
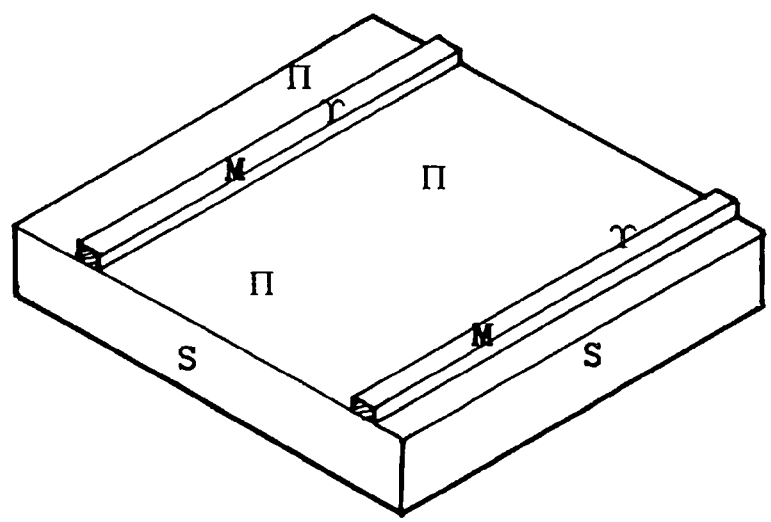
FIG. 27 is a perspective view of a part of a stripe-masked undersubstrate S having many parallel straight mask stripes M for the stripe-type facet growth method which has third been contrived by the same inventors as the present invention. Covered parts T are parallel stripes. Exposed parts Π are wide and parallel with each other. The area of the covered parts T is smaller than the area of the exposed part Π.
Figure 28:
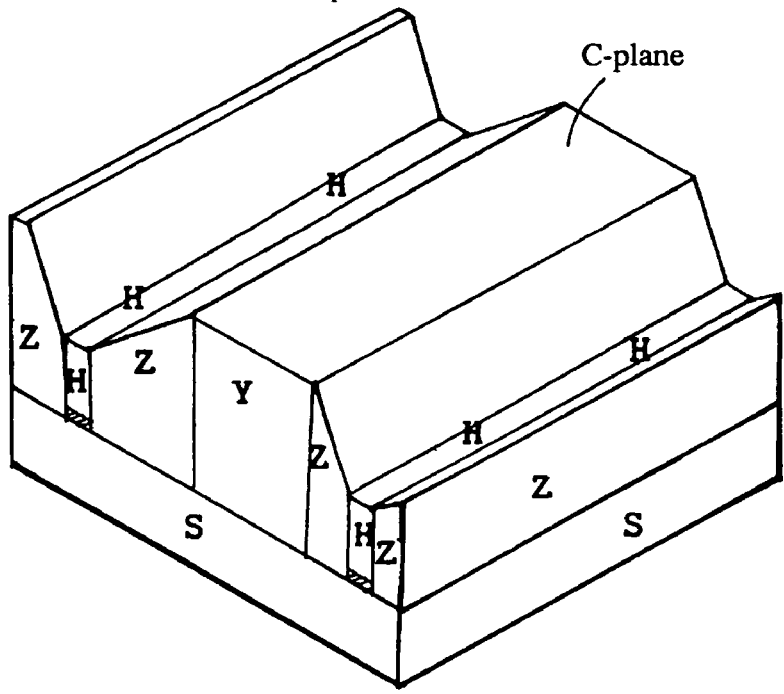
FIG. 28 is a perspective view of a nitride semiconductor crystal grown on a stripe-masked undersubstrate S having parallel straight mask stripes M by the stripe facet growth method for demonstrating plenty of parallel wider straightly-extending hills consisting of facets Φ and a flat and being formed on exposed parts Π and plenty of parallel narrower valleys occurring on the stripe masks M. Low defect density single crystal regions Z are grown on the exposed parts Π following the facets. Low defect density single crystal C-plane growth regions Y are grown on the exposed parts Π following the flat C-planes. Defect accumulating regions H are formed on the stripe mask parts T located in the narrower valleys.
Figure 29:
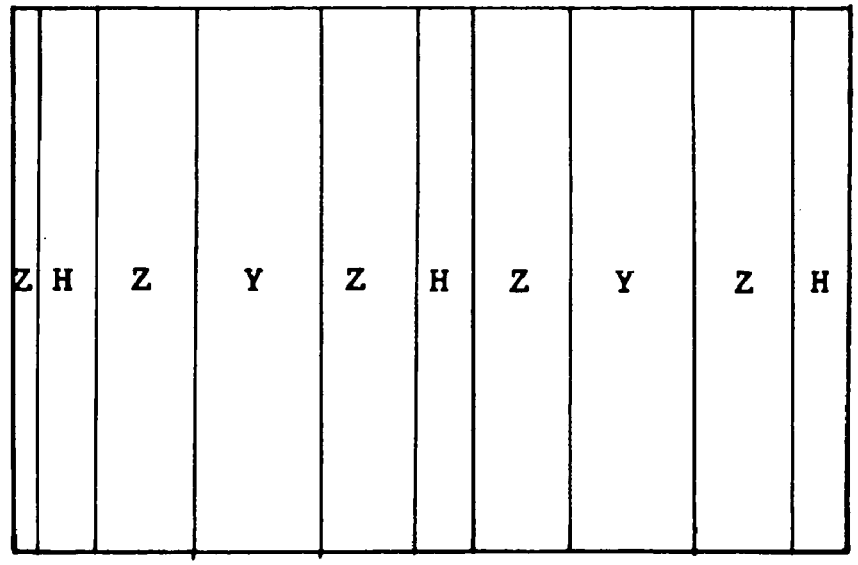
FIG. 29 is a cathode luminescenced top view of a nitride semiconductor crystal grown by the stripe facet growth method which has third been contrived by the same inventors, slicing the crystal into an as-cut wafer and polishing the as-cut wafer into a mirror wafer for demonstrating a plurality of straightly-extending parallel defect accumulating regions H, parallel straightly-extending low defect density single crystal regions Z being in contact with the defect accumulating regions H and parallel low defect single crystal C-plane growth region Y which are sandwiched between low defect density single crystal regions Z and Z.

FIG. 19 denotes the structure of the LED. A 5 μm n-GaN buffer layer, a 150 μm n-Al$_{0.15}$Ga$_{0.85}$N layer, a 50 nm n-In$_{0.06}$Ga$_{0.94}$N layer, a 150 nm p-Al$_{0.15}$Ga$_{0.85}$N layer and a 500 nm p-GaN layer are grown on the GaN substrate. A Ni/Au p-electrode is deposited on the top. A Ti/Al n-electrode is formed on the bottom. After the formation of the electrodes, the bottom surface is protected by covering with wax. Four hour selective etching in a hot KOH solution (1N; 100° C.) eliminates only the defect accumulating regions H which form a hexagon network. Hexagon LED chips, which are denoted by "LED 1", are produced from (Embodiment 2) Sample K.

A comparison example LED 2's structure having the same size and structure shown in FIG. 19 is made on another GaN substrate of EPD=$1 \times 10^7$ cm$^{-2}$.

LED 1 (Embodiment 2) and LED 2(Comparison) are driven by supplying current on the same condition. Emission intensity of LED 1 is about 1.2 times as strong as LED 2 at 20 mA current supply.

A lifetime test on the condition of 100 mA current supply confirms that LED 1 has a lifetime more than ten times as long as the lifetime of LED 2.

The long lifetime proves high quality and low defect density of the substrates made by the present invention.

Embodiment 3

SiO$_2$, SiN, Pt, W Mask; Samples O-R

Keeping the same mask pattern, Samples O-R change materials of masks. SiO$_2$ (Sample O), Si$_3$N$_4$ (Sample P), Pt (Sample Q) and W (Sample R) mask are used. All the masks of SiO$_2$, Si$_3$N$_4$, Pt and W have a common 100 nm thickness.

|  | W(mm) | H(mm) | T(mm) |
| --- | --- | --- | --- |
| Sample O (SiO$_2$ mask) | 1 | 1.2 | 0.05 |
| Sample P (Si$_3$N$_4$ mask) | 1 | 1.2 | 0.05 |
| Sample Q (Pt mask) | 1 | 1.2 | 0.05 |
| Sample R (W mask) | 1 | 1.2 | 0.05 |

Thin buffer layers are made at a low temperature on the masked undersubstrates. Thick epitaxial layers are made at a high temperature on the buffer layers.

(A. Formation of a GaN Low Temperature Deposition Layer)

Low Temperature HVPE Method (for Buffer Layer)

| Ga-melt temperature: | 800° C. |
| --- | --- |
| undersubstrate temperature: | 490° C. |
| NH$_3$ partial pressure: | 0.2 atm (20 kPa) |
| HCl partial pressure: | 2.0 × 10$^{-3}$ atm (200 Pa) |
| Growth time: | 15 minutes |
| Growth thickness: | 50 nm |

(B. Formation of a GaN High Temperature Deposition Layer)

High Temperature HVPE Method (for Epitaxial Layer)

| Ga-melt temperature: | 800° C. |
| --- | --- |
| undersubstrate temperature: | 1010° C. |
| NH3 partial pressure: | 0.2 atm (20 kPa) |
| HCl partial pressure: | 2.5 × 10$^{-2}$ atm (2.5 kPa) |
| Growth time: | 11 hours |

The SiO$_2$ mask enables Sample O to make defect accumulating regions H including plane defects on the SiO$_2$ mask on GaAs. But the Si$_3$N$_4$ mask (Sample P) is incapable of making defect accumulating regions H including plane defects on the Si$_3$N$_4$ mask on GaAs.

The Pt mask (Sample Q) and the W mask (Sample R) can make defect accumulating regions H thereon. But the defect accumulating regions H are polycrystals.

The SiO$_2$ mask is the best for making definite defect accumulating regions H of orientation-inversion single crystals thereon.

[Sample O (SiO$_2$ mask; W=1 mm, H=1.2 mm, T=0.05 mm: Pattern L; Regular Hexagon Network Mask)]

Embodiment 3, which includes Samples O, P, Q and R, employs a GaAs(111)A-plane single crystal undersubstrate in common but produces masks with different materials. Mask materials are SiO$_2$ (silicon dioxide), Si$_3$N$_4$ (silicon nitride), Pt (platinum) and W (tungsten) for Samples O, P, Q and R respectively. Samples O forms a network mask (SiO$_2$) of a regular hexagon unit pattern of W=1 mm, H=1.2 mm and T=0.05 mm on a GaAs(111)A-plane undersubstrate (FIG. 14). A GaN film is grown on the network masked undersubstrate by the HVPE method. Defect accumulating regions H of orientation-inversion appear on the covered parts ϒ from the beginning and survive till a 1 mm thickness but disappear at a 2 mm thickness. Delayed effect of the defect accumulating regions H keeps reducing EPDs on the centers of Π.

When the thickness of a GaN film is 0.5 mm, defect accumulating regions H are orientation-inversion layers. EPDs are 2×10$^6$ cm$^{-2}$ at the center and 3×10$^7$ cm$^{-2}$ at the periphery of Π. Dislocation reduction is caused by the orientation-inversion defect accumulating regions H.

When the thickness of a GaN film is 1 mm, defect accumulating regions H are orientation-inversion. EPDs are 1×10$^5$ cm$^{-2}$ at the center and 1×10$^6$ cm$^{-2}$ at the periphery of Π. The EPD reduction is caused by the defect accumulating regions H.

When the thickness of a GaN film is 2 mm, no defect accumulating region H exists. EPDs are 1×10$^4$ cm$^{-2}$ at the center and 1×10$^7$ cm$^{-2}$ at the periphery of Π. Sample O confirms the excellence of SiO$_2$ as a mask material.

[Sample P (Si$_3$N$_4$ Mask; W=1 mm, H=1.2 mm, T=0.05 mm: Pattern L; Regular Hexagon Network Mask)]

Samples P forms a silicon nitride network mask (Si$_3$N$_4$) of a regular hexagon unit pattern of W=1 mm, H=1.2 mm and T=0.05 mm on a GaAs(111)A-plane undersubstrate (FIG. 14). A GaN film is grown on the network masked undersubstrate by the HVPE method. No defect accumulating region H appears from the beginning. Facet hills Σ are made on Π. Facets have a function of conveying dislocations to the masked parts ϒ.

When the thickness of a GaN film is 0.5 mm, no accumulating regions H exists. EPDs are 2×10$^6$ cm$^{-2}$ at the center and 2×10$^7$ cm$^{-2}$ at the periphery of Π. Dislocation reduction is owed to the facet hills Σ and mask parts ϒ.

When the thickness of a GaN film is 1 mm, no defect accumulating region H exists. EPDs are 1×10$^6$ cm$^{-2}$ at the center and 2×10$^6$ cm$^{-2}$ at the periphery of Π. The EPD reduction is caused by Σ and ϒ.

When the thickness of a GaN film is 2 mm, no defect accumulating region H exists. EPDs are 6×10$^5$ cm$^{-2}$ at the center and 1×10$^7$ cm$^{-2}$ at the periphery of Π. Si$_3$N$_4$ masks cannot make defect accumulating regions H. Since there exists only the operation of sweeping dislocations away by facets, dislocations at the centers of Π decrease but dislocations at the peripheral area of Π increase. Sample P discloses incompetency of Si$_3$N$_4$ as a mask material.

[Sample Q (Pt Mask; W=1 mm, H=1.2 mm, T=0.05 mm: Pattern L; Regular Hexagon Network Mask)]

Samples Q forms a platinum (Pt) network mask of a regular hexagon unit pattern of W=1 mm, H=1.2 mm and T=0.05 mm on a GaAs(111)A-plane undersubstrate (FIG. 14). A GaN film is grown on the network masked undersubstrate by the HVPE method. Polycrystalline defect accumulating regions H appear from the beginning. Dislocations at both the center parts of Π and the peripheral parts of Π are decreased lower by the polycrystal defect accumulating regions H as the GaN film grows thicker.

When the thickness of a GaN film is 0.5 mm, defect accumulating regions H are polycrystals. EPDs are 5×10$^6$ cm$^{-2}$ at the center and 5×10$^7$ cm$^{-2}$ at the periphery of Π. Dislocation reduction is owed to the polycrystalline defect accumulating regions H.

When the thickness of a GaN film is 1 mm, defect accumulating region H are polycrystalline. EPDs are 5×10$^5$ cm$^{-2}$ at the center and $5\times10^6$ cm$^{-2}$ at the periphery of Π. The EPD reduction is caused by the polycrystalline defect accumulating regions H.

When the thickness of a GaN film is 2 mm, defect accumulating regions H exist as polycrystals. EPDs are $2\times10^5$ cm$^{-2}$ at the center and $2\times10^6$ cm$^{-2}$ at the periphery of Π. The defect accumulating regions H keep reducing EPD on the center and the periphery of Π.

The Pt mask is incapable of lowering EPDs below $2\times10^5$ cm$^{-2}$. Pt is competent for a mask material, since Pt maintains polycrystal defect accumulating regions H to more than a 2 mm thickness.

[Sample R (W Mask; W=1 mm, H=1.2 mm, T=0.05 mm: Pattern L; Regular Hexagon Network Mask)]

Samples R forms a tungsten (W) network mask of a regular hexagon unit pattern of W=1 mm, H=1.2 mm and T=0.05 mm on a GaAs(111)A-plane undersubstrate (FIG. 14). A GaN film is grown on the network masked undersubstrate by the HVPE method. Polycrystalline defect accumulating regions H appear from the beginning to a 2 mm thickness of growth. Dislocations are decreased lower by the polycrystal defect accumulating regions H as the GaN film grows thicker.

When the thickness of a GaN film is 0.5 mm, defect accumulating regions H are polycrystals. EPDs are $3\times10^6$ cm$^{-2}$ at the center and $3\times10^7$ cm$^{-2}$ at the periphery of H. Dislocation reduction is owed to the polycrystalline defect accumulating regions H.

When the thickness of a GaN film is 1 mm, defect accumulating regions H are polycrystalline. EPDs are $3\times10^5$ cm$^{-2}$ at the center and $3\times10^6$ cm$^{-2}$ at the periphery of Π. The EPD reduction is caused by the polycrystalline defect accumulating regions H.

When the thickness of a GaN film is 2 mm, defect accumulating regions H still exist as polycrystals. EPDs are $2\times10^5$ cm$^{-2}$ at the center and $2\times10^6$ cm$^{-2}$ at the periphery of Π. The defect accumulating regions H keep reducing EPD on both the center and the periphery of Π.

Tungsten masks are incapable of lowering EPDs below $2\times10^5$ cm$^2$. Tungsten (W) is competent for a mask material, since tungsten maintains polycrystal defect accumulating regions H to more than a 2 mm thickness. Pt, W or other metallic masks have a tendency of producing polycrystal defect accumulating regions H. Platinum (Pt) and tungsten (W) are inferior to SiO$_2$ in EPD decrement but superior to SiO$_2$ in long-term EPD reduction via longlife polycrystalline defect accumulating regions H. Tungsten (W) surpasses platinum (Pt) in EPD reduction.

Embodiment 4

AlN, InN Substrates, Samples S, T, U, V and W

All the preceding embodiments aim at producing gallium nitride (GaN) substrates. The present invention is applicable to production of other nitride crystal substrates, for example, AlN and InN substrates with some additional contrivances.

Unlike Ga, aluminum nitride (AlN) has no selectivity for undersubstrates to silicon dioxide (SiO$_2$) or silicon nitride (Si$_3$N$_4$). AlN will grow on a mask at the same speed as on an undersubstrate. Aluminum nitride (AlN) cannot induce facet-growth. A contrivance is used for AlN growth, which includes the processes of forming a mask on undersubstrate, growing GaN on the masked undersubstrate, making an inhomogeneous GaN crystal having Zs an Hs, slicing the GaN crystal into an inhomogeneous GaN wafer and assigning the inhomogeneous GaN wafer as an undersubstrate.

Embodiment 4 selects Sample K GaN wafer prepared by Embodiment 2 which has been made by forming a SiO$_2$ mask on a GaAs(111)A-plane, growing a GaN buffer layer and thick GaN epitaxial layers on the masked undersubstrate by the HVPE method and slicing the GaN crystal.

The GaN undersubstrate made by Embodiment 2 has a hexagon network defect accumulating region H, hexagon low defect density single crystal regions Z enclosed by H and C-plane growth regions Y at the centers of the hexagons. Samples S, T and U will be GaN, AlGaN and InGaN wafers having hexagonal structure of H+Z+Y made on Sample K.

|  | W | H | T |
|---|---|---|---|
| Sample S (GaN undersubstrate K) | 1 mm | 1.2 mm | 0.05 mm |
| Sample T (GaN undersubstrate K) | 1 mm | 1.2 mm | 0.05 mm |
| Sample U (GaN undersubstrate K) | 1 mm | 1.2 mm | 0.05 mm |

The above parameters are not mask parameters of Samples S, T and U but the mask parameters of Sample K, which has been described.

Samples S, T and U try to grow GaN, AlGaN and InGaN crystals by the HVPE method. Samples S, T and U have many common points in the HVPE growth. As undersubstrates, Samples S, T, U and W employ a GaN mirror wafer K prepared by cutting the GaN crystal produced by Embodiment 2 into thin as-cut wafers and polishing the as-cut wafers into GaN mirror wafers. The mirror wafer K lacks a mask. But the wafer K has a potential structure composed of hexagonal network Hs and isolated hexagon Zs and Ys. Sample S grows a GaN crystal on an unmasked, potential-structured GaN undersubstrate K. Sample T grows an AlGaN crystal on an unmasked, potential-structured GaN undersubstrate K. Sample U grows an InGaN crystal on an unmasked, potential-structured GaN undersubstrate K.

[Sample S (GaN on Sample K; W=1 mm, H=1.2 mm, T=0.05 mm: Pattern L; Regular Hexagon Network Mask)]

Samples S employs the product of Sample K as an undersubstrate for making a new GaN substrate. Sample K is a GaN/GaAs wafer made by a network mask of W=1 mm, H=1.2 mm and T=0.05 mm. The Sample K GaN/GaAs wafer is placed upon a susceptor in the HVPE furnace. The Ga-melt temperature is 800° C. The growth temperature is 1050° C. The HVPE apparatus supplies a Ga-melt with HCl+H$_2$ gas, produces gallium chloride (GaCl) gas, guides the GaCl gas to the 1050° C. heated susceptor, and supplies NH$_3$+H$_2$ gas to the susceptor. Reaction of GaCl with NH$_3$ synthesizes GaN. A GaN film is grown on the GaN/GaAs (Sample K) undersubstrate.

(Formation of GaN High Temperature Cover Layer of Sample S)

High Temperature HVPE Method

| Ga temperature: | 800° C. |
|---|---|
| GaCl synthesis: | (←Ga + HCl) |
| undersubstrate temperature: | 1050° C. |
| NH$_3$ partial pressure: | $2.5 \times 10^{-2}$ atm (2.5 kPa) |
| HCl partial pressure: | 0.02 atm (2 kPa) |
| Growth time: | 30 hours |

It is confirmed that the new GaN crystal grows with defect accumulating regions H whose positions and sizes are the same as the defect accumulating regions H on Sample K. New defect accumulating regions H grow on the defect accumulating regions H of the undersubstrate K. Hexagonal defect accumulating regions H are produced. New low defect density single crystal regions Z grow on the low defect density single crystal regions Z of the undersubstrate K. The new GaN crystal copies and transcribes the ZHY structure of the GaN undersubstrate.

[Sample T (AlGaN on Sample K; W=1 mm, H=1.2 mm, T=0.05 mm: Pattern L; Regular Hexagon Network Mask)]

Samples T employs the product of Sample K as an undersubstrate for making a new AlGaN substrate. Sample K is a GaN/GaAs wafer made by a network mask of W=1 mm, H=1.2 mm and T=0.05 mm. The Sample K GaN/GaAs wafer is placed upon a susceptor in the HVPE furnace. The Ga-melt temperature is 800° C. The Al-melt temperature is 500° C. to 600° C. The growth temperature is 1050° C. The HVPE apparatus supplies a Ga-melt with HCl+$H_2$ gas, produces gallium chloride (GaCl) gas, supplies Al-melt with HCl+$H_2$ gas, produces aluminum chloride gas ($AlCl_3$), guides the GaCl and $AlCl_3$ gases to the 1050° C. heated susceptor, and supplies $NH_3$+$H_2$ gas to the susceptor. Reaction of GaCl+$AlCl_3$ with $NH_3$ synthesizes AlGaN. An AlGaN film is grown on the GaN/GaAs (Sample K) undersubstrate.

(Formation of AlGaN High Temperature Epitaxial Layer of Sample T)

High Temperature HVPE Method

| | |
|---|---|
| Ga temperature: | 800° C. |
| Al temperature: | 500° C.–600° C. |
| GaCl synthesis: | (←Ga + HCl) |
| $AlCl_3$ synthesis: | (←Al + HCl) |
| undersubstrate temperature: | 1050° C. |
| $NH_3$ partial pressure: | $2.5 \times 10^{-2}$ atm (2.5 kPa) |
| HCl partial pressure: | 0.02 atm (2 kPa) |
| Growth time: | 30 hours |

It is confirmed that the new AlGaN crystal grows with defect accumulating regions H whose positions and sizes are the same as the defect accumulating regions H on Sample K. New defect accumulating regions H grow on the defect accumulating regions H of the undersubstrate K. Hexagonal defect accumulating regions H are produced. New low defect density single crystal regions Z grow on the low defect density single crystal regions Z of the undersubstrate K. The new AlGaN crystal copies and transcribes the ZHY structure of the GaN undersubstrate.

[Sample U (InGaN on Sample K; W=1 mm, H=1.2 mm, T=0.05 mm: Pattern L; Regular Hexagon Network Mask)]

Samples U employs the product of Sample K as an undersubstrate for making a new InGaN substrate. Sample K is a GaN/GaAs wafer made by a network mask of W=1 mm, H=1.2 mm and T=0.05 mm. The Sample K GaN/GaAs wafer is placed upon a susceptor in the HVPE furnace. The Ga-melt temperature is 800° C. The In-melt temperature is 100° C. to 120° C. The growth temperature is 1050° C. The HVPE apparatus supplies a Ga-melt with HCl+$H_2$ gas, produces gallium chloride (GaCl) gas, supplies an In-melt with HCl+$H_2$ gas, produces indium chloride gas ($InCl_3$), guides the GaCl and $InCl_3$ gases to the 1050° C. heated susceptor, and supplies $NH_3$+$H_2$ gas to the susceptor. Reaction of GaCl+$InCl_3$ with $NH_3$ synthesizes AlGaN. An InGaN film is grown on the GaN/GaAs (Sample K) undersubstrate.

(Formation of InGaN High Temperature Epitaxial Layer of Sample U)

High Temperature HVPE Method

| | |
|---|---|
| Ga temperature: | 800° C. |
| In temperature: | 100° C.–120° C. |
| GaCl synthesis: | (←Ga + HCl) |
| $InCl_3$ synthesis: | (←In + HCl) |
| undersubstrate temperature: | 1050° C. |
| $NH_3$ partial pressure: | $2.5 \times 10^{-2}$ atm (2.5 kPa) |
| HCl partial pressure: | 0.02 atm (2 kPa) |
| Growth time: | 30 hours |

It is confirmed that the new InGaN crystal grows with defect accumulating regions H whose positions and sizes are the same as the defect accumulating regions H on Sample K. New defect accumulating regions H grow on the defect accumulating regions H of the undersubstrate K. Hexagonal defect accumulating regions H are produced. New low defect density single crystal regions Z grow on the low defect density single crystal regions Z of the undersubstrate K. The new InGaN crystal copies and transcribes the ZHY structure of the GaN undersubstrate.

Non-C-plane substrates are made by cutting the GaN crystals produced by Embodiment 2 in parallel with (10-10) and (11-22) planes, making (10-10) as-cut GaN wafers and (11-22) as-cut wafers and producing (10-10) mirror wafers for Sample V and (11-22) mirror wafers for Sample W.

Sample V is a GaN film grown on the (10-10) mirror GaN wafer. All the defect accumulating regions H vanish in the (10-10) GaN crystal. The present invention seems to be inapplicable to (10-10) orientation. (10-10) is a plane orthogonal to C-plane (0001).

Sample V is a GaN film grown on the (11-22) mirror GaN wafer. Defect accumulating regions H, which are polycrystals, appear on the (11-22) GaN crystal. The present invention is applicable to (11-22) orientation. (11-22) is not orthogonal to C-plane but one of facets.

[Sample S (GaN/Sample K; W=1 mm, H=1.2 mm, T=0.05 mm: Pattern L; Regular Hexagon Network Mask)]

Samples S employs the product of Sample K as an undersubstrate. Sample K is a GaN crystal grown on a network-masked GaAs substrate with a network mask of W=1 mm, H=1.2 mm and T=0.05 mm. The GaN/GaAs undersubstrate diverting from Sample K has a network pattern of defect accumulating regions H having a unit pattern of W=1 mm and H=1.2 mm. Sample S has no mask but has potential network of hexagonal Hs and Zs originating from Sample K. New GaN defect accumulating regions H succeed to the substrate defect accumulating regions H. New GaN low dislocation single crystal regions Z grow on the substrate low dislocations single crystal regions Z. Namely newly growing GaN film transcribes the GaN undersubstrate (Sample K). The defect accumulating regions H survive till a 1 mm thickness but disappear at a 2 mm thickness. Defect accumulating regions H succeed to the substrate defect accumulating regions H.

When the thickness of a GaN film is 0.5 mm, defect accumulating regions H are orientation-inversion. EPDs are $1 \times 10^6$ $cm^{-2}$ at the center and $1 \times 10^7$ $cm^{-2}$ at the periphery of Π. Dislocation reduction is owed to the orientation-inversion defect accumulating regions H.

When the thickness of a GaN film is 1 mm, defect accumulating regions H are polycrystalline. EPDs are $1 \times 10^5$ $cm^{-2}$ at the center and $1 \times 10^6$ $cm^{-2}$ at the periphery of Π. The EPD reduction is caused by the defect accumulating regions H.

When the thickness of a GaN film is 2 mm, defect accumulating regions H vanish. EPDs are $1\times10^4$ cm$^{-2}$ at the center and $1\times10^7$ cm$^{-2}$ at the periphery of Π. The defect accumulating regions H keep reducing EPD on both the center and the periphery of Π.

Sample S gives a valuable hint of making use of the GaN crystal produced by the present invention as a substrate. When GaN is grown on a GaN substrate having a potential structure of defect accumulating regions H and low defect density single crystal regions Z, the growing GaN crystal transcribes the potential structure with fidelity. Defect accumulating regions H succeed to the original defect accumulating regions H. Low defect density single crystal regions Z follow the original low defect density single crystal regions Z. C-plane growth regions Y accompany the original C-plane growth regions Y. Attention should be paid to anisotropy and periodicity of the substrates made by the present invention.

[Sample T (AlGaN on GaN/Sample K)]

Sample T employs the product of Sample K as an undersubstrate. Sample K is a GaN crystal grown on a network-masked GaAs substrate with a network mask of W=1 mm, H=1.2 mm and T=0.05 mm. The GaN/GaAs undersubstrate diverting from Sample K has a potential network pattern of defect accumulating regions H having a unit pattern of W=1 mm and H=1.2 mm. An AlGaN mixture film is grown upon the GaN undersubstrate. New AlGaN defect accumulating regions H succeed to the substrate defect accumulating regions H. New AlGaN low dislocation single crystal regions Z grow on the substrate low dislocations single crystal regions Z. Namely a newly growing AlGaN film transcribes the GaN undersubstrate (Sample K). The defect accumulating regions H survive till a 0.5 mm thickness but disappear at a 1 mm thickness.

When the thickness of an AlGaN film is 0.5 mm, defect accumulating regions H are orientation-inversion. EPDs in AlGaN are $1\times10^6$ cm$^{-2}$ at the center and $1\times10^7$ cm$^{-2}$ at the periphery of Π. Dislocation reduction is owed to the orientation-inversion defect accumulating regions H.

When the thickness of an AlGaN film is 1 mm, defect accumulating regions H disappear. EPDs in AlGaN are $1\times10^5$ cm$^{-2}$ at the center and $1\times10^7$ cm$^{-2}$ at the periphery of Π.

When the thickness of an AlGaN film is 2 mm, no defect accumulating region H exist. EPDs in AlGaN are $5\times10^5$ cm$^{-2}$ at the center and $2\times10^7$ cm$^{-2}$ at the periphery of Π. Extinction of defect accumulating regions H increases EPDs on both the center and the periphery of Π.

Sample T gives a valuable hint of making use of the AlGaN crystal produced by the present invention as a substrate. When AlGaN is grown on a GaN substrate having a potential structure of defect accumulating regions H and low defect density single crystal regions Z, the growing AlGaN crystal transcribes the potential structure with fidelity. Defect accumulating regions H succeed to the original defect accumulating regions H. Low defect density single crystal regions Z follow the original low defect density single crystal regions Z. C-plane growth regions Y accompany the original C-plane growth regions Y. Attention should be paid to anisotropy and periodicity of the substrates made by the present invention.

[Sample U (InGaN on GaN/Sample K)]

Sample U employs the product of Sample K as an undersubstrate. Sample K is a GaN crystal grown on a network-masked GaAs substrate with a network mask of W=1 mm, H=1.2 mm and T=0.05 mm. The GaN/GaAs undersubstrate diverting from Sample K has a potential network pattern of defect accumulating regions H having a unit pattern of W=1 mm and H=1.2 mm. An InGaN mixture film is grown upon the GaN undersubstrate. New InGaN defect accumulating regions H succeed to the substrate defect accumulating regions H. New InGaN low dislocation single crystal regions Z grow on the substrate low dislocations single crystal regions Z. Namely a newly growing InGaN film transcribes the GaN undersubstrate (Sample K). The defect accumulating regions H survive till a 1 mm thickness but disappear at a 2 mm thickness.

When the thickness of an InGaN film is 0.5 mm, defect accumulating regions H are orientation-inversion. EPDs in InGaN are $1\times10^6$ cm$^{-2}$ at the center and $1\times10^7$ cm$^{-2}$ at the periphery of Π. Dislocation reduction is owed to the orientation-inversion defect accumulating regions H.

When the thickness of an InGaN film is 1 mm, defect accumulating regions H disappear. EPDs in InGaN are $5\times10^5$ cm$^{-2}$ at the center and $3\times10^7$ cm$^{-2}$ at the periphery of Π.

When the thickness of an InGaN film is 2 mm, no defect accumulating regions H exist. EPDs in InGaN are $2\times10^5$ cm$^{-2}$ at the center and $3\times10^7$ cm$^{-2}$ at the periphery of Π.

Sample U gives an important hint of making use of the GaN crystal produced by the present invention as a substrate. When InGaN is grown on a GaN substrate having a potential structure of defect accumulating regions H and low defect density single crystal regions Z, the growing InGaN crystal transcribes the potential structure with fidelity. Defect accumulating regions H succeed to the original defect accumulating regions H. Low defect density single crystal regions Z follow the original low defect density single crystal regions Z. C-plane growth regions Y accompany the original C-plane growth regions Y. Attention should be paid to anisotropy and periodicity of the substrates made by the present invention.

[Sample V ((10-10) Plane Cut GaN of Sample K)]

Sample V employs a (10-10) plane cut GaN of Sample K as an undersubstrate. Sample K is a GaN crystal grown on a network-masked GaAs substrate with a network mask of W=1 mm, H=1.2 mm and T=0.05 mm. A GaN film is grown upon the (10-10)-cut GaN undersubstrate. New GaN defect accumulating regions H succeed to the substrate defect accumulating regions H. But the newly born defect accumulating regions H vanish soon. On the (10-10) plane, the dislocation decrement device is inactive.

When the thickness of a GaN film is 0.5 mm, no defect accumulating region H exists. EPDs are $2\times10^7$ cm$^{-2}$ at the center and $2\times10^7$ cm$^{-2}$ at the periphery of Π. Dislocations are not reduced owing to the extinction of effect accumulating regions H.

When the thickness of an InGaN film is 1 mm, no defect accumulating region H exists. EPDs are $1\times10^7$ cm$^{-2}$ at the center and $1\times10^7$ cm$^{-2}$ at the periphery of Π.

When the thickness of an InGaN film is 2 mm, no defect accumulating region H exists. EPDs are $8\times10^6$ cm$^{-2}$ at the center and $8\times10^6$ cm$^{-2}$ at the periphery of Π. Sample K is inherently sufficiently low EPDs. There is no additional EPD decrement effect in Sample V, which lacks defect accumulating regions H.

[Sample W ((11-22) Plane Cut GaN of Sample K)]

Sample W employs a (11-22) plane cut GaN of Sample K as an undersubstrate. Sample K is a GaN crystal grown on a network-masked GaAs substrate with a network mask of W=1 mm, H=1.2 mm and T=0.05 mm. A GaN film is grown upon the (11-22)-cut GaN undersubstrate. New GaN defect accumulating regions H succeed to the substrate defect accumulating regions H. The newly born defect accumulating regions H are polycrystals. On the (11-22) plane, polycrystalline defect accumulating regions H act as a dislocation decrement device.

When the thickness of a GaN film is 0.5 mm, defect accumulating regions H are polycrystals. EPDs are $2\times10^7$ cm$^{-2}$ at the center and $2\times10^7$ cm$^{-2}$ at the periphery of Π.

When the thickness of a GaN film is 1 mm, defect accumulating regions H are polycrystals. EPDs are $1\times10^6$ cm$^{-2}$ at the center and $1\times10^7$ cm$^{-2}$ at the periphery of Π.

When the thickness of a GaN film is 2 mm, defect accumulating regions H are polycrystals. EPDs are $5\times10^5$ cm$^{-2}$ at the center and $1\times10^7$ cm$^{-2}$ at the periphery of Π. Sample K is inherently sufficiently low EPDs. There is an additional EPD decrement effect in Sample W, which has polycrystalline defect accumulating regions H.

Embodiment 5

Figure 30:
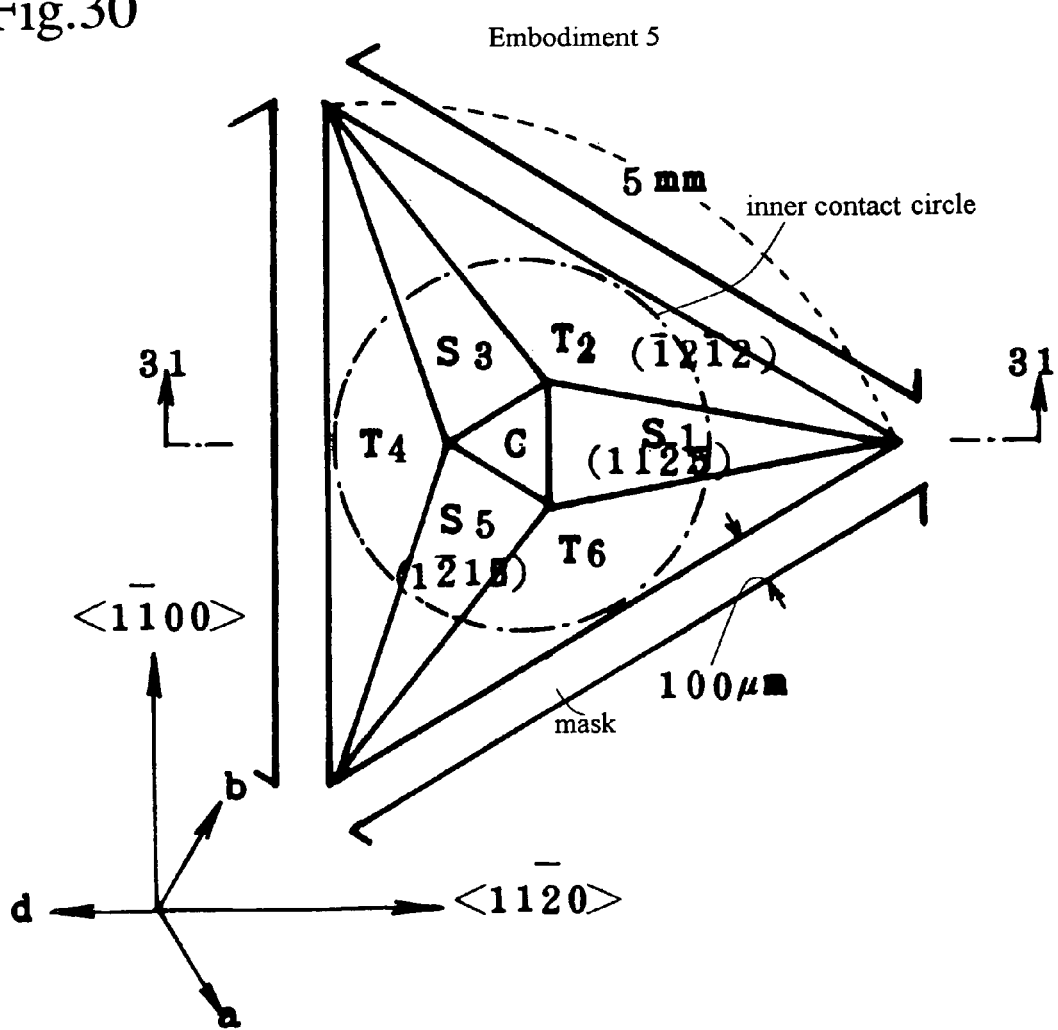
FIG. 30 is a plan view of a crystal consisting of defect accumulating regions H on a mask and a facetted equilateral triangle cone single crystal covered with along-side facets T2, T4 and T6 and intermediate facets S1, S3 and S5 and a top C-plane embossed on an exposed part Π produced by Embodiment 5 which includes the processes of piling a thin GaN template layer on a (0001) sapphire plate, making a triangle network mask composed of repetitions of a unit equilateral triangle having a side parallel with <1-100> direction of GaN and growing a thick GaN epitaxial layer on the masked GaN/sapphire undersubstrate.

FIG. 30, 31; Sapphire; equilateral Triangle Network; Template

The essence of the present invention is to make a low defect GaN or other nitride substrates by forming a network mask pattern composed of repetitions of a unit closed looped polygon on an undersubstrate, growing GaN or other nitrides in vapor phase on the network masked undersubstrate, gathering dislocations on the closed looped mask and producing defect accumulating regions H of the closed loops. Defect accumulating regions H accompany as-grown GaN crystals somewhere. All the examples which have been explained are still plagued with the residual defect accumulating regions H.

The positions occupied by defect accumulating regions H and the positions of low defect density regions (Z and Y) are known. An ultralow defect density crystal (theoretically 0 density) can be obtained by growing a tall wide GaN crystal on a wide masked (the maximum diameter is 5 mm to 100 mm) undersubstrate and cutting a part immune from dislocations.

The regions above the masks (50 μg m~3 mm width) become defect accumulating regions H. Low defect density regions (Z and Y) are made on the exposed parts Π within unit polygons. A virtual cylindrical column which is in inner contact with the network defect accumulating regions H is assumed. A region higher than a certain height within the inner contact cylindrical column contains no dislocations theoretically. The regions are called "ultralow defect density single crystal inner contact cylindrical column". Discovery of existence of the ultralow dislocation density single crystal inner contact cylindrical column is another one of the features of the present invention. Ultralow defect density single crystal GaN wafers are obtained by cutting the ultralow defect density single crystal inner contact cylindrical column into thin round wafers. Substrate wafers are shaped into round wafers for the convenience of handling in many cases. Thus circular wafers are sliced out of the ultralow defect density single crystal inner contact cylindrical column.

Figure 34:
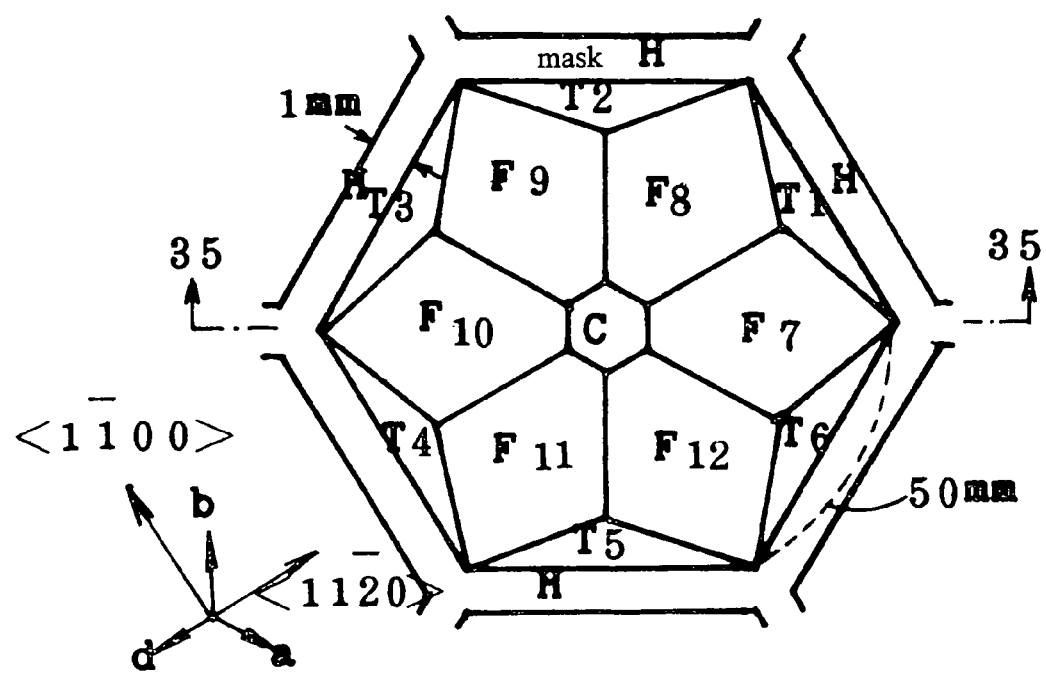
FIG. 34 is a plan view of a crystal consisting of defect accumulating regions H on a mask and a faceted regular hexagon cone single crystal covered with along-side facets T1, T2, T3, T4, T5 and T6, intermediate facets F7, F8, F9, F10, F11 and F12 and a top C-plane embossed on an exposed part Π produced by Embodiment 7 which includes the processes of preparing a GaN(0001)A-plane undersubstrate, making a regular hexagon network mask composed of repetitions of a unit regular hexagon having sides parallel with GaN <1-100> direction on the GaN(0001)A-plane undersubstrate and growing a thick GaN epitaxial layer on the masked GaN undersubstrate.
Figure 35:
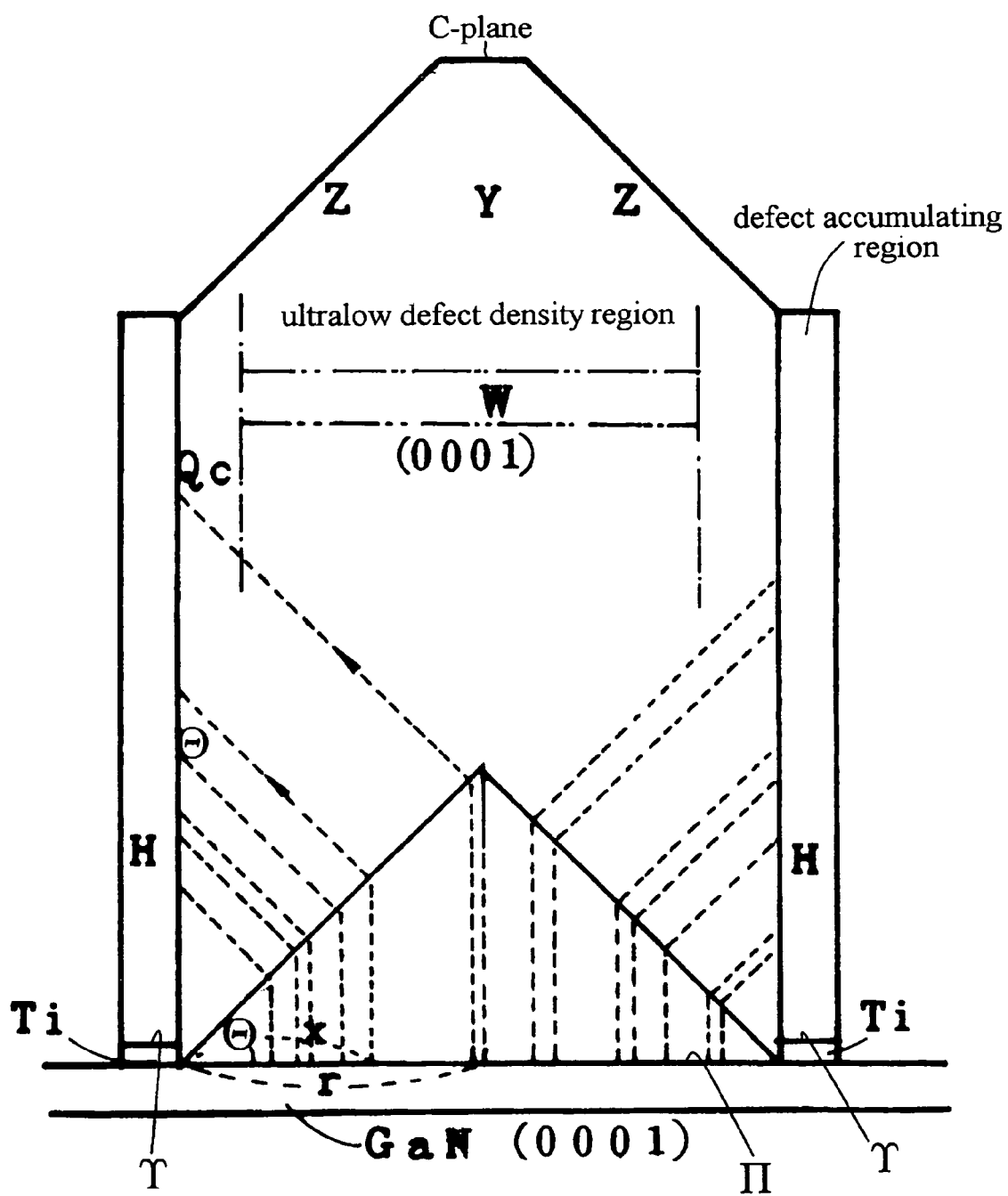
FIG. 35 is a vertically-sectioned view taken along lines 35-35 in FIG. 34 for demonstrating that each facet has an individual marginal height and how the marginal height shall be calculated.

How high is "A certain height" described above? The height will briefly explained by referring to FIG. 35. FIG. 35, which is a vertical sectional view of the hexagon crystal depicted in FIG. 34, can be applied to any polygon mask case. In FIG. 35, a Ti (titanium) network mask is formed on the undersubstrate. GaN facetted-grows on an exposed part within the mask. A radius r of a facet is now defined as a breadth of the facet in the direction orthogonal to the contact side. The radius r can be defined to every individual facet. Since a C-plane sometimes intervenes, 2r is not necessarily equal to a distance between two neighboring masks.

As demonstrated by FIG. 35, crystals grow upward within the radius r of a facet on an exposed part Π. Dislocations accompany the vertical growth. Dotted lines designate dislocations. Dislocations prolong in the vertical direction with the growth of crystals. The vertical growth continues till the crystals form a cone (facet hill) without riding over the masks. A conical crystal (facet hill), which is denoted by a solid line in FIG. 35, is completely formed on Π within the mask. The radius r is a horizontal distance from the center to the mask edge. The facet inclines at Θ to the horizontal plane. Θ is called an inclination angle.

The present invention does not bury facets but maintains facet hills. After the facet cone has been formed on Π, directions of crystal growth change from the vertical direction to slanting directions orthogonal to the facets. Dislocations, which follow the growth, extend in right and left slanting directions normal to the right and left facets in FIG. 35. Slanting dotted lines show dislocations extending outward. Divided dislocations come near to the spaces above the masks. Another set of dislocations extend from neighboring Π at a reciprocal slanting angle toward the space above the mask. Two sets of dislocations collide and aggregate above the mask. After the collision, the aggregated dislocations extend in the vertical direction just above the masks. The regions above the masks become defect accumulating regions H.

Attention is paid to a dislocation extending upward at a point distanced by x from the mask edge. The dislocation ascends in the vertical direction by x tan Θ till the solid-line cone. The dislocation changes the extending direction leftward to the normal standing on the facet. The change of angle is Θ. The dislocation goes up slantingly toward the defect accumulating region H. The crossing angle of the dislocation to H is also Θ. The path length of the slanting dislocation going from the cone to H is x cos ecΘ. cos ecΘ is a reciprocal of sin Θ. cos ecΘ=1/sin Θ. The vertical component of the slanting path length is x cos ecΘ cos Θ. The critical height Q below which the dislocation aggregates into H is a sum of x tan Θ (height at cone) and x cos ecΘ cos Θ (height from cone). Q=x tan Θ+x cos ecΘ cos Θ=x/sin Θ cos Θ=2x/sin 2Θ.

The maximum height at which dislocations reach and aggregate into H is denoted by Qc. Qc is named a marginal height. The maximum height is the height attained by the dislocation starting at x=r. The marginal height is Qc=r tan Θ+r cos ecΘ cos Θ=2r cos ec2Θ=2r/sin 2Θ. The marginal height Qc is a product of the facet diameter 2r and cos ec2Θ. In other word, Qc is obtained by dividing 2r by sin 2Θ.

45 degrees of Θ give the lowest marginal height. When Θ=45°, Qc=2r. Namely the marginal height Qc is equal to the facet diameter 2r for Θ=45°. When 0 differs farther from 45 degrees, Qc is far larger than the diameter 2r of the facet.

When the facet hill contains a plurality of facets, the maximum radius $r_{max}$ is given by the lowest inclination angle facet. Qc for the lowest inclination angle facet becomes the maximum marginal height $Qc_{max}=2r_{max}/\sin 2Θ$.

The marginal height Qc has critical significance. The parts of a height h within Z and Y which satisfies $h>Qc_{max}$ should be immune from dislocations. Thus crystals Z and Y of $h>Qc_{max}$ should be non-defect single crystals.

In reality, dislocations sometimes bend and sometimes newly arise. Thus the regions of $h>Qc_{max}$ in Z or Y are not necessarily zero-defect. The dislocations originating from the undersubstrate and extending in parallel to the growth are fully swept out of the regions of $h>Qc_{max}$ in Z or Y.

An ideal crystal should be non-dislocation. For the reasons above, the regions of $h>Qc_{max}$ include few dislocations. Thus the regions of $h>Qc_{max}$ in Z or Y are named "ultralow defect density single crystal regions". The regions contain no H above the mask. The regions contain Z and Y. The Z and Y in the ultralow defect single crystal regions ($h>Qc_{max}$) are not identical to the aforementioned Z and Y of $h<Qc_{max}$. In an ideal case, the regions of $h>Qc_{max}$ should be non-dislocation.

A wafer W is produced by cutting out a thin disc from the ultralow defect single crystal region of $h>Qc_{max}$. The wafer is ultralow defect, since it originates from the ultralow defect region. When the crystal is cut in parallel to (0001) plane, the wafer becomes a (0001) ultralow defect wafer.

The ultralow defect density single crystal region ($h>Qc_{max}$) has a sufficient height as shown in FIG. 35. A tall height allows the present invention to cut the region in arbitrary slanting planes into round thin crystal wafers. It is possible to make ultralow defect single crystal GaN wafers in arbitrary Miller indices.

The possibility of making arbitrary orientation high quality GaN wafers requires clarification of the relation between the orientation of the ultralow defect single crystal region, which determines Θ, and the width, which determines 2r.

GaAs(111) undersubstrates, sapphire(0001) undersubstrates and GaN (0001) undersubstrate are different in the relation between mask orientation and growing crystal orientation.

Piles of experiments teach the inventors the following facts.

When a mask is formed with a mask side in parallel to a <11-20> direction of a sapphire (α-Al$_2$O$_3$) undersubstrate, {11-2n} plane facets will be formed in parallel and contact with the mask side. Here n is a positive integer. In many cases, n=2, 3, and 4. The facets in parallel/contact with mask side are named "along-side facets". Sometimes {10-1n'} plane facets (n': integer) are yielded on inner spaces enclosed by the along-side facets upon the sapphire undersubstrate. {10-1n'} facets sometimes arise and sometimes do not appear. {10-1n'} plane facets in contact with the mask side are not produced in the facet-growth. The facets appearing within the along-side facets are named "intermediate facets". In the case of a <11-20> parallel mask on sapphire, {11-2n} are along-side facets and {10-1n'} are intermediate facets.

When a mask is formed with a mask side in parallel to a <10-10> direction of a sapphire (α-Al$_2$O$_3$) undersubstrate, {10-1n} plane facets will be formed in parallel and contact with the mask side. Here n is a positive integer. In many cases, n=2, 3, and 4. Sometimes {11-2n'} plane facets (n': integer) are yielded on inner spaces enclosed by the along-side facets upon the sapphire undersubstrate. {11-2n'} facets sometimes arise and sometimes do not appear. {11-2n'} plane facets in contact with the mask side are not produced in the facet-growth. In the case of a <10-10> parallel mask on sapphire, {10-1n} are along-side facets and {11-2n'} are intermediate facets.

Trigonal-system and hexagonal-system employ four number Miller indices for representing planes and directions. Key-bracketed <khmn> is a collective expression of a direction. Square bracketed [khmn] is an individual expression of directions. Wavy-bracketed {khmn} is a collective expression of planes. Round-bracketed (khmn) is an individual expression of a plane. Bracketed numbers h, k, m and n are integers (0, ±1, ±2, ±3, ...) which are called Miller indices or plane indices. No comma should be inserted between Miller indices. Crystallography stipulates that a negative number should be represented by an upperline. Patent description forbids upperlines. A negative number shall be denoted by affixing a minus "−" sign in front of the number. Front three indices h, k and m always satisfy a sum rule of h+k+m=0. Four axes of hexagonal or trigonal systems are denoted by a-axis, b-axis, d-axis and c-axis. The c-axis is a unique axis. The a-, b- and d-axes are equivalent axes. Unit lengths of a-, b- and d-axes are the same (=a-axis length). (khmn) plane denotes a set of planes cutting the a-axis at an a/h segment, the b-axis at a b/k segment, the d-axis at a d/m segment and the c-axis at a c/n segment. Collective planes {khmn} include all the planes which can be converted to (khmn) plane by symmetry operations allowed to the crystal. [khmn] direction is defined as a direction normal to (khmn) plane. Collective <khmn> directions mean all the directions which can be reduced to [khmn] direction by symmetry operations allowed to the crystal. Four types of Miller indices should be exactly termed without confusion. {0001} plane is not identical to {000-1} plane. Collective {0001} plane includes only individual (0001) plane.

Sapphire is a trigonal system which is different in symmetry from the hexagonal system GaN. The four Miller indices are applicable to represent planes and directions on sapphire. Same-indexed plane and direction are orthogonal. The above experiments show the facts. A mask parallel to a sapphire <11-20> direction will produce a {1-2n} facet along the mask. Another mask parallel to a sapphire <10-10> direction will produce a {10-1n} facet along the mask. A <khmn> mask on sapphire produces an identical number {khmn} GaN facet in parallel with and contact to the <khmn> mask. The fact means that the orientation of the growing GaN is twisted around the c-axis at 90 degrees to the orientation of the sapphire undersubstrate. It is confirmed that a rule of 90 degree twist around c-axis should be valid for all GaN on sapphire. The 90 degree twist rule enables polygon masks to produce desired orientations of GaN facets. The 90 degree twist rule is an important rule between sapphire and GaN.

When a polygon mask with a side parallel to a <11-20> direction on sapphire, {11-22} facets or {11-23} facets (along-side facets) are mainly produced along the <11-20> mask side. In addition to the along-side facets, {11-22} facets, {11-23} facets, {10-12} facets or {10-13} facets (intermediate facets) sometimes appear within the along-side facets.

Boundaries between mask-closest {11-22} facets or {11-23} facets and inner {10-12} facets or {10-13} facets are clearly determined.

A flat (0001) plane, C-plane is sometimes produced or not produced within the along-side {11-2n} facets and intermediate {10-1n'} facets. Regions below {11-2n} facets and {10-1n'} facets on Π are low defect density single crystal regions Z with low dislocation density.

Other regions below the top flat C-plane are C-plane growth regions Y on Π. The crystal without the C-plane forms a pinnacle at the center.

Whether a C-plane remains or not is contingent upon what facets appear within the polygon. What kinds of facets are yielded depends upon the conditions of growth. However what conditions will make intermediate facets, what conditions will extinguish C-planes and what conditions will keep C-plans to survive are still unknown. A final area of C-plane cannot be foretold. If the facets appearing are determined, the size of a C-plane can be calculated.

The C-plane growth region Y and the low defect single crystal region Z are common in low defect density and single crystal. The C-plane growth region Y is annoyed by high electric resistivity. The low defect density single crystal region guided by a facet has a strong point of low electric resistivity. High conductivity (low resistivity) is sometimes desired for substrates on which devices are fabricated. In the case, substrates consisting only of low defect density single crystal regions Z are favorable.

[Method of Growing Crystals of Embodiment 5]

A C-plane (0001) sapphire wafer of a 2 inch diameter (50 mmφ) is prepared. A thin GaN layer of a 2 μm thickness is grown by an MOCVD method on the sapphire wafer. A thin-film carrying wafer, for example, a GaN/sapphire is called a "template". In the case of silicon carbide (SiC: (0001)plane), a template (AlN/SiC) is made by depositing a 20 nm thick AlN layer on a SiC wafer. In the case of silicon (111), another template (GaN/AlN/Si) is made by depositing a 20 nm thick AlN layer on a S(111) wafer and forming a 1 μm thick GaN layer on the AlN/Si wafer.

Embodiment 5 employs a GaN-coating template as an undersubstrate. 90 degree twist does not occur on the GaN/wafer template, because the surface crystal is GaN. A 100 nm thick $SiO_2$ film is made by sputtering on the GaN/sapphire template. Photolithography and etching technology produce a network mask consisting of repetitions of a unit regular triangle shape of a 5 mm side length and a 100 μm line width. The sides of the unit triangle are parallel with <1-100> directions on the GaN crystal of the template.

The masked template is input to an HVPE furnace. A GaN film is epitaxially grown on the template undersubstrate by heating the masked template at 1000° C., supplying the furnace with $HCl+H_2$ gas and $H_2+NH_3$ gas. HCl gas reacts with a Ga-melt and produces GaCl. Partial pressures are GaCl=2 kPa and $NH_3$=10 kPa in the furnace.

Figure 31:
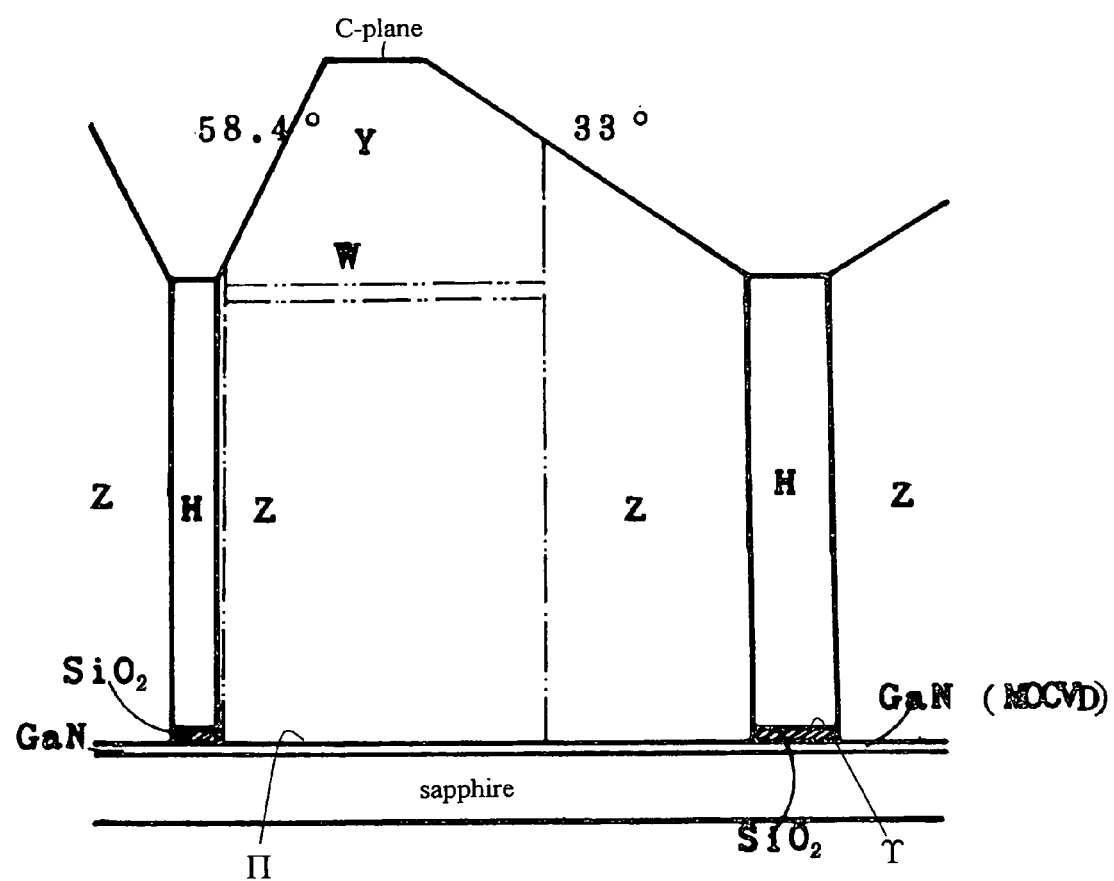
FIG. 31 is a vertically-sectioned view taken along lines 31-31 in FIG. 30.

Epitaxial growth continues on the same condition for 300 hours in the HVPE furnace. After the 300 hour growth, the sample is gotten out from the furnace. Defect accumulating regions H are made on the sides of the equilateral triangle mask. Inner parts along the triangles are accompanied by {11-22} facets. Farther inner parts are covered with {11-25} facets and a (0001) C-plane. The reason why the {11-25} facets should have n=5 is later described. FIG. 30 shows a plan view of the GaN crystal grown on the triangle masked sample. FIG. 31 is a sectional view taken along 31-31 in FIG. 30.

The inclination angle of a {11-2n} facet to C-plane is denoted by Θ. The inclination angle Θ satisfies an equation tan Θ=2c/na. The a-axis unit length is a=0.31892 nm. The c-axis unit length is c=0.51850 nm. The inclination angle of the {11-2n} facet to C-plane is calculated by tan Θ=3.251/n.

| For n = 1, | Θ = 72.9° |
|---|---|
| For n = 2, | Θ = 58.4° |
| For n = 3, | Θ = 47.3° |
| For n = 4, | Θ = 39.1° |
| For n = 5, | Θ = 33.0° |

Along-side facets in contact and in parallel with three sides of the mask triangle are denoted by T2, T4 and T6. Intermediate facets sandwiched between the along-side facets are indicated by S1, S2 and S3. The following is Miller indices (plane indices) and inclination angles Θ of the facets.

(Case of Intermediate Facts Appearing: FIGS. 30 and 31)

| S1 = (11–25) | 33.0° |
|---|---|
| T2 = (–12–12) | 58.4° |
| S3 = (–2115) | 33.0° |
| T4 = (–1–122) | 58.4° |
| S5 = (1–215) | 33.0° |
| T6 = (2–1–12) | 58.4° |

In FIG. 30, a C-plane (0001) remains at the center of the triangle crystal. A measurement shows the inclination angles of the along-side facets T2, T4 and T6 are about 58°. The planes of the along side facets turn out to be {−1-122} facets having n=2. Another measurement denotes the inclination angles of S1, S3 and S5 are 33°. The intermediate facets S1, S3 and S5 are identified to {1-215} facets having the fourth index n=5.

If the intermediate facets S1, S3 and S5 were {1-213} (n=3) or {1-214} (n=4), the central triangle C-plane should vanish. The existence of the central C-plane implies that the intermediate facets S1, S3 and S5 should be neither n=3 nor n=4. The forth index n=5 of S1, S3 and S5 is confirmed by the C-plane.

The intermediate facets S1, S3 and S5, which has a 33 degree inclination angle, have been identified to {1-215} having the fourth index n=5. The along-side facets have a steep 58.4 degree inclination angle. The size of the central triangle C-plane can be calculated. A side of the C-plane central triangle turns out to be 0.125 times as long as the mask side (5 mm). The side of the C-plane triangle is 5 mm×0.125=0.63 mm. The height of the central C-plane from the network mask level is 0.3514 times as long as the mask side (5 mm). The height of the C-plane is 5 mm×0.3514=1.757 mm.

A normal standing on the intermediate facet S1 meets at 47.8° with another normal standing on the neighboring along-side facet T2. Namely an inner bending angle of S1 to T2 is 132.2°. The horizontal distance from the mask side to the inner corner is identified to the radius r defined in FIG. 35. r=1.08 mm for T2, T4 and T6. The marginal height for T2, T4 and T6 is Qc=2r/sin 2Θ=1.08 mm×2/sin 116.8°=2.4 mm.

The horizontal distance from the mask corner to the central triangle is identified to the radius r defined in FIG. 35 for S1, S3 and S5. r=2.70 mm for S1, S3 and S5. The marginal height for S1, S3 and S5 is Qc=2r/sin 2Θ=2.70 mm×2/sin 66°=5.92 mm. 5.92 mm for S1, S3 and S5 is higher than 2.4 mm for T2, T4 and T6. The maximum of the marginal heights of the whole crystal is $Qc_{max}$=5.92 mm.

In general, a milder facet of a larger n and a smaller Θ has a larger radius than a steeper facet of a smaller n and a bigger Θ. The maximum of the marginal heights shall be determined by milder intermediate facets.

The rugged-surface crystal is cut round into a cylinder in a shape of an inner contact cylinder of a 2.9 mm diameter. An upper part of a height h higher than the maximum marginal height $Qc_{max}$ (5.92 mm) (h>$Qc_{max}$) is sliced into as-cut wafers. Thin disc GaN crystals are obtained. Top and bottom surfaces are polished. Etch pits are revealed by dipping the mirror wafers into a 250° C. heated $H_2PO_4+H_2SO_4$ solution. Etch pits are counted with a microscope. The EPD is less than $8×10^4$ $cm^{-2}$. The EPD is excellently low.

The above is the case of intermediate facets S1, S2 and S3 occurring. Otherwise, the case of non-intermediate facet, it is possible to eliminate C-plane by forming a pinnacled triangle cone by three equivalent along-side facets.

If the facet hill were formed only with along-side facets T2, T4 and T6 of n=2, the steep inclination angle induced by n=2 would raise the free energy too high. Perhaps intermediate facets S1, S3 and S5 are produced to lower the free energy. If the facet hill were covered with only the along-side facets, the fourth index n should be still higher. For example, n=3 or n=4 would be available for alongside-facets without intermediate facets occurring. Miller indices of the along-side facets T2, T4 and T6 are as follows for n=3 and n=4.

(Case of No Intermediate Facet)

| | |
|---|---|
| T'2 = (-12-13) | 47.3° |
| T'4 = (-1-123) | 47.3° |
| T'6 = (2-1-13) | 47.3° |

Otherwise,

| | |
|---|---|
| T'2 = (-12-14) | 39.1° |
| T'4 = (-1-124) | 39.1° |
| T'6 = (2-1-14) | 39.1° |

In the non intermediate facet cases, three along-side facets and a C-plane grow on and cover a triangle exposed part Π. Finally the three along-side facets can exclude the C-plane.

When intermediate facets are not produced, the marginal height Qc is low. The decrement of Qc is an advantage of non-occurrence of intermediate facets.

The marginal heights Qc in the non-intermediate facet cases shall be calculated. The column radius r (as shown in FIG. 35) should be equal to the horizontal distance from the center of gravity of the equilateral triangle (side=5 mm) mask to the sides (FIG. 30). Since the side length is 5 mm, the inner contact circle has a radius r=5 mm/2·$3^{1/2}$=1.44 mm. The former case of n=3 and Θ=47.3° should have a marginal height Qc=2r/sin 2Θ=1.44 mm×2/sin 94.6=2.89 mm. The latter case of n=4 and Θ=39.1° should have a marginal height Qc=2r/sin 2Θ=1.44 mm×2/sin 78.2=2.94 mm. These marginal heights Qc of 2.89 mm and 2.94 mm are lower than Qc=5.92 mm in the preceding intermediate facet case.

Embodiment 6

Figure 32:
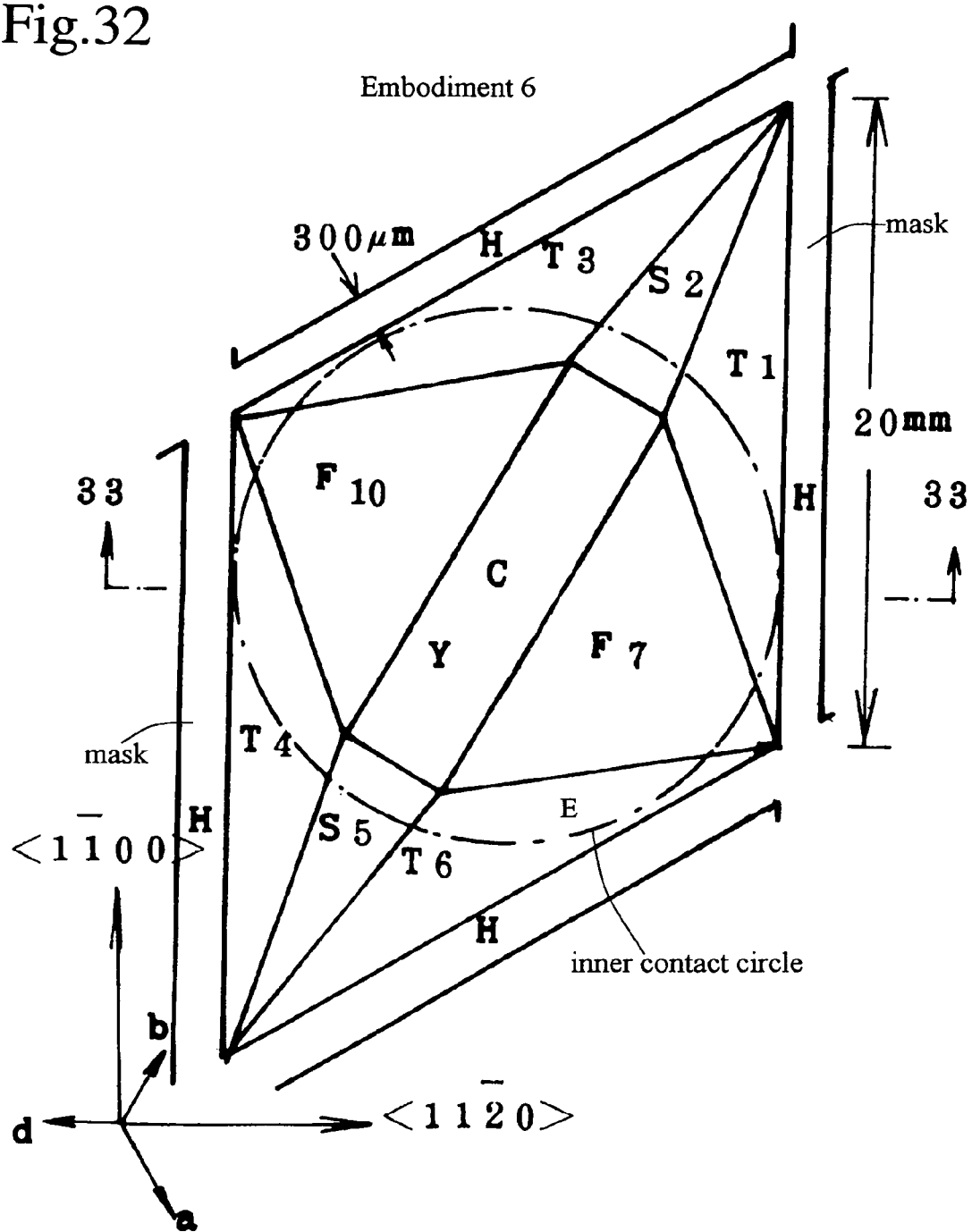
FIG. 32 is a plan view of a crystal consisting of defect accumulating regions H on a mask and a faceted lozenge cone single crystal covered with along-side facets T1, T3, T4 and T6, intermediate facets S2, S5, F7 and F10 and a top C-plane embossed on an exposed part Π produced by Embodiment 6 which includes the processes of preparing a GaAs(111)A-plane undersubstrate, making a lozenge network mask composed of repetitions of a unit lozenge having sides parallel with GaAs <-12-1> direction on the GaAs(111)A-plane undersubstrate and growing a thick GaN epitaxial layer on the masked GaAs undersubstrate.

FIG. 32, 33: GaAs; Lozenge Network Mask

Embodiment 6 employs GaAs(111)A-plane wafers as undersubstrates. A-plane means a Ga-plane surface. Correctly speaking, (111)Ga-plane shall be denoted by (111) plane and (111)As-plane shall be dented by (-1-1-1). An As-plane wafer has been sometimes designated by (111)B-plane. (111)A-plane means that the GaAs(111) wafer has not an As-plane but a Ga-plane as a top surface.

Experiments teach us that when sides of a polygon of a mask are determined to be parallel to <11-2> direction of the GaAs(111) undersubstrate, a {11-2n} facet appears in contact with the mask side. These {11-2n} are along-side facets. Here n is a positive integer. In many cases, n=2, 3 or 4. When the number of sides of the polygons of masks is large or the symmetry of the polygons is low, {10-1n'} facets often appear within the along-side facets. Here n' is another positive integer. These {10-1n'} are intermediate facets.

Otherwise when sides of a polygon of a mask are determined to be parallel to <1-10> direction of the GaAs(111) undersubstrate, a {1-10n} facet appears in contact with the mask side. These {10-1n} are along-side facets. Here n is a positive integer. In many cases, n=2, 3 or 4. When the number of sides of the polygons of masks is large or the symmetry of the polygons is low, {11-2n'} facets often appear within the along-side facets. Here n' is another positive integer. These {11-2n'} are intermediate facets.

GaAs crystal belongs to the cubic system. The number of Miller indices is three. GaAs(111), which has three-fold rotation symmetry, is useful to an undersubstrate for growing along-c-axis GaN, which has three-fold rotation symmetry with regard to c-axis. <khm> directions extending on a GaAs (111) surface satisfy a sum rule of h+k+m=0. The above experiments of GaN facet-growth on GaAs(111) and sapphire (0001) undersubstrates notify us that a direction of GaN in parallel to on-GaAs(111) <khm> direction should be the same as the direction of GaN in parallel to on-sapphire(0001) <khm0> direction.

The discovered rule is not easy to understand correctly. In other words, on-GaAs(111)A-plane <khm> direction is in parallel to on-GaN facets {khmn} and on-sapphire(0001) <khm0> direction is in parallel to on-GaN facets {khmn}. [khmn] direction is orthogonal to the conjugate (khmn) plane. Sapphire(0001) undersubstrate has a 90 degree twist rule for the orientation of GaN grown on the sapphire. Above experiments imply that GaAs(111) undersubstrate should have a 90 degree twist rule for the orientation of GaN grown on the GaAs.

Discovery of the 90 degree twist rules enables us to foresee what orientations of GaN facets grown upon a GaAs(111)A-plane undersubstrate having what orientation of a mask. In order to produce on-GaN (khmn) facets, a mask parallel to [khm] direction should be made on a GaAs(111)A-plane undersubstrate. Since GaAs cubic crystal lacks inversion-symmetry, GaAs(111)B-plane, which is otherwise denoted by GaAs(-1-1-1) or GaAs(111)As-plane, shall have a rule of −90 degree twisting. GaN facet orientations on GaAs(111)B-plane are different by 180 degrees to GaAs(111)A-plane. However, GaAs(111)B-plane is not so often used as an undersubstrate.

[Method of Growing the GaN Crystal of Embodiment 6]

A GaAs(111)A-plane wafer is prepared as an undersubstrate. Photolithography produces a network SiO$_2$ mask of a lozenge unit shape with a 20 mm long side and a 300 μm width. The orientation of the mask is determined by the lozenge sides in parallel with GaAs <1-10> direction. Evaporation piles a 100 nm thick nickel (Ni) film on the SiO$_2$ masked GaAs. A Ni mask of the same lozenge network is produced by transcribing the SiO$_2$ lozenge mask to the Ni film by a lift-off method.

The prepared GaAs wafer as an undersubstrate is got into an HVPE furnace. A GaN (low temperature deposition) film is grown on the GaAs undersubstrate by supplying the furnace with material gases of a 0.1 kPa GaCl partial pressure and a 10 kPa NH$_3$ partial pressure at 500° C. under the atmospheric pressure (0.1 MPa) in hydrogen atmosphere for two hours.

After two hour low temperature growth, the sample wafer is heated up to 1000° C. in the furnace. A high temperature GaN layer is grown by supplying H$_2$+HCl gas of a 2 kPa GaCl partial pressure and H$_2$+NH$_3$ gas of a 20 kPa NH$_3$ partial pressure at 1000° C. for 1200 hours.

Figure 33:
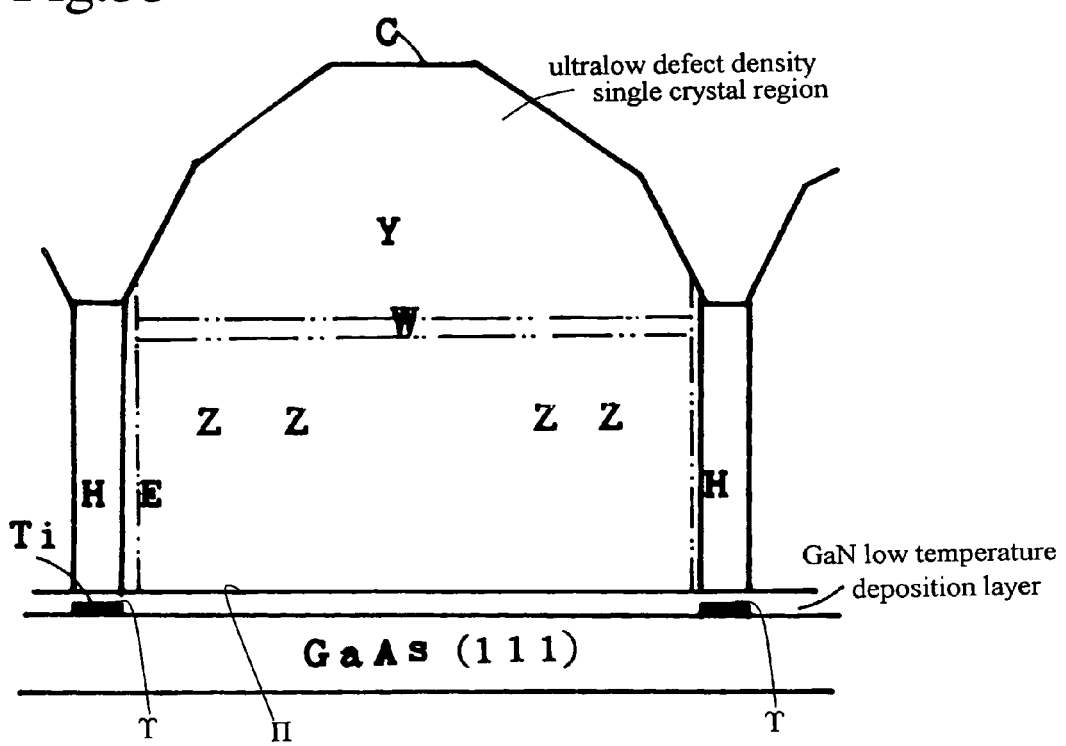
FIG. 33 is a vertically-sectioned view taken along lines 33-33 in FIG. 32.

After 1200 hour high temperature growth, the sample wafer is got out of the furnace. A rugged, faceted GaN crystal is grown on the GaAs undersubstrate. Defect accumulating regions H are piled on the lozenge nickel masks. Facet hills grown within the lozenge sides are covered with {11-22} facets, {11-25} facets, {10-15} facets and a (0001) (C-) plane. FIG. 32 is a plan view of the faceted crystal. FIG. 33 is a section taken along 33-33 in FIG. 32.

The ultralow defect density single crystal inner contact cylinder column has a 17.3 mm diameter (=20 mm×$3^{1/2}$/2). The rugged tall GaN crystal is cut round into a crystal round column with a 16 mm diameter within the 17.3 mm φ inner contact cylinder. An round GaN wafer is sliced out in parallel to the undersubstrate from the region which is higher than a 56.9 mm height (Qc=56.9 mm) of the round column crystal. Explanation of Qc will be described after. Smooth surfaces are obtained by polishing top and bottom surfaces of the round wafer. Etch pits, which are identified to sections of dislocations, are revealed on both surfaces by dipping the mirror-polished GaN wafer in a 250° C. heated mixture of $H_2SO_4$ and $H_3PO_4$ for one hour. The EPD is $3\times10^4$ cm$^{-2}$ on the top. This is a very low EPD for GaN.

In FIG. 32, along-side facets T1, T3, T4 and T6 and intermediate facets S2, S5 are produced on the exposed part Π. Appearance of the facets T4, S5 and T6 is similar to the preceding triangle mask case. In addition, a different kind of intermediate facets F7 and F10 appear. A facet hill on Π consists of T1, F10, T4, S5, T6, F7, and C, which have the following Miller indices.

(Case of Intermediate Facets Appearing: FIGS. 32 and 33)

$T1=(11\text{-}22)$ $T2=(\text{-}12\text{-}15)$ $T3=(\text{-}2112)$ $F10=(\text{-}101n')$ $T4=(\text{-}1\text{-}122)$ $S5=(1\text{-}215)$ $T6=(2\text{-}1\text{-}12)$ $F7=(10\text{-}1n')$ F10 and F7 are a different kind of facets from T1, T3, T4, T6, S2 and S5. The fourth indices n' are undetermined. Inclination angles Θ can be calculated. Θ determines the fourth indices n'.

An inclination angle $\Theta\{10\text{-}1n'\}$ to C-plane is given by $\tan\Theta=2c/3^{1/2}n'a$. Here c is a unit length of c-axis; c=0.51850 nm and a is a unit length of a-axis; a=0.31892 nm. $\tan\Theta=1.877/n'$.

| For n' = 1, | Θ = 62.0° |
|---|---|
| For n' = 2, | Θ = 43.1° |
| For n' = 3, | Θ = 32.0° |
| For n' = 4, | Θ = 25.1° |
| For n' = 5, | Θ = 20.6° |

In FIG. 30, a side of the central equilateral triangular C-plane is 0.125 times as long as a side of the basic triangle mask pattern. The shorter side of the C-plane in the lozenge in FIG. 32 is the same as a side of the C-plane triangle in FIG. 30. The shorter side of the central C-plane in FIG. 32 is 0.125 times as long as a side of the basic lozenge. Thus the horizontal distance from F7 or F10 to the C-plane is 0.937 times as long as a side of the basic lozenge. The height is 0.3514 times as long as the side length. An inclination angle Θ of F7 or F10 gives $\tan\Theta=0.3514/0.937=0.3750$. This means that the inclination angle is Θ=20.6°. Since the inclination angle is 20.6°, F7 and F10 turn out to have n'=5. The followings indicate facets, Miller indices, and inclination angles.

(Case of Intermediate Facets Appearing)

| T1 = (11-22) | 58.4° |
|---|---|
| T2 = (-12-15) | 33.0° |
| T3 = (-2112) | 58.4° |

-continued

| F10 = (-1015) | 20.6° |
|---|---|
| T4 = (-1-122) | 58.4° |
| S5 = (1-215) | 33.0° |
| T6 = (2-1-12) | 58.4° |
| F7 = (10-15) | 20.6° |

The marginal height is determined by the intermediate facets F10 and F7 unlike the former case which is shown in FIG. 30 and FIG. 31. The horizontal distance from F10 and F7 to the C-plane is 0.937 times as long as the side of the lozenge. The radius r of an inner contact circle E is r=20 mm×0.937=18.74 mm. Since the inclination angle is 20.6°, the marginal height Qc is Qc=2×18.74/sin 41.2°=56.9 mm.

The central C-plane is a rectangle. The shorter side is 0.1258 times as long as the lozenge side (20 mm). The longer side is 0.5144 times as long as the lozenge side. Multiplying the ratios by 20 mm yields the size of the C-plane (Y). The sides of the C-plane are 2.5 mm×10.2 mm.

In the case of the closed lozenge mask, sometimes no C-plane appears. S2, S5, F7 and F10 are not produced. In the case, the lozenge is covered with only on-side facets T1, T3, T4 and T6. When n=2 for T1, T3, T4 and T6, which means steep facets and low Miller indices, intermediate facets (F7, F10, S2, S5 and C) would appear. When n=3 or n=4, the intermediate facets would disappear.

(A Case of no Intermediate Facets Appearing: n=3)

| T1' = (11-23) | 47.3° |
|---|---|
| T3' = (-2113) | 47.3° |
| T4' = (-1-123) | 47.3° |
| T6' = (2-1-13) | 47.3° |

Otherwise, (A Case of No Intermediate Facets Appearing: n=4)

| T1' = (11-24) | 39.1° |
|---|---|
| T3' = (-2114) | 39.1° |
| T4' = (-1-124) | 39.1° |
| T6' = (2-1-14) | 39.1° |

The above non-intermediate facet production is realized by decreasing the $NH_3$ partial pressure, the HCl partial pressure or the growing temperature. In the case, the radius of the facet is r=8.66 mm. A marginal height Qc for n=3 is given by Qc=2×8.66/sin 94.6°=17.4 mm. Another marginal height Qc for n=4 is Qc=2×8.66/sin 78.2°=17.7 mm. The marginal heights Qc are far lower than the case of the intermediate facets appearing.

Embodiment 7

FIG. 34, 35, 36, 37; GaN Substrate, Regular Hexagon

The undersubstrate is a GaN(0001)wafer. The (0001)plane is a Ga-surface, on which only gallium atoms appear. An N-surface, on which only nitride atoms appear, is denoted by (000-1). The (000-1)plane is also shown by (0001)-N plane. Embodiment 7 adopts the Ga-surfaced GaN wafer as an undersubstrate. The Ga-surface is sometimes called GaN (0001)A-plane. The Ga-surface, GaN(0001)plane, and GaN (0001)A-plane are synonyms.

The Inventors have noticed that {11-2n} facets appear in parts being in contact with a side of a polygonal mask, when a side of the mask is determined to be parallel to <10-10> direction of the (0001)GaN undersubstrate. The extension of the mask coincides with the tangential direction of the facet. The orientation of the GaN film is the same as the orientation of the GaN undersubstrate. No twist of orientations occurs between the film and the undersubstrate. This is because homo-epitaxy has a function of equalizing the orientations. Here n is a positive integer. In many cases, n=2, 3 or 4. Excess number of sides or low symmetry of the mask polygons sometimes induces a different set of facets {10-1n'} inside of the along-mask facets {11-2n}. Here n' is another positive integer.

When a side of the mask is set to be parallel to <11-20> direction of the (0001)GaN undersubstrate, along-mask facets turn out to be facets {1-10n} (n; positive integer). There is no twist of orientations between the GaN undersubstrate and the GaN film. In many cases, n=2, 3 or 4. Plenty of the number of sides or poor symmetry of the mask polygons sometimes induces an appearance of another set of facets {11-2n'} inside of the along-mask {1-10n} facets. Here n' is another positive integer.

The inventors have discovered the rule of non-twist between a GaN undersubstrate and a GaN film. The rule enables us to foresee the shapes, sizes of facet hills which will be produced on the undersubstrate with a polygon network of a mask.

[Method of Making Crystals of Embodiment 7]

4-inch (100 mmφ) diameter GaN (0001) undersubstrates are prepared. A titanium (Ti) film with a 100 nm thickness is formed by an electron beam evaporation method (EB-evaporation) on the undersubstrate. A network Ti mask pattern composed of repeating regular hexagons is produced upon the GaN (0001) undersubstrate by photolithography and a lift-off method as indicated by FIG. 34. The length of a side of a regular hexagon of the network Ti mask is 50 mm. The width of a side of the network Ti mask is 1 mm. The mask direction is determined to equalize the sides of the regular hexagon to <1-100> directions of the GaN undersubstrate.

The network-mask-carrying GaN undersubstrate is put into an HVPE furnace. A GaN film is grown on the network-masked undersubstrate for five hours at 950° C. under a 0.10 MPa pressure (atmospheric pressure) in hydrogen atmosphere by supplying the HVPE furnace with HCl+$H_2$ gas and $NH_3$+$H_2$ gas on the condition of maintaining a GaCl partial pressure at 2 kPa and an $NH_3$ partial pressure at 10 kPa.

When five hours have passed, the temperature of the HVPE furnace is raised up to 1050° C. The GaCl partial pressure is increased up to 4 kPa. The $NH_3$ partial pressure is raised to 15 kPa. GaN is further grown for 3000 hours in the furnace. After the 3005 hour growth, the sample is taken out from the furnace. GaN crystal is formed on the GaN undersubstrate. A network of defect accumulating regions H is formed on outlines (sides) of the repeating regular hexagon network Ti mask. Inner parts of the hexagons are multifaceted hills covered with {11-22} facets, {10-15} facets and (0001) planes as shown in FIG. 34.

The hills contain an ultra-low defect density single crystal region. The inner-contact circle of the ultra-low defect density single crystal region has a diameter of 87 mm. The as-grown GaN crystal is sliced in a plane parallel to (0001) for separating the GaN crystal from the undersubstrate. Furthermore a 80 mmφ column crystal of the inner part is obtained by cutting the peripheries along a round within the inner-contact circle. The columnar part is the ultra-low-defect density region, which is enclosed by the defect-accumulating regions H. A circular thin GaN wafer is produced by cutting the circular column in a plane (0001) vertical to the growing direction at a height more than 151 mm from the bottom. The circular GaN wafer is dipped in a mixture of phosphoric acid ($H_3PO_4$) and sulfuric acid ($H_2SO_4$) heated at 250° C. for one hour. Etch pits appear on the surface of the GaN wafer. Etch pits are counted with a microscope. The etch pit density (EPD) is $5 \times 10^4$ cm$^{-2}$, which is excellently low dislocation density.

Figure 36:
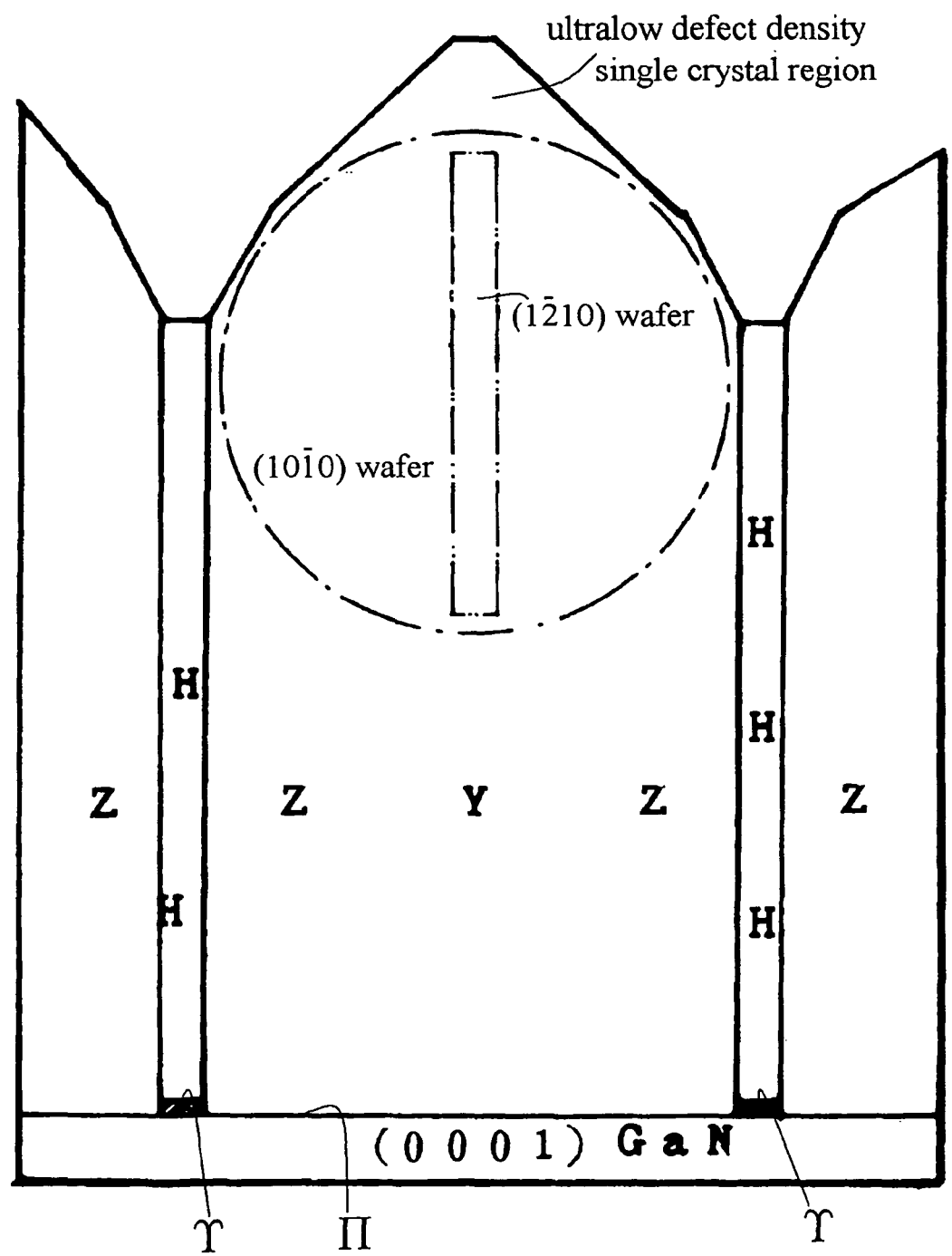
FIG. 36 is a sectional view of a facetted thick GaN crystal grown on a closed-loop masked (0001) GaN undersubstrate for showing a round cut GaN wafer of a (10-10) plane denoted by a single dotted circle and a round cut GaN wafer of a (1-210) plane denoted by a double dotted rectangular.

Another GaN wafer having a (10-10) surface is produced by slicing the GaN columnar crystal in a plane parallel with (10-10) as shown by a dotted line in FIG. 36. A (10-10) mirror wafer is made by polishing the top and bottom surfaces. The defect density is measured by a cathode luminescence (CL) method. The cathode luminescence reveals a dislocation as an unemitting, dark point on a transparent background. The number of the unemitting dark points is counted. The unemitting dark point density is $3 \times 10^4$ cm$^{-2}$. The (10-10) wafer is a very low dislocation density substrate.

Another GaN as-cut wafer with a (1-210) surface is produced by slicing the columnar ingot in a plane parallel to (1-210) as shown by double-dotted line in FIG. 36. A mirror GaN (1-210) wafer is made by polishing both surfaces. The unemitting dark points are counted by the cathode luminescence method. The dark point density is $3 \times 10^4$ cm$^{-2}$. This (1-210) wafer is a very low dislocation density GaN substrate.

Figure 37:
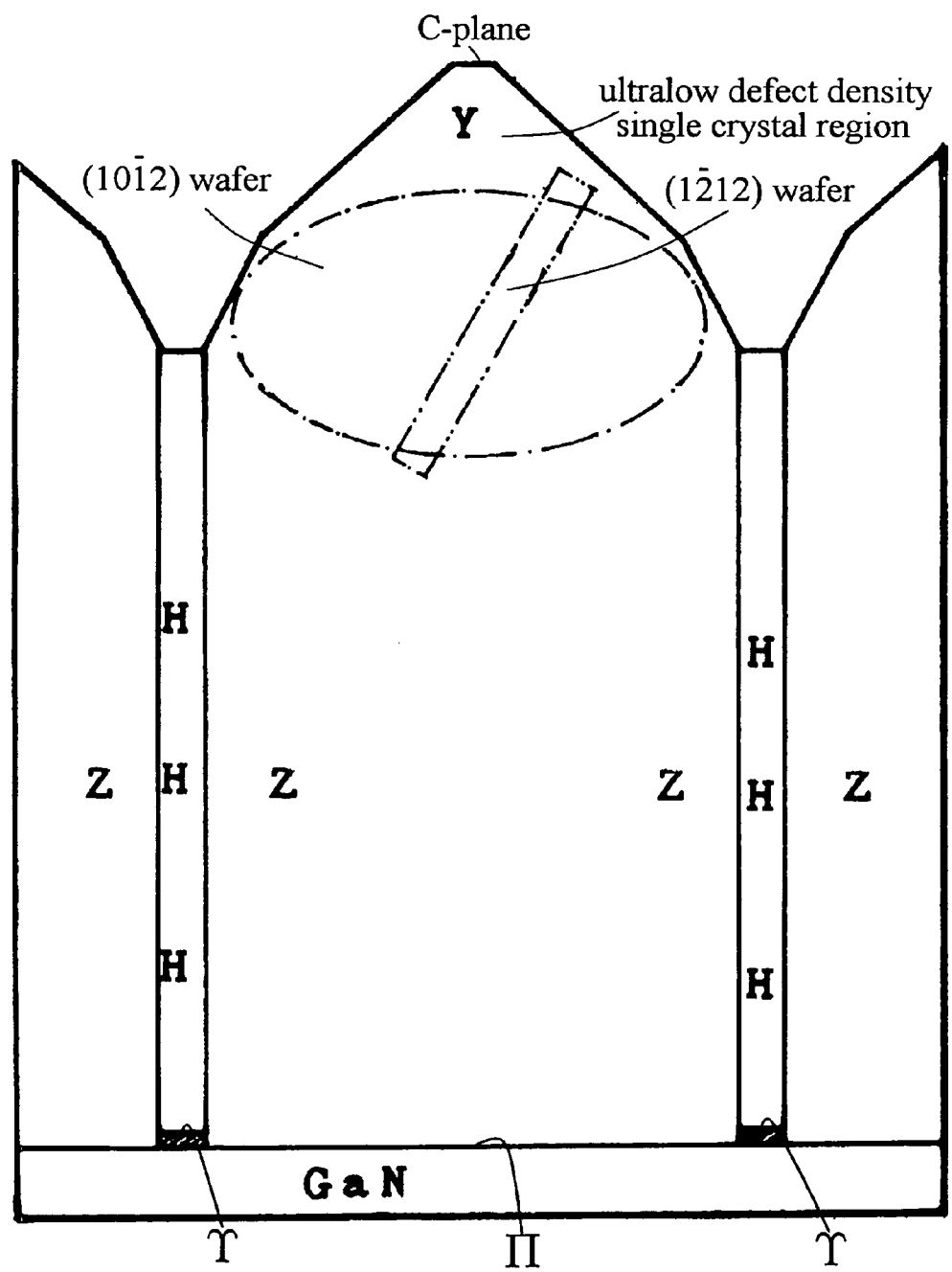
FIG. 37 is a sectional view of a facetted thick GaN crystal grown on a closed-loop masked (0001) GaN undersubstrate for showing a round cut GaN wafer of a (10-12) plane denoted by a single dotted circle and another round cut GaN wafer of (1-212) plane denoted by a double dotted rectangular.

Another GaN as-cut wafer is made by slicing the columnar GaN crystal ingot in an oblique plane parallel with (1-212). A double dotted line in FIG. 37 denotes a (1-212) wafer. A mirror GaN (1-212) wafer is made by polishing both surfaces. For investigating the dislocation density, the number of unemitting, dark points disclosed by the cathode luminescence is counted. The dark, unemitting point density is $4 \times 10^4$ cm$^{-2}$. The (1-212) wafer turns out to be a very low dislocation density GaN substrate.

Another GaN as-cut wafer is made by slicing the columnar GaN crystal ingot in an oblique plane parallel with (10-12). A single dotted line in FIG. 37 denotes a (10-12) wafer. A mirror GaN (10-12) wafer is made by polishing both surfaces. For investigating the dislocation density, the number of unemitting, dark points disclosed by the cathode luminescence is counted. The dark, unemitting point density is $2 \times 10^4$ cm$^{-2}$. The (10-12) wafer is an ultra-low dislocation density GaN substrate.

As shown in FIG. 34, the convex produced within the hexagonal network mask is a multifaceted hill covered with many facets. Along-side facets are T1, T2, T3, T4, T5 and T6. Heterogeneous intermediate facets are F7, F8, F9, F10, F11 and F12. There is no homogeneous intermediate facets S1, S2 . . . and so on. The facets T1-T6 and F7-F12 have the following miller indices and inclination angles.

(Case of Intermediate Facets Appearing)

| facets | inclination angle |
| --- | --- |
| T1 = (11-22) | 58.4° |
| F8 = (01-15) | 20.6° |
| T2 = (-12-12) | 58.4° |
| F9 = (-1105) | 20.6° |
| T3 = (-2112) | 58.4° |
| F10 = (-1015) | 20.6° |

-continued

| facets | inclination angle |
|---|---|
| T4 = (−1-122) | 58.4° |
| F11 = (0-115) | 20.6° |
| T5 = (1-212) | 58.4° |
| F12 = (1-105) | 20.6° |
| T6 = (2-1-12) | 58.4° |
| F7 = (10-15) | 20.6° |

Along-side facets T1-T6 exist only in contact with the sides of the mask. Intermediate facets F7-F12 can expand inward. FIG. 34, 35 shows a facet hill on which a C-plane remains at the center. The C-plane is extinguishable. Extensions of F7-F12 will replace the C-plane by a pinnacle. The situation is different from the C-plane which appears in FIG. 30 and FIG. 32 from geometric restrictions. The latter C-planes are unextinguishable.

When the central C-plane is extinguished by contacting ends of F7-F12 at the center, the horizontal distance, namely a radius r of an outer-contact circle is r=50 mm. The marginal height Qc is Qc=2×50/sin 41.2°=152 mm. The reason why the marginal height is so high is that the inclination angle of F7-F12 is small (20.6°).

Otherwise, non-occurrence of intermediate facets is probable. Higher n, for example, n=3, 4, 5 or so, enable facet hills to exclude intermediate facets and include only along-side facets. The non-occurrence of intermediate facets can be realized by lowering the NH3 partial pressure, HCl partial pressure and the growth temperature.

(A Case of No Intermediate Facets Appearing: n=3)

| T1' = (11-23) | 47.3° |
|---|---|
| T2' = (−12-13) | 47.3° |
| T3' = (−2113) | 47.3° |
| T4' = (−1-123) | 47.3° |
| T5' = (1-213) | 47.3° |
| T6' = (2-1-13) | 47.3° |

(Another Case of No Intermediate Facets Appearing: n=4)

| T1' = (11-24) | 39.1° |
|---|---|
| T2' = (−12-14) | 39.1° |
| T3' = (−2114) | 39.1° |
| T4' = (−1-124) | 39.1° |
| T5' = (1-214) | 39.1° |
| T6' = (2-1-14) | 39.1° |

The marginal height Qc for the first non-intermediate facet case of n=3 is Qc=2×50/sin 94.6°=100.3 mm, because r=50 mm.

The marginal height Qc for the first non-intermediate facet case of n=4 is Qc=2×50/sin 78.2°=102.2 mm, because r=50 mm. A simpler facet structure without intermediate facets has a tendency of lowering the marginal height Qc. This is because along-side facets are steeper than intermediate facets.

We claim:

1. A nitride semiconductor substrate comprising:
a top surface;
a bottom surface;
a plurality of isolated, polygonal low defect density single crystal regions Z extending from the top surface to the bottom surface;
a plurality of isolated, polygonal closed loop grain boundaries K enclosing the low defect density single crystal region Z and extending from the top surface and the bottom surface; and
a network of a defect accumulating region H which repeats a polygonal closed loop unit shape enclosing one of the grain boundaries K; the defect accumulating region H having a width T, accommodating dislocations and extending from the top surface to the bottom surface.

2. A nitride semiconductor substrate comprising:
a top surface;
a bottom surface;
a plurality of isolated, polygonal low defect density single crystal regions Z extending from the top surface to the bottom surface;
a plurality of isolated, polygonal closed loop grain boundaries K enclosing the low defect density single crystal region Z and extending the top surface and the bottom surface;
a network of a defect accumulating region H which repeats a polygonal closed loop unit shape enclosing one of the grain boundaries K; and
isolated C-plane growth regions Y existing in the low defect single crystal regions Z, the defect accumulating region H having a width T', accommodating dislocations and extending from the top surface to the bottom surface.

3. The nitride semiconductor substrate as claimed in claim 1, wherein the maximum diameter of the low defect single crystal regions Z is 0.1 mm to 20 mm and the width T' of the defect accumulating region H is 0.03 mm to 0.2 mm.

4. The nitride semiconductor substrate as claimed in claim 2, wherein the maximum diameter of the low defect single crystal regions Z is 0.1 mm to 20 mm and width T' of the defect accumulating region H is 0.03 mm to 0.2 mm.

5. The nitride semiconductor substrate as claimed in claim 1, wherein low defect density single crystal regions Z are separated from each other by the network defect accumulating region H.

6. The nitride semiconductor substrate as claimed in claim 2, wherein the low defect density single crystal regions Z are separated from each other by the network defect accumulating region H.

7. The nitride semiconductor substrate as claimed in claim 1, wherein the defect accumulating region H is single crystal having orientation inverse to the low defect density single crystal regions Z.

8. The nitride semiconductor substrate as claimed in claim 2, wherein the defect accumulating region H is single crystal having orientation inverse to the low defect density single crystal regions Z.

9. The nitride semiconductor substrate as claimed in claim 1, wherein the defect accumulating regions H are polycrystals.

10. The nitride semiconductor substrate as claimed in claim 5, wherein the longest distance from the closed loop grain boundaries K to the center of gravity of the low defect density single crystal region Z is denoted by L2, the shortest distance from the closed loop grain boundaries K to the center of gravity of the low defect density single crystal region Z is denoted by L1, and a ratio L2/L1 is less than 5.

11. The nitride semiconductor substrate as claimed in claim 1, wherein the defect accumulating region H and the closed loop grain boundaries K are regular polygons, the maximum of diameters of the regular polygon boundaries K is 0.1 mm to 5 mm and the width T' of the defect accumulating region H is 0.01 mm to 0.1 mm.

12. The nitride semiconductor substrate as claimed in claim 2, wherein the defect accumulating region H and the closed loop grain boundaries K are regular polygons, the maximum of diameters of the regular polygon boundaries K is 0.1 mm to 5 mm and the width T' of the defect accumulating region H is 0.01 mm to 0.1 mm.

13. The nitride semiconductor substrate as claimed in claim 1, wherein the defect accumulating region H and the closed loop grain boundaries K are hexagons with 120 degree inner angles and sides of the hexagon are parallel to <10-10> directions.

14. The nitride semiconductor substrate as claimed in claim 2, wherein the defect accumulating region H and the closed loop grain boundaries K are hexagons with 120 degree inner angles and sides of the hexagon are parallel to <10-10> directions.

15. The nitride semiconductor substrate as claimed in claim 1, wherein the defect accumulating region H and the closed loop grain boundaries K are hexagons with 120 degree inner angles and sides of the hexagon are parallel to <11-20> directions.

16. The nitride semiconductor substrate as claimed in claim 2, wherein the defect accumulating region H and the closed loop grain boundaries K are hexagons with 120 degree inner angles and sides of the hexagon are parallel to <11-20> directions.

17. The nitride semiconductor substrate as claimed in claim 1, wherein the defect accumulating region H and the closed loop grain boundaries K are rectangles with 90 degree inner angles and sides of the rectangle are parallel or orthogonal to <10-10> directions.

18. The nitride semiconductor substrate as claimed in claim 1, wherein the defect accumulating region H and the closed loop grain boundaries K are rectangles with 90 degree inner angles and sides of the rectangle incline at 45 degrees to <10-10> directions.

19. The nitride semiconductor substrate as claimed in claim 1 wherein the defect accumulating region H and the closed loop grain boundaries K are equilateral triangles and sides of the triangle are parallel to <10-10> directions.

20. The nitride semiconductor substrate as claimed in claim 1, wherein the nitride semiconductor is $Al_xIn_yGa_{1-x-y}N$ ($0 \leq x \leq 1$, $0 \leq y \leq 1$, $x+y \leq 1$).

21. The nitride semiconductor substrate as claimed in claim 2, wherein the nitride semiconductor is $Al_xIn_yGa_{1-x-y}N$ ($0 \leq x \leq 1$, $0 \leq y \leq 1$, $x+y \leq 1$).

22. The nitride semiconductor substrate as claimed in claim 1, wherein the full width at half maximum (FWHM) of X-ray diffraction at (0004) planes is less than 30 arcseconds.

23. The nitride semiconductor substrate as claimed in claim 1, wherein the etch pit density (EPD) at the low defect density single crystal regions Z is less than $1 \times 10^6$ cm$^{-2}$.

* * * * *